(12) United States Patent
Mammou et al.

(10) Patent No.: US 10,897,269 B2
(45) Date of Patent: Jan. 19, 2021

(54) HIERARCHICAL POINT CLOUD COMPRESSION

(71) Applicant: Apple Inc., Cupertino, CA (US)

(72) Inventors: Khaled Mammou, Vancouver (CA); Fabrice A. Robinet, Sunnyvale, CA (US); Alexandros Tourapis, Cupertino, CA (US); Yeping Su, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 149 days.

(21) Appl. No.: 16/133,674

(22) Filed: Sep. 17, 2018

(65) Prior Publication Data

US 2019/0081638 A1  Mar. 14, 2019

Related U.S. Application Data

(63) Continuation-in-part of application No. 16/130,949, filed on Sep. 13, 2018.
(Continued)

(51) Int. Cl.
*H03M 7/30* (2006.01)
*H04N 19/96* (2014.01)
(Continued)

(52) U.S. Cl.
CPC ........... *H03M 7/3059* (2013.01); *H03M 7/30* (2013.01); *H03M 7/6035* (2013.01);
(Continued)

(58) Field of Classification Search
CPC ......... G06T 2207/10028; G06T 17/005; G06T 3/4007; G06T 7/50; G06T 9/40;
(Continued)

(56) References Cited

U.S. PATENT DOCUMENTS

2017/0214943 A1* 7/2017 Cohen .................. G06T 9/00
2017/0249401 A1  8/2017 Eckart et al.
(Continued)

OTHER PUBLICATIONS

Ruwen Schnabel et al., "Octree-based Point-Cloud Compression", Eurographics Symposium on Point-Based Graphics, 2006, pp. 1-11.
(Continued)

*Primary Examiner* — Ali Bayat
(74) *Attorney, Agent, or Firm* — Robert C. Kowert; Kowert, Hood, Munyon, Rankin & Goetzel, P.C.

(57) ABSTRACT

A system comprises an encoder configured to compress attribute information for a point cloud and/or a decoder configured to decompress compressed attribute information for the point cloud. Attribute values for at least one starting point are included in a compressed attribute information file and attribute correction values used to correct predicted attribute values are included in the compressed attribute information file. Attribute values are predicted based, at least in part, on attribute values of neighboring points and distances between a particular point for whom an attribute value is being predicted and the neighboring points. The predicted attribute values are compared to attribute values of a point cloud prior to compression to determine attribute correction values. A decoder follows a similar prediction process as an encoder and corrects predicted values using attribute correction values included in a compressed attribute information file.

20 Claims, 20 Drawing Sheets

Related U.S. Application Data

(60) Provisional application No. 62/558,795, filed on Sep. 14, 2017, provisional application No. 62/560,164, filed on Sep. 18, 2017, provisional application No. 62/569,602, filed on Oct. 8, 2017, provisional application No. 62/655,759, filed on Apr. 10, 2018, provisional application No. 62/655,764, filed on Apr. 10, 2018, provisional application No. 62/655,768, filed on Apr. 10, 2018, provisional application No. 62/696,295, filed on Jul. 10, 2018, provisional application No. 62/689,021, filed on Jun. 22, 2018.

(51) Int. Cl.
    *H04N 19/436*     (2014.01)
    *H04N 19/60*     (2014.01)
    *H04N 19/597*     (2014.01)

(52) U.S. Cl.
    CPC ........ *H03M 7/6064* (2013.01); *H04N 19/436* (2014.11); *H04N 19/597* (2014.11); *H04N 19/60* (2014.11); *H04N 19/96* (2014.11)

(58) Field of Classification Search
    CPC ...... H04N 19/45; H04N 19/593; H04N 19/90; H04N 19/91; H04N 19/96; H04N 19/597
    USPC .......................................................... 382/232
    See application file for complete search history.

(56) References Cited

U.S. PATENT DOCUMENTS

| | | | |
|---|---|---|---|
| 2017/0347120 A1* | 11/2017 | Chou | H04N 19/147 |
| 2018/0053324 A1* | 2/2018 | Cohen | G06T 9/005 |
| 2019/0026956 A1* | 1/2019 | Gausebeck | H04N 13/204 |

OTHER PUBLICATIONS

Yuxue Fan et al., "Point Cloud Compression Based on Hierarchical Point Clustering", Signal and Information Processing Association Annual Summit and Conference (APSIPA), IEEE, 2013, pp. 1-7.

* cited by examiner

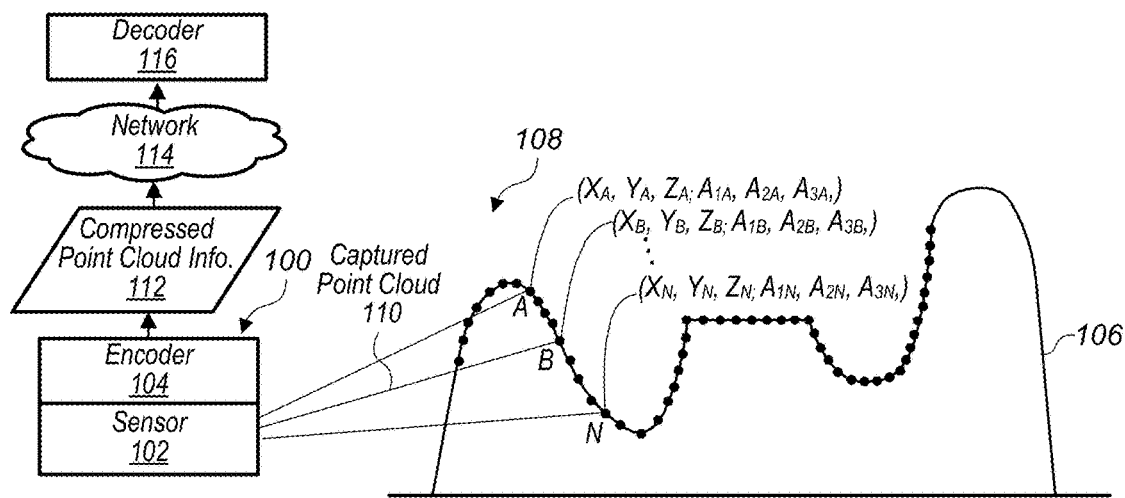
FIG. 1A
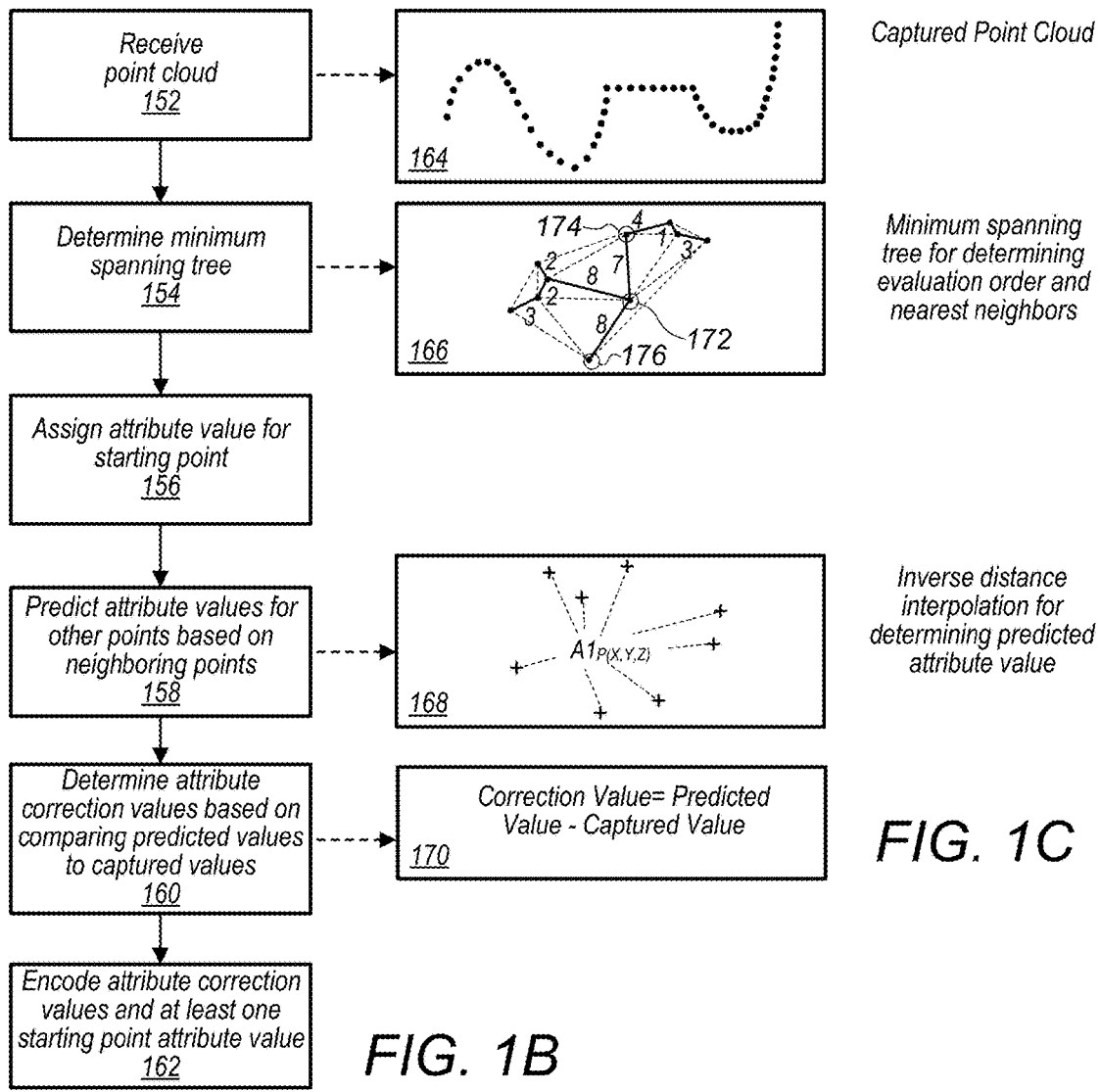
FIG. 1B
FIG. 1C

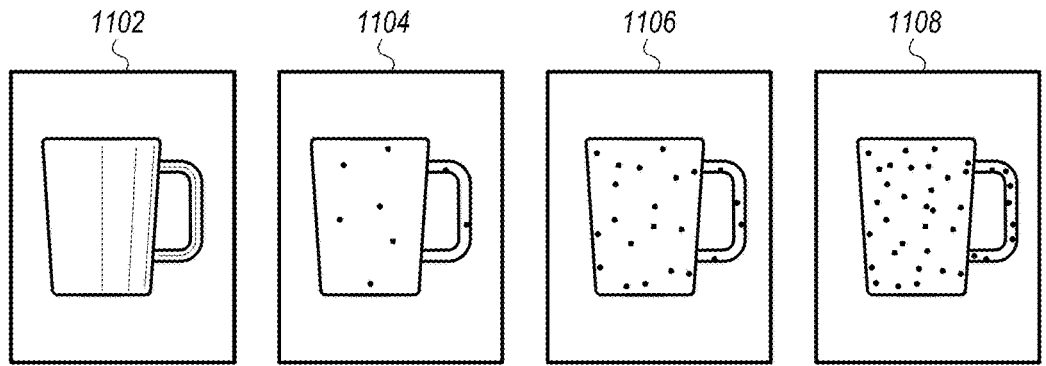

Level of Details

FIG. 11A

Compressed Attribute Information File — 1150

| Configuration Information | 1152 |
|---|---|
| N (Number of Levels of Detail)<br>S (Level of Detail Initial Sampling Distance)<br>F (Sampling Distance Update Factor)<br>K (Number of nearest neighbors to identify)<br>C (Context encoding configuration(s))<br>AI (Additional configuration information) | |
| Point Cloud Data<br>Attribute Information for Starting Points<br>$(X_A, Y_A, Z_A; A_{1A}, A_{2A}, A_{3A},); (Point\ N, A_{1N}, A_{2N}, A_{3N},), ...$ | 1154 |
| Point Attribute Correction Values LOD1<br>  Point A    Attribute 1 — +1<br>                Attribute 2 — -1<br>                Attribute 3 — 0<br><br>  Point B    Attribute 1 — +2<br>                Attribute 2 — -2<br><br>Point Attribute Correction Values LOD2<br>  Point C    Attribute 1 — +2<br>                Attribute 2 — -3<br><br>  Point D    Attribute 1 — +1<br>                Attribute 2 — 0<br>                Attribute 3 — -2<br>                . | 1156 |

FIG. 11B

*Example Neighborhood Configurations*

Direct Transform

Inverse Transform

HIERARCHICAL POINT CLOUD COMPRESSION

This application is a continuation-in-part of U.S. application Ser. No. 16/130,949, entitled "Point Cloud Compression," filed Sep. 13, 2018, which claims benefit of priority to the following U.S. Provisional Applications:

U.S. Provisional Application Ser. No. 62/558,795, entitled "Point Cloud Compression," filed Sep. 14, 2017;

U.S. Provisional Application Ser. No. 62/560,164, entitled "Hierarchical Point Cloud Compression," filed Sep. 18, 2017;

U.S. Provisional Application Ser. No. 62/569,602, entitled "Hierarchical Point Cloud Compression," filed Oct. 8, 2017;

U.S. Provisional Application Ser. No. 62/655,759, entitled "Adaptive Distance Based Point Cloud Compression," filed Apr. 10, 2018;

U.S. Provisional Application Ser. No. 62/655,764, entitled "Hierarchical Point Cloud Compression with Smoothing," filed Apr. 10, 2018;

U.S. Provisional Application Ser. No. 62/655,768, entitled "Point Cloud Attribute Transfer Algorithm," filed Apr. 10, 2018; and U.S. Provisional Application Ser. No. 62/696,295, entitled "Hierarchical Point Cloud Compression," filed Jul. 10, 2018.

This application incorporates by reference the parent application (U.S. application Ser. No. 16/130,949) and each of the above referenced provisional applications in their entirety.

This application also claims benefit of priority to the following U.S. Provisional Applications:

U.S. Application Ser. No. 62/560,164, entitled "Hierarchical Point Cloud Compression," filed Sep. 18, 2017;

U.S. Provisional Application Ser. No. 62/569,602, entitled "Hierarchical Point Cloud Compression," filed Oct. 8, 2017;

U.S. Provisional Application Ser. No. 62/655,759, entitled "Adaptive Distance Based Point Cloud Compression," filed Apr. 10, 2018;

U.S. Provisional Application Ser. No. 62/655,764, entitled "Hierarchical Point Cloud Compression with Smoothing," filed Apr. 10, 2018;

U.S. Provisional Application Ser. No. 62/655,768, entitled "Point Cloud Attribute Transfer Algorithm," filed Apr. 10, 2018;

U.S. Provisional Application Ser. No. 62/689,021, entitled "Point Cloud Geometry Compression Using Octrees and Binary Arithmetic Encoding with Adaptive Look-Up Tables," filed Jun. 22, 2018;

U.S. Provisional Application Ser. No. 62/696,295, entitled "Hierarchical Point Cloud Compression," filed Jul. 10, 2018.

This application incorporates by reference each of the above referenced provisional applications in their entirety.

BACKGROUND

Technical Field

This disclosure relates generally to compression and decompression of point clouds comprising a plurality of points, each having associated attribute information.

Description of the Related Art

Various types of sensors, such as light detection and ranging (LIDAR) systems, 3-D-cameras, 3-D scanners, etc. may capture data indicating positions of points in three dimensional space, for example positions in the X, Y, and Z planes. Also, such systems may further capture attribute information in addition to spatial information for the respective points, such as color information (e.g. RGB values), intensity attributes, reflectivity attributes, motion related attributes, modality attributes, or various other attributes. In some circumstances, additional attributes may be assigned to the respective points, such as a time-stamp when the point was captured. Points captured by such sensors may make up a "point cloud" comprising a set of points each having associated spatial information and one or more associated attributes. In some circumstances, a point cloud may include thousands of points, hundreds of thousands of points, millions of points, or even more points. Also, in some circumstances, point clouds may be generated, for example in software, as opposed to being captured by one or more sensors. In either case, such point clouds may include large amounts of data and may be costly and time-consuming to store and transmit.

SUMMARY OF EMBODIMENTS

In some embodiments, a system includes one or more sensors configured to capture points that collectively make up a point cloud, wherein each of the points comprises spatial information identifying a spatial location of the respective point and attribute information defining one or more attributes associated with the respective point. The system also include an encoder configured to compress the attribute information for the points. To compress the attribute information, the encoder is configured to assign an attribute value to at least one point of the point cloud based on the attribute information included in the captured point cloud. Additionally, the encoder is configured to, for each of respective other ones of the points of the point cloud, identify a set of neighboring points, determine a predicted attribute value for the respective point based, at least in part, on predicted or assigned attributes values for the neighboring points, and determine, based, at least in part, on comparing the predicted attribute value for the respective point to the attribute information for the point included in the captured point cloud, an attribute correction value for the point. The encoder is further configured to encode the compressed attribute information for the point cloud, wherein the compressed attribute information comprises the assigned attribute value for the at least one point and data indicating, for the respective other ones of the points, the respective determined attribute correction values.

In some embodiments, a method for compressing attribute information for a point cloud includes assigning an attribute value to at least one point of the point cloud based, at least in part, on attribute information for the at least one point included in the point cloud, wherein the point cloud comprises spatial information for a plurality of points and attribute information specifying one or more attributes for respective ones of the plurality of points. The method further includes, for each of respective other ones of the points of the point cloud, identifying a set of neighboring points and determining a predicted attribute value for the point based, at least in part, on predicted or assigned attribute values for the neighboring points. The method further includes, for each of respective other ones of the points of the point cloud, determining, based, at least in part, on comparing the predicted attribute value for the point to the attribute information for the point, an attribute correction value for the point. The method also includes encoding compressed attribute information for the point cloud comprising the assigned attribute value for the at least one point and data indicating, for the respective other ones of the points, the determined attribute correction values.

In some embodiments, one or more non-transitory computer-readable media store program instructions that, when executed by one or more processors, cause the one or more processors to implement a decoder configured to: receive compressed attribute information for a point cloud comprising at least one assigned attribute value for at least one point of the point cloud and data indicating, for other points of the point cloud, respective attribute correction values for respective attributes of the other points. The program instructions, when executed, further cause the decoder to, for each of respective other ones of the points of the point cloud other than the at least one point, identify a set of neighboring points to a point being evaluated, determine a predicted attribute value for the point being evaluated based, at least in part, on predicted or assigned attribute values for the neighboring points, and adjust the predicted attribute value for the point being evaluated based, at least in part, on an attribute correction value for the point included in the compressed attribute information. The program instructions, when executed, further cause the decoder to provide attribute information for a decompressed point cloud comprising the at least one assigned attribute value for the at least one point and the adjusted predicted attribute values for the other ones of the points.

In some embodiments, to compress attribute information, an encoder is configured to build a hierarchical level of detail (LOD) structure. For example, the encoder may be configured to determine a first level of detail for attribute information of a point cloud and determine one or more additional levels of detail for the attribute information of the point cloud. To determine the first level of detail or the one or more additional levels of detail, the encoder is configured to assign an attribute value to at least one point of the point cloud based on the attribute information included in the captured point cloud for the point and, for a sub-set of respective ones of the points of the point cloud not included in a previously determined level of detail: identify a set of neighboring points greater than a first distance from the point, determine a predicted attribute value for the respective point based on predicted or assigned attributes values for the neighboring points, and determine, based on comparing the predicted attribute value for the respective point to the attribute information for the point included in the captured point cloud, an attribute correction value for the point. The encoder is further configured to encode the assigned attribute value and the determined attribute correction values for first level of detail and the one or more additional levels of detail.

In some embodiments, the encoder is further configured to perform an update operation prior to encoding the assigned attribute correction value and the determined attribute correction values for the first level of detail and the one or more additional levels of detail. In some embodiments, an update operation may determine a relative importance of a particular one of the determined attribute correction values on other points in higher levels of detail of the hierarchical level of detail structure. For example, in some situations slight errors in attribute correction values for some points in one or more underlying levels of detail may have a greater impact on predicted attribute values for attributes of points in higher levels of detail. In such circumstances, more bits may be allocated (e.g. less quantization applied) to determined attribute correction values for points with a greater impact on predicted attributes values of other points than are allocated to determined attribute correction values for other points that have a lesser impact on predicted attribute values for other points. Additionally, in some embodiments a transformation may be applied to the attribute values prior to performing an update operation and the effects of the transformation operation may be taken into account when determining relative impacts of determined attribute correction values on predicted attribute values for higher levels of detail.

In some embodiments, an encoder may further be configured to adaptively change a prediction strategy or number of nearest neighbors used in a prediction strategy based on variability of attributes for points in a neighborhood of a point being evaluated.

In some embodiments, a decoder is configured to receive compressed attribute information for a point cloud comprising at least one assigned attribute value for at least one point of the point cloud and data indicating attribute correction values for attributes of the other points of the point cloud. In some embodiments, the attribute correction values may be ordered in a plurality of levels of detail for a plurality of sub-sets of points of the point cloud. For example, the decoder may receive a compressed point cloud compressed by an encoder as described above. The decoder may further be configured to provide attribute information for a decompressed point cloud having a first level of detail and update the decompressed point cloud to include attribute information for additional sub-sets of points at one or more other ones of a plurality of levels of detail.

In some embodiments, wherein an update operation is performed at an encoder, a decoder may further "undo" the update operation upon receiving compressed determined attribute correction values. For example, before applying a determined attribute correction value to a predicted attribute value, the decoder may account for the update operation performed on the determined attribute correction value.

In some embodiments, the decoder may be further configured to adaptively change a prediction strategy or number of nearest neighbors used in a prediction strategy based on variability of attributes for points in a neighborhood of a point being evaluated.

In some embodiments, a method comprises receiving compressed attribute information for a point cloud comprising at least one assigned attribute value for at least one point of the point cloud and data indicating attribute correction values for attributes of the other points of the point cloud. In some embodiments, the attribute correction values may be ordered in a plurality of levels of detail for a plurality of sub-sets of the other points of the point cloud. The method may further include providing attribute information for a decompressed point cloud having a first level of detail and updating the decompressed point cloud to include attribute information for additional sub-sets of points at one or more other ones of a plurality of levels of detail. In some embodiments, the method may further include accounting for an update operation performed on attribute correction values for lower levels of detail before applying the attribute correction values to the decompressed point cloud.

In some embodiments, one or more non-transitory computer-readable media store program instructions that, when executed by one or more processors, cause the one or more processors to generate a hierarchical level of detail (LOD) structure as described herein to compress attribute information of a point cloud. In some embodiments, the non-transitory computer-readable media further store, program instructions that when executed by one or more processors, further cause the one or more processors to apply an update operation to attribute correction values prior to encoding the attribute correction values, wherein the update operation is performed as described herein.

In some embodiments, one or more non-transitory computer-readable media store program instructions that, when executed by one or more processors, cause the one or more processors to decode hierarchical LOD structure as described herein to decompress attribute information of a point cloud. In some embodiments, the non-transitory computer-readable media further store, program instructions that when executed by one or more processors, further cause the one or more processors to account for an update operation applied to attribute correction values at an encoder prior to applying decompressed attribute correction values to a reconstructed point cloud, wherein accounting for the update operation is performed as described herein.

In some embodiments, a system includes a geometric encoder configured to perform quantization of points included in a point cloud, remove duplicate points, and perform octree encoding. To perform the octree encoding, the geometry encoder is configured to use a binary arithmetic encoder to encode up to 256 occupancy symbols. The occupancy symbols represent whether each of 8 sub-cubes of a cube are occupied with points or are un-occupied. Since there are 8 sub-cubes and two-possibilities (occupied or un-occupied), the number of occupancy symbols possible is 2^8 or 256. The geometric encoder may also be configured to utilize neighboring cubes or sub-cubes and a look-ahead procedure using a look-ahead table to predict contexts for encoding the occupancy symbols. For example, if neighboring cubes are empty, it is more likely that the cube being encoded includes empty sub-cubes, and vice-versa.

Also, the possible number of encoding contexts may be reduced by assigning separate contexts to the most probable neighborhood configurations and assigning less probable neighborhood configurations to the same contexts, such that some of the less probable neighborhood configurations share the same contexts. The system also include an attribute encoder configured to compress the attribute information for the points. To compress the attribute information, the attribute encoder is configured to build a hierarchical level of detail (LOD) structure. For example, the attribute encoder may be configured to determine a first level of detail for the attribute information of the point cloud and determine one or more additional levels of detail for the attribute information of the point cloud. To determine the first level of detail or the one or more additional levels of detail, the attribute encoder is configured to assign an attribute value to at least one point of the point cloud based on the attribute information included in the captured point cloud for the point and, for a sub-set of respective ones of the points of the point cloud not included in a previously determined level of detail: identify a set of neighboring points greater than a first distance from the point, determine a predicted attribute value for the respective point based on predicted or assigned attributes values for the neighboring points, and determine, based on comparing the predicted attribute value for the respective point to the attribute information for the point included in the captured point cloud, an attribute correction value for the point. The attribute encoder is further configured to encode the assigned attribute value and the determined attribute correction values for first level of detail and the one or more additional levels of detail. In some embodiments, the attribute encoder is further configured to adaptively change a prediction strategy or number of nearest neighbors used in a prediction strategy based on variability of attributes for points in a neighborhood of a point being evaluated.

In some embodiments, a decoder is configured to receive encoded geometric information for a point cloud, apply an arithmetic decoder to generate occupancy symbols (wherein the decoder decodes the geometry information encoded by the encoder as described above, also using a binary arithmetic decoder and look ahead tables). The occupancy symbols are then used by an octree decoding element to recreate a point cloud geometry of the point cloud being decompressed. The decoder is also configured to receive compressed attribute information for a point cloud comprising at least one assigned attribute value for at least one point of the point cloud and data indicating attribute correction values for attributes of the other points of the point cloud, wherein the attribute correction values are ordered in a plurality of levels of detail for a plurality of sub-sets of the other points of the point cloud. For example, the decoder may receive a compressed point cloud compressed by an encoder as described above. The decoder may be further configured to provide attribute information for a decompressed point cloud having a first level of detail and update the decompressed point cloud to include attribute information for additional sub-sets of points at one or more other ones of the plurality of levels of detail.

In some embodiments, the decoder may be further configured to adaptively change a prediction strategy or number of nearest neighbors used in a prediction strategy based on variability of attributes for points in a neighborhood of a point being evaluated.

In some embodiments, a method comprises receiving encoded geometric information for a point cloud, applying an arithmetic decoder to generate occupancy symbols (wherein the decoder decodes the geometry information encoded by the encoder as described above, also using a binary arithmetic decoder and look ahead tables). The occupancy symbols are then used by an octree decoding element to recreate a point cloud geometry of the point cloud being decompressed. In some embodiments, the method further comprises receiving compressed attribute information for a point cloud comprising at least one assigned attribute value for at least one point of the point cloud and data indicating attribute correction values for attributes of the other points of the point cloud, wherein the attribute correction values are ordered in a plurality of levels of detail for a plurality of sub-sets of the other points of the point cloud. The method further includes providing attribute information for a decompressed point cloud having a first level of detail and updating the decompressed point cloud to include attribute information for additional sub-sets of points at one or more other ones of the plurality of levels of detail. In some embodiments, the method further includes adaptively changing a prediction strategy or number of nearest neighbors used in a prediction strategy based on variability of attributes for points in a neighborhood of a point being evaluated.

In some embodiments, one or more non-transitory computer-readable media store program instructions that, when executed by one or more processors, cause the one or more processors to generate compressed geometric information using an octree and binary arithmetic encoder with look-ahead tables as described herein. In some embodiments, the computer readable media store program instructions that, when executed by one or more processors, cause the one or more processors to receive hierarchical level of detail (LOD) structure as described herein to compress attribute information of a point cloud.

In some embodiments, one or more non-transitory computer-readable media store program instructions that, when executed by one or more processors, cause the one or more processors to decode geometric encoded information for a point cloud and to decompress a hierarchical LOD structure as described herein to provide attribute information for a decompressed point cloud.

BRIEF DESCRIPTION OF THE DRAWINGS

FIG. 1A illustrates a system comprising a sensor that captures information for points of a point cloud and an encoder that compresses attribute information and/or spatial information of the point cloud, where the compressed point cloud information is sent to a decoder, according to some embodiments.

FIG. 1B illustrates a process for encoding attribute information of a point cloud, according to some embodiments.

FIG. 1C illustrates representative views of point cloud information at different stages of an encoding process, according to some embodiments.

FIG. 11A illustrates an example level of detail (LOD) structure, according to some embodiments.

FIG. 11B illustrates an example compressed point cloud file comprising level of details for a point cloud (LODs), according to some embodiments.

Figure 2A:
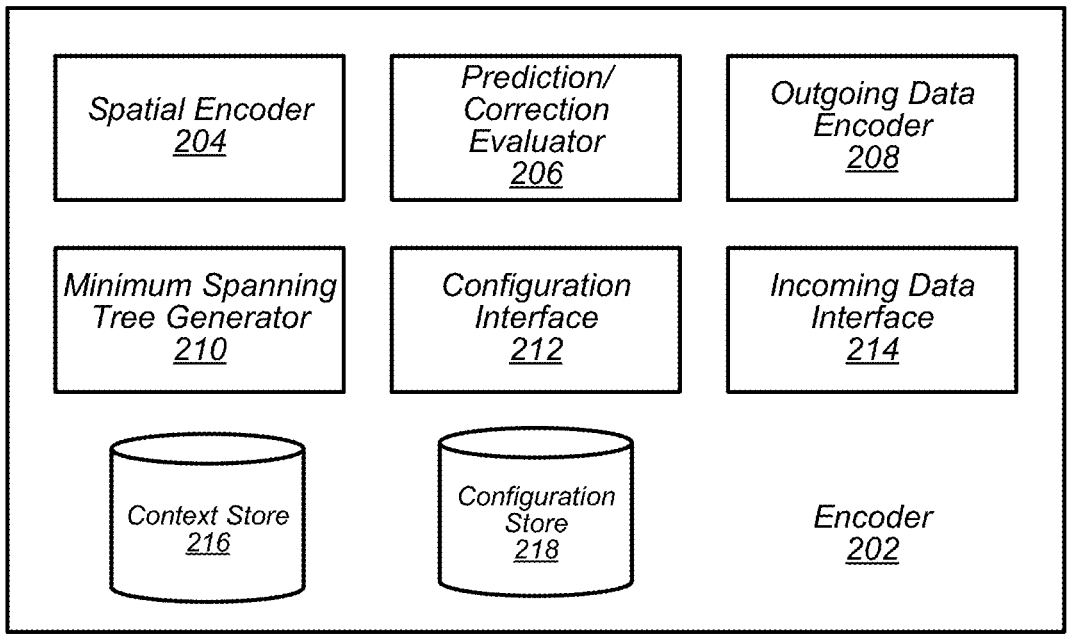
FIG. 2A illustrates components of an encoder, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112(f), for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

As data acquisition and display technologies have become more advanced, the ability to capture point clouds comprising thousands or millions of points in 2-D or 3-D space, such as via LIDAR systems, has increased. Also, the development of advanced display technologies, such as virtual reality or augmented reality systems, has increased potential uses for point clouds. However, point cloud files are often very large and may be costly and time-consuming to store and transmit. For example, communication of point clouds over private or public networks, such as the Internet, may require considerable amounts of time and/or network resources, such that some uses of point cloud data, such as real-time uses, may be limited. Also, storage requirements of point cloud files may consume a significant amount of storage capacity of devices storing the point cloud files, which may also limit potential applications for using point cloud data.

In some embodiments, an encoder may be used to generate a compressed point cloud to reduce costs and time associated with storing and transmitting large point cloud files. In some embodiments, a system may include an encoder that compresses attribute information and/or spatial information (also referred to herein as geometry information) of a point cloud file such that the point cloud file may be stored and transmitted more quickly than non-compressed point clouds and in a manner such that the point cloud file may occupy less storage space than non-compressed point clouds. In some embodiments, compression of spatial information and/or attributes of points in a point cloud may enable a point cloud to be communicated over a network in real-time or in near real-time. For example, a system may include a sensor that captures spatial information and/or attribute information about points in an environment where the sensor is located, wherein the captured points and corresponding attributes make up a point cloud. The system may also include an encoder that compresses the captured point cloud attribute information. The compressed attribute information of the point cloud may be sent over a network in real-time or near real-time to a decoder that decompresses the compressed attribute information of the point cloud. The decompressed point cloud may be further processed, for example to make a control decision based on the surrounding environment at the location of the sensor. The control decision may then be communicated back to a device at or near the location of the sensor, wherein the device receiving the control decision implements the control decision in real-time or near real-time. In some embodiments, the decoder may be associated with an augmented reality system and the decompressed attribute information may be displayed or otherwise used by the augmented reality system. In some embodiments, compressed attribute information for a point cloud may be sent with compressed spatial information for points of the point cloud. In other embodiments, spatial information and attribute information may be separately encoded and/or separately transmitted to a decoder.

In some embodiments, a system may include a decoder that receives one or more point cloud files comprising compressed attribute information via a network from a remote server or other storage device that stores the one or more point cloud files. For example, a 3-D display, a holographic display, or a head-mounted display may be manipulated in real-time or near real-time to show different portions of a virtual world represented by point clouds. In order to update the 3-D display, the holographic display, or the head-mounted display, a system associated with the decoder may request point cloud files from the remote server based on user manipulations of the displays, and the point cloud files may be transmitted from the remote server to the decoder and decoded by the decoder in real-time or near real-time. The displays may then be updated with updated point cloud data responsive to the user manipulations, such as updated point attributes.

In some embodiments, a system, may include one or more LIDAR systems, 3-D cameras, 3-D scanners, etc., and such sensor devices may capture spatial information, such as X, Y, and Z coordinates for points in a view of the sensor devices. In some embodiments, the spatial information may be relative to a local coordinate system or may be relative to a global coordinate system (for example, a Cartesian coordinate system may have a fixed reference point, such as a fixed point on the earth, or may have a non-fixed local reference point, such as a sensor location).

In some embodiments, such sensors may also capture attribute information for one or more points, such as color attributes, reflectivity attributes, velocity attributes, acceleration attributes, time attributes, modalities, and/or various other attributes. In some embodiments, other sensors, in addition to LIDAR systems, 3-D cameras, 3-D scanners, etc., may capture attribute information to be included in a point cloud. For example, in some embodiments, a gyroscope or accelerometer, may capture motion information to be included in a point cloud as an attribute associated with one or more points of the point cloud. For example, a vehicle equipped with a LIDAR system, a 3-D camera, or a 3-D scanner may include the vehicle's direction and speed in a point cloud captured by the LIDAR system, the 3-D camera, or the 3-D scanner. For example, when points in a view of the vehicle are captured they may be included in a point cloud, wherein the point cloud includes the captured points and associated motion information corresponding to a state of the vehicle when the points were captured.

In some embodiments, attribute information may comprise string values, such as different modalities. For example attribute information may include string values indicating a modality such as "walking", "running", "driving", etc. In some embodiments, an encoder may comprise a "string-value" to integer index, wherein certain strings are associated with certain corresponding integer values. In some embodiments, a point cloud may indicate a string value for a point by including an integer associated with the string value as an attribute of the point. The encoder and decoder may both store a common string value to integer index, such that the decoder can determine string values for points based on looking up the integer value of the string attribute of the point in a string value to integer index of the decoder that matches or is similar to the string value to integer index of the encoder.

In some embodiments, an encoder compresses and encodes spatial information of a point cloud to compress the spatial information in addition to compressing attribute information for attributes of the points of the point cloud. For example, to compress spatial information a K-D tree may be generated wherein, respective numbers of points included in each of the cells of the K-D tree are encoded. This sequence of encoded point counts may encode spatial information for points of a point cloud. Also, in some embodiments, a sub-sampling and prediction method may be used to compress and encode spatial information for a point cloud. In some embodiments, the spatial information may be quantized prior to being compressed and encoded. Also, in some embodiments, compression of spatial information may be lossless. Thus, a decoder may be able to determine a same view of the spatial information as an encoder. Also, an encoder may be able to determine a view of the spatial information a decoder will encounter once the compressed spatial information is decoded. Because, both an encoder and decoder may have or be able to recreate the same spatial information for the point cloud, spatial relationships may be used to compress attribute information for the point cloud.

For example, in many point clouds, attribute information between adjacent points or points that are located at relatively short distances from each other may have high levels of correlation between attributes, and thus relatively small differences in point attribute values. For example, proximate points in a point cloud may have relatively small differences in color, when considered relative to points in the point cloud that are further apart.

In some embodiments, an encoder may include a predictor that determines a predicted attribute value of an attribute of a point in a point cloud based on attribute values for similar attributes of neighboring points in the point cloud and based on respective distances between the point being evaluated and the neighboring points. In some embodiments, attribute values of attributes of neighboring points that are closer to a point being evaluated may be given a higher weighting than attribute values of attributes of neighboring points that are further away from the point being evaluated. Also, the encoder may compare a predicted attribute value to an actual attribute value for an attribute of the point in the original point cloud prior to compression. A residual difference, also referred to herein as an "attribute correction value" may be determined based on this comparison. An attribute correction value may be encoded and included in compressed attribute information for the point cloud, wherein a decoder uses the encoded attribute correction value to correct a predicted attribute value for the point, wherein the attribute value is predicted using a same or similar prediction methodology at the decoder that is the same or similar to the prediction methodology that was used at the encoder.

In some embodiments, to encode attribute values an encoder may generate a minimum spanning tree for points of a point cloud based on spatial information for the points of the point cloud. The encoder may select a first point as a starting point and may determine an evaluation order for other ones of the points of the point cloud based on minimum distances from the starting point to a closest neighboring point, and a subsequent minimum distance from the neighboring point to the next closest neighboring point, etc. In this way, an evaluation order for determining predicted attribute values of the points of the point cloud may be determined. Because the decoder may receive or re-create the same spatial information as the spatial information used by the encoder, the decoder may generate the same minimum spanning tree for the point cloud and may determine the same evaluation order for the points of the point cloud.

In some embodiments, an encoder may assign an attribute value for a starting point of a point cloud to be used to generate a minimum spanning tree. An encoder may predict an attribute value for a next nearest point to the starting point based on the attribute value of the starting point and a distance between the starting point and the next nearest point. The encoder may then determine a difference between the predicted attribute value for the next nearest point and the actual attribute value for the next nearest point included in the non-compressed original point cloud. This difference may be encoded in a compressed attribute information file as an attribute correction value for the next nearest point. The encoder may then repeat a similar process for each point in the evaluation order. To predict the attribute value for subsequent points in the evaluation order, the encoder may identify the K-nearest neighboring points to a particular point being evaluated, wherein the identified K-nearest neighboring points have assigned or predicted attribute values. In some embodiments, "K" may be a configurable parameter that is communicated from an encoder to a decoder.

The encoder may determine a distance in X, Y, and Z space between a point being evaluated and each of the identified neighboring points. For example, the encoder may determine respective Euclidian distances from the point being evaluated to each of the neighboring points. The encoder may then predict an attribute value for an attribute of the point being evaluated based on the attribute values of the neighboring points, wherein the attribute values of the neighboring points are weighted according to an inverse of the distances from the point being evaluated to the respective ones of the neighboring points. For example, attribute values of neighboring points that are closer to the point being evaluated may be given more weight than attribute values of neighboring points that are further away from the point being evaluated.

In a similar manner as described for the first neighboring point, the encoder may compare a predicted value for each of the other points of the point cloud to an actual attribute value in an original non-compressed point cloud, for example the captured point cloud. The difference may be encoded as an attribute correction value for an attribute of one of the other points that is being evaluated. In some embodiments, attribute correction values may be encoded in an order in a compressed attribute information file in accordance with the evaluation order determined based on the minimum spanning tree. Because the encoder and the decoder may determine the same evaluation order based on the spatial information for the point cloud, the decoder may determine which attribute correction value corresponds to which attribute of which point based on the order in which the attribute correction values are encoded in the compressed attribute information file. Additionally, the starting point and one or more attribute value(s) of the starting point may be explicitly encoded in a compressed attribute information file such that the decoder may determine the evaluation order starting with the same point as was used to start the evaluation order at the encoder. Additionally, the one or more attribute value(s) of the starting point may provide a value of a neighboring point that a decoder uses to determine a predicted attribute value for a point being evaluated that is a neighboring point to the starting point.

In some embodiments, an encoder may determine a predicted value for an attribute of a point based on temporal considerations. For example, in addition to or in place of determining a predicted value based on neighboring points in a same "frame" e.g. point in time as the point being evaluated, the encoder may consider attribute values of the point in adjacent and subsequent time frames.

FIG. 1A illustrates a system comprising a sensor that captures information for points of a point cloud and an encoder that compresses attribute information of the point cloud, where the compressed attribute information is sent to a decoder, according to some embodiments.

System 100 includes sensor 102 and encoder 104. Sensor 102 captures a point cloud 110 comprising points representing structure 106 in view 108 of sensor 102. For example, in some embodiments, structure 106 may be a mountain range, a building, a sign, an environment surrounding a street, or any other type of structure. In some embodiments, a captured point cloud, such as captured point cloud 110, may include spatial and attribute information for the points included in the point cloud. For example, point A of captured point cloud 110 comprises X, Y, Z coordinates and attributes 1, 2, and 3. In some embodiments, attributes of a point may include attributes such as R, G, B color values, a velocity at the point, an acceleration at the point, a reflectance of the structure at the point, a time stamp indicating when the point was captured, a string-value indicating a modality when the point was captured, for example "walking", or other attributes. The captured point cloud 110 may be provided to encoder 104, wherein encoder 104 generates a compressed version of the point cloud (compressed attribute information 112) that is transmitted via network 114 to decoder 116. In some embodiments, a compressed version of the point cloud, such as compressed attribute information 112, may be included in a common compressed point cloud that also includes compressed spatial information for the points of the point cloud or, in some embodiments, compressed spatial information and compressed attribute information may be communicated as separate files.

In some embodiments, encoder 104 may be integrated with sensor 102. For example, encoder 104 may be implemented in hardware or software included in a sensor device, such as sensor 102. In other embodiments, encoder 104 may be implemented on a separate computing device that is proximate to sensor 102.

FIG. 1B illustrates a process for encoding compressed attribute information of a point cloud, according to some embodiments. Also, FIG. 1C illustrates representative views of point cloud information at different stages of an encoding process, according to some embodiments.

At 152, an encoder, such as encoder 104, receives a captured point cloud or a generated point cloud. For example, in some embodiments a point cloud may be captured via one or more sensors, such as sensor 102, or may be generated in software, such as in a virtual reality or augmented reality system. For example, 164 illustrates an example captured or generated point cloud. Each point in the point cloud shown in 164 may have one or more attributes associated with the point. Note that point cloud 164 is shown in 2D for ease of illustration, but may include points in 3D space.

At 154, a minimum spanning tree is determined based on the spatial information of the point cloud received by the encoder at 152. In order to determine a minimum spanning tree, a minimum spanning tree generator of an encoder may select a starting point for the minimum spanning tree. The minimum spanning tree generator may then identify points that are adjacent to the starting point. The adjacent points may then be sorted based on respective distances between the respective identified adjacent points and the starting point. The adjacent point that is at the shortest distance from the starting point, may be selected as the next point to be visited. A "weight" of an "edge", e.g. a distance between points in a point cloud, may be determined for an edge between the starting point and the adjacent point selected to be next visited, wherein, longer distances are given greater weights than shorter distances. After the adjacent point closest to the starting point is added to the minimum spanning tree, the adjacent point may then be evaluated and points adjacent to the point currently being evaluated (e.g. the point that was previously selected to be next visited) may be identified. The identified adjacent points may be sorted based on respective distances between the point currently being evaluated and the identified adjacent points. The adjacent point at the shortest distance, e.g. "edge", from the point currently being evaluated may be selected as the next point to be included in the minimum spanning tree. A weight for the edge between the point currently being evaluated and the next selected adjacent point may be determined and added to the minimum spanning tree. A similar process may be repeated for each of the other points of the point cloud to generate a minimum spanning tree for the point cloud.

For example, 166 illustrates an illustration of a minimum spanning tree. In the minimum spanning tree shown in 166, each vertex may represent a point in a point cloud, and the edge weights between vertices, for example, 1, 2, 3, 4, 7, 8, etc. may represent distances between points in the point cloud. For example a distance between vertex 172 and vertex 174 may have a weight of 7, whereas a distance between vertices 172 and 176 may have a weight of 8. This may indicate that a distance in a point cloud between a point corresponding to vertex 172 and a point corresponding to vertex 176 is greater than a distance in the point cloud between a point corresponding to vertex 172 and a point corresponding to vertex 174. In some embodiments, weights shown in a minimum spanning tree may be based on vector distances in 3-D space, such as Euclidean distances.

At 156, an attribute value for one or more attributes of a starting point, such as the starting point used to generate the minimum spanning tree, may be assigned to be encoded and included in compressed attribute information for the point cloud. As discussed above, predicted attribute values for points of a point cloud may be determined based on attribute values of neighboring points. However, an initial attribute value for at least one point is provided to a decoder so that the decoder may determine attribute values for other points using at least the initial attribute value and attribute correction values for correcting predicted attribute values that are predicted based on the initial attribute value. Thus, one or more attribute values for at least one starting point are explicitly encoded in a compressed attribute information file. Additionally, spatial information for the starting point may be explicitly encoded such that a minimum spanning tree generator of a decoder may determine which point of the points of the point cloud is to be used as a starting point for generating a minimum spanning tree. In some embodiments, a starting point may be indicated in other ways other than explicitly encoding the spatial information for the starting point, such as flagging the starting point or other methods of point identification.

Because a decoder will receive an indication of a starting point and will encounter the same or similar spatial information for the points of the point cloud as the encoder, the decoder may determine a same minimum spanning tree from the same starting point as was determined by the encoder. Additionally, the decoder may determine a same processing order as the encoder based on the same minimum spanning tree determined by the decoder.

At 158, for a current point being evaluated, a prediction/correction evaluator of an encoder determines a predicted attribute value for an attribute of the point currently being evaluated. In some embodiments, a point currently being evaluated may have more than one attribute. Accordingly, a prediction/correction evaluator of an encoder may predict more than one attribute value for the point. For each point being evaluated, the prediction/correction evaluator may identify a set of nearest neighboring points that have assigned or predicted attribute values. In some embodiments, a number of neighboring points to identify, "K", may be a configurable parameter of an encoder and the encoder may include configuration information in a compressed attribute information file indicating the parameter "K" such that a decoder may identify a same number of neighboring points when performing attribute prediction. The prediction/correction evaluator may then use weights from the minimum spanning tree or may otherwise determine distances between the point being evaluated and respective ones of the identified neighboring points. The prediction/correction evaluator may use an inverse distance interpolation method to predict an attribute value for each attribute of the point being evaluated. The prediction/correction evaluator may then predict an attribute value of the point being evaluated based on an average of inverse-distance weighted attribute values of the identified neighboring points.

For example, 168 illustrates a point (X,Y,Z) being evaluated wherein attribute A1 is being determined based on inverse distance weighted attribute values of eight identified neighboring points.

At 160, an attribute correction value is determined for each point. The attribute correction value is determined based on comparing a predicted attribute value for each attribute of a point to corresponding attribute values of the point in an original non-compressed point cloud, such as the captured point cloud. For example, 170 illustrates an equation for determining attribute correction values, wherein a captured value is subtracted from a predicted value to determine an attribute correction value. Note that while, FIG. 1B shows attribute values being predicted at 158 and attribute correction values being determined at 160, in some embodiments attribute correction values may be determined for a point subsequent to predicting an attribute value for the point. A next point may then be evaluated, wherein a predicted attribute value is determined for the point and an attribute correction value is determined for the point. Thus 158 and 160 may be repeated for each point being evaluated. In other embodiments, predicted values may be determined for multiple points and then attribute correction values may be determined. In some embodiments, predictions for subsequent points being evaluated may be based on predicted attribute values or may be based on corrected attribute values or both. In some embodiments, both an encoder and a decoder may follow the same rules as to whether predicted values for subsequent points are to be determined based on predicted or corrected attribute values.

At 162, the determined attribute correction values for the points of the point cloud, one or more assigned attribute values for the starting point, spatial information or other indicia of the starting point, and any configuration information to be included in a compressed attribute information file is encoded. As discussed in more detail in FIG. 5 various encoding methods, such as arithmetic encoding and/or Golomb encoding may be used to encode the attribute correction values, assigned attribute values, and the configuration information.

FIG. 2A illustrates components of an encoder, according to some embodiments.

Encoder 202 may be a similar encoder as encoder 104 illustrated in FIG. 1A. Encoder 202 includes spatial encoder 204, minimum spanning tree generator 210, prediction/correction evaluator 206, incoming data interface 214, and outgoing data interface 208. Encoder 202 also includes context store 216 and configuration store 218.

Figure 6:
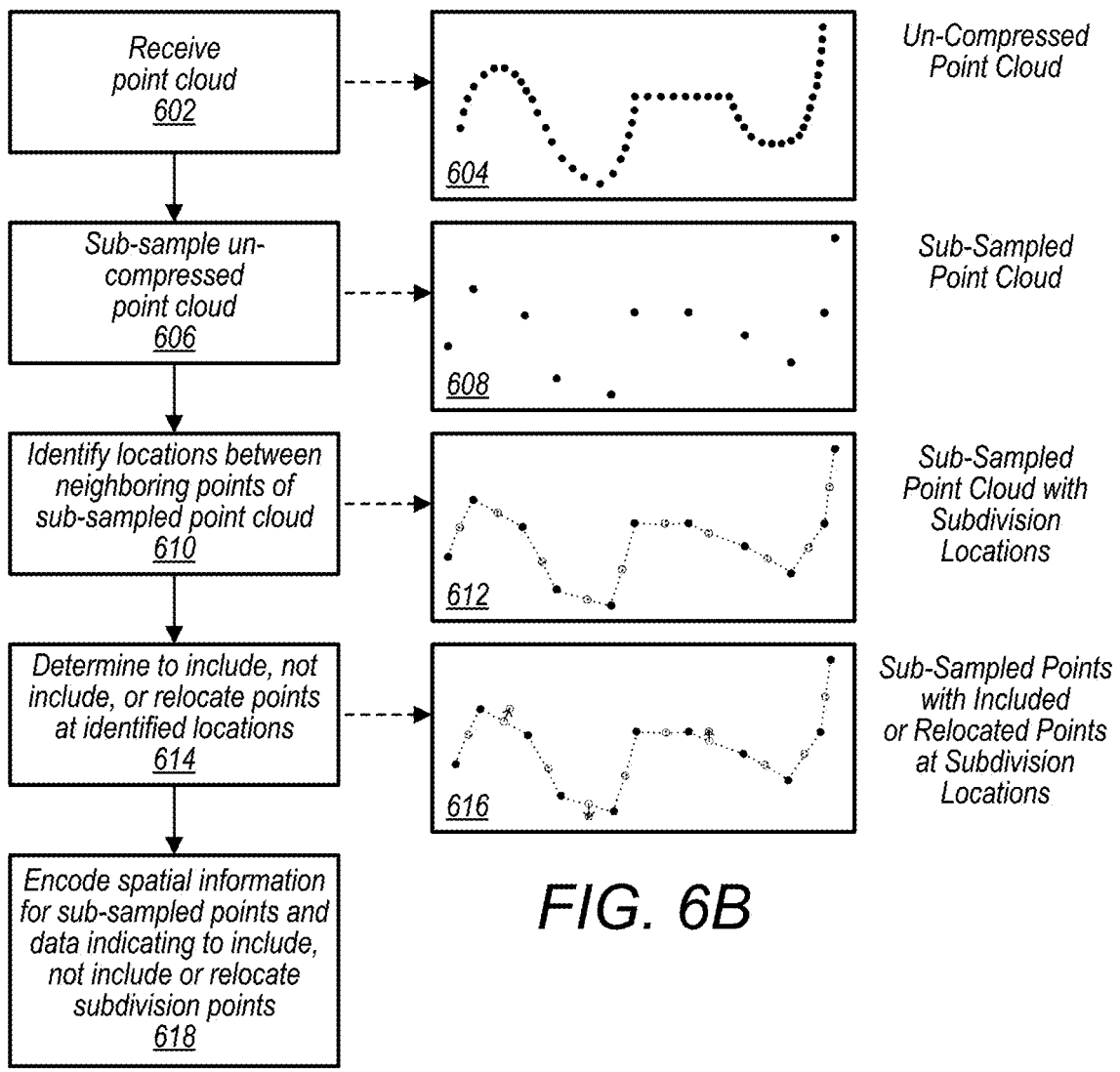
FIGS. 6A-B illustrate an example process for compressing spatial information of a point cloud, according to some embodiments.

In some embodiments, a spatial encoder, such as spatial encoder 204, may compress spatial information associated with points of a point cloud, such that the spatial information can be stored or transmitted in a compressed format. In some embodiments, a spatial encoder, may utilize K-D trees to compress spatial information for points of a point cloud as discussed in more detail in regard to FIG. 7. Also, in some embodiments, a spatial encoder, such as spatial encoder 204, may utilize a sub-sampling and prediction technique as discussed in more detail in regard to FIGS. 6A-B. In some embodiments, a spatial encoder, such as spatial encoder 204, may utilize Octrees to compress spatial information for points of a point cloud as discussed in more detail in regard to FIG. 11D.

In some embodiments, compressed spatial information may be stored or transmitted with compressed attribute information or may be stored or transmitted separately. In either case, a decoder receiving compressed attribute information for points of a point cloud may also receive compressed spatial information for the points of the point cloud, or may otherwise obtain the spatial information for the points of the point cloud.

A minimum spanning tree generator, such as minimum spanning tree generator 210, may utilize spatial information for points of a point cloud to generate a minimum spanning tree representing minimum distances between points of the point cloud. Because a decoder is provided or otherwise obtains the same spatial information for points of a point cloud as are available at the encoder, a minimum spanning tree determined by a minimum spanning tree generator of an encoder, such as minimum spanning tree generator 210 of encoder 202, may be the same or similar as a minimum spanning tree generated by a minimum spanning tree generator of a decoder, such as minimum spanning tree generator 228 of decoder 220.

A prediction/correction evaluator, such as prediction/correction evaluator 206 of encoder 202, may determine predicted attribute values for points of a point cloud based on an inverse distance interpolation method using attribute values of the K-nearest neighboring points of a point for whom an attribute value is being predicted. The prediction/correction evaluator may also compare a predicted attribute value of a point being evaluated to an original attribute value of the point in a non-compressed point cloud to determine an attribute correction value.

An outgoing data encoder, such as outgoing data encoder 208 of encoder 202, may encode attribute correction values and assigned attribute values included in a compressed attribute information file for a point cloud. In some embodiments, an outgoing data encoder, such as outgoing data encoder 208, may select an encoding context for encoding a value, such as an assigned attribute value or an attribute correction value, based on a number of symbols included in the value. In some embodiments, values with more symbols may be encoded using an encoding context comprising Golomb exponential encoding, whereas values with fewer symbols may be encoded using arithmetic encoding. In some embodiments, encoding contexts may include more than one encoding technique. For example, a portion of a value may be encoded using arithmetic encoding while another portion of the value may be encoded using Golomb exponential encoding. In some embodiments, an encoder, such as encoder 202, may include a context store, such as context store 216, that stores encoding contexts used by an outgoing data encoder, such as outgoing data encoder 208, to encode attribute correction values and assigned attribute values.

In some embodiments, an encoder, such as encoder 202, may also include an incoming data interface, such as incoming data interface 214. In some embodiments, an encoder may receive incoming data from one or more sensors that capture points of a point cloud or that capture attribute information to be associated with points of a point cloud. For example, in some embodiments, an encoder may receive data from an LIDAR system, 3-D-camera, 3-D scanner, etc. and may also receive data from other sensors, such as a gyroscope, accelerometer, etc. Additionally, an encoder may receive other data such as a current time from a system clock, etc. In some embodiments, such different types of data may be received by an encoder via an incoming data interface, such as incoming data interface 214 of encoder 202.

In some embodiments, an encoder, such as encoder 202, may further include a configuration interface, such as configuration interface 212, wherein one or more parameters used by the encoder to compress a point cloud may be adjusted via the configuration interface. In some embodiments, a configuration interface, such as configuration interface 212, may be a programmatic interface, such as an API. Configurations used by an encoder, such as encoder 202, may be stored in a configuration store, such as configuration store 218.

In some embodiments, an encoder, such as encoder 202, may include more or fewer components than shown in FIG. 2A.

Figure 2B:
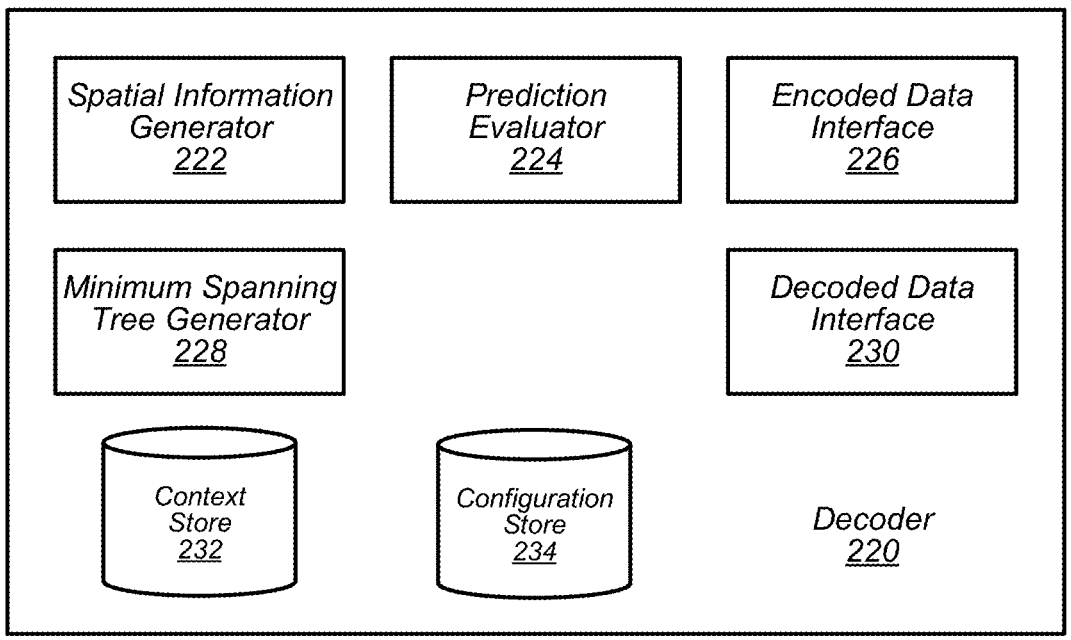
FIG. 2B illustrates components of a decoder, according to some embodiments.

FIG. 2B illustrates components of a decoder, according to some embodiments. Decoder 220 may be a similar decoder as decoder 116 illustrated in FIG. 1A. Decoder 220 includes encoded data interface 226, spatial decoder 222, minimum spanning tree generator 228, prediction evaluator 224, context store 232, configuration store 234, and decoded data interface 220.

A decoder, such as decoder 220, may receive an encoded compressed point cloud and/or an encoded compressed attribute information file for points of a point cloud. For example, a decoder, such as decoder 220, may receive a compressed attribute information file, such a compressed attribute information 112 illustrated in FIG. 1A or compressed attribute information file 300 illustrated in FIG. 3. The compressed attribute information file may be received by a decoder via an encoded data interface, such as encoded data interface 226. The encoded compressed point cloud may be used by the decoder to determine spatial information for points of the point cloud. For example, spatial information of points of a point cloud included in a compressed point cloud may be generated by a spatial information generator, such as spatial information generator 222. In some embodiments, a compressed point cloud may be received via an encoded data interface, such as encoded data interface 226, from a storage device or other intermediary source, wherein the compressed point cloud was previously encoded by an encoder, such as encoder 104. In some embodiments, an encoded data interface, such as encoded data interface 226, may decode spatial information. For example the spatial information may have been encoded using various encoding techniques such as arithmetic encoding, Golomb encoding, etc. A spatial information generator, such as spatial information generator 222, may receive decoded spatial information from an encoded data interface, such as encoded data interface 226, and may use the decoded spatial information to generate a representation of the geometry of the point cloud being de-compressed. For example, decoded spatial information may be formatted as residual values to be used in a sub-sampled prediction method to recreate a geometry of a point cloud to be decompressed. In such situations, the spatial information generator 222, may recreate the geometry of the point cloud being decompressed using decoded spatial information from encoded data interface 226, and minimum spanning tree generator 228 may determine a minimum spanning tree for the point cloud being decompressed based on the recreated geometry for the point cloud being decompressed generated by spatial information generator 222.

Once spatial information for a point cloud is determined, a minimum spanning tree generator, such as minimum spanning tree generator 228, may generate a minimum spanning tree based on the spatial information for the point cloud. The minimum spanning tree may be used by a prediction evaluator of a decoder, such as prediction evaluator 224 of decoder 220, to determine an evaluation order for determining attribute values of points of the point cloud. Additionally, the minimum spanning tree may be used by a prediction evaluator, such as prediction evaluator 224, to identify nearest neighboring points to a point being evaluated.

A prediction evaluator of a decoder, such as prediction evaluator 224, may select a starting point of a minimum spanning tree based on an assigned starting point included in a compressed attribute information file. In some embodiments, the compressed attribute information file may include one or more assigned values for one or more corresponding attributes of the starting point. In some embodiments, a prediction evaluator, such as prediction evaluator 224, may assign values to one or more attributes of a starting point in a decompressed model of a point cloud being decompressed based on assigned values for the starting point included in a compressed attribute information file. A prediction evaluator, such as prediction evaluator 224, may further utilize the assigned values of the attributes of the starting point to determine attribute values of neighboring points. For example, a prediction evaluator may select a next nearest neighboring point to the starting point as a next point to evaluate, wherein the next nearest neighboring point is selected based on a shortest distance to a neighboring point from the starting point in the minimum spanning tree. Note that because the minimum spanning tree is generated based on the same or similar spatial information at the decoder as was used to generate a minimum spanning tree at an encoder, the decoder may determine the same evaluation order for evaluating the points of the point cloud being decompressed as was determined at the encoder by identifying next nearest neighbors in the minimum spanning tree.

Once the prediction evaluator has identified the "K" nearest neighboring points to a point being evaluated, the prediction evaluator may predict one or more attribute values for one or more attributes of the point being evaluated based on attribute values of corresponding attributes of the "K" nearest neighboring points. In some embodiments, an inverse distance interpolation technique may be used to predict an attribute value of a point being evaluated based on attribute values of neighboring points, wherein attribute values of neighboring points that are at a closer distance to the point being evaluated are weighted more heavily than attribute values of neighboring points that are at further distances from the point being evaluated.

A prediction evaluator, such as prediction evaluator 224, may apply an attribute correction value to a predicted attribute value to determine an attribute value to include for the point in a decompressed point cloud. In some embodiments, an attribute correction value for an attribute of a point may be included in a compressed attribute information file.

In some embodiments, attribute correction values may be encoded using one of a plurality of supported coding contexts, wherein different coding contexts are selected to encode different attribute correction values based on a number of symbols included in the attribute correction value. In some embodiments, a decoder, such as decoder 220, may include a context store, such as context store 232, wherein the context store stores a plurality of encoding context that may be used to decode assigned attribute values or attribute correction values that have been encoded using corresponding encoding contexts at an encoder.

A decoder, such as decoder 220, may provide a decompressed point cloud generated based on a received compressed point cloud and/or a received compressed attribute information file to a receiving device or application via a decoded data interface, such as decoded data interface 230. The decompressed point cloud may include the points of the point cloud and attribute values for attributes of the points of the point cloud. In some embodiments, a decoder may decode some attribute values for attributes of a point cloud without decoding other attribute values for other attributes of a point cloud. For example, a point cloud may include color attributes for points of the point cloud and may also include other attributes for the points of the point cloud, such as velocity, for example. In such a situation, a decoder may decode one or more attributes of the points of the point cloud, such as the velocity attribute, without decoding other attributes of the points of the point cloud, such as the color attributes.

In some embodiments, the decompressed point cloud and/or decompressed attribute information file may be used to generate a visual display, such as for a head mounted display. Also, in some embodiments, the decompressed point cloud and/or decompressed attribute information file may be provided to a decision making engine that uses the decompressed point cloud and/or decompressed attribute information file to make one or more control decisions. In some embodiments, the decompressed point cloud and/or decompressed attribute information file may be used in various other applications or for various other purposes.

Figure 3:
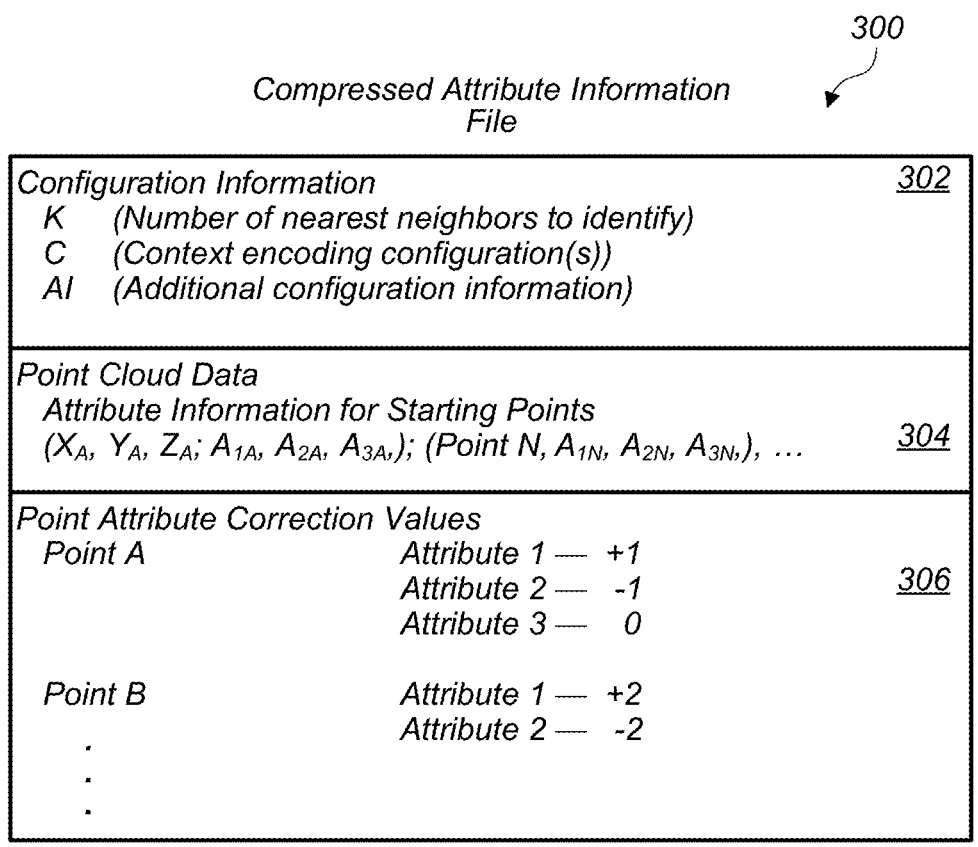
FIG. 3 illustrates an example compressed attribute file, according to some embodiments.

FIG. 3 illustrates an example compressed attribute information file, according to some embodiments. Attribute information file 300 includes configuration information 302, point cloud data 304, and point attribute correction values 306. In some embodiments, point cloud file 300 may be communicated in parts via multiple packets. In some embodiments, not all of the sections shown in attribute information file 300 may be included in each packet transmitting compressed attribute information. In some embodiments, an attribute information file, such as attribute information file 300, may be stored in a storage device, such as a server that implements an encoder or decoder, or other computing device.

Figure 4:
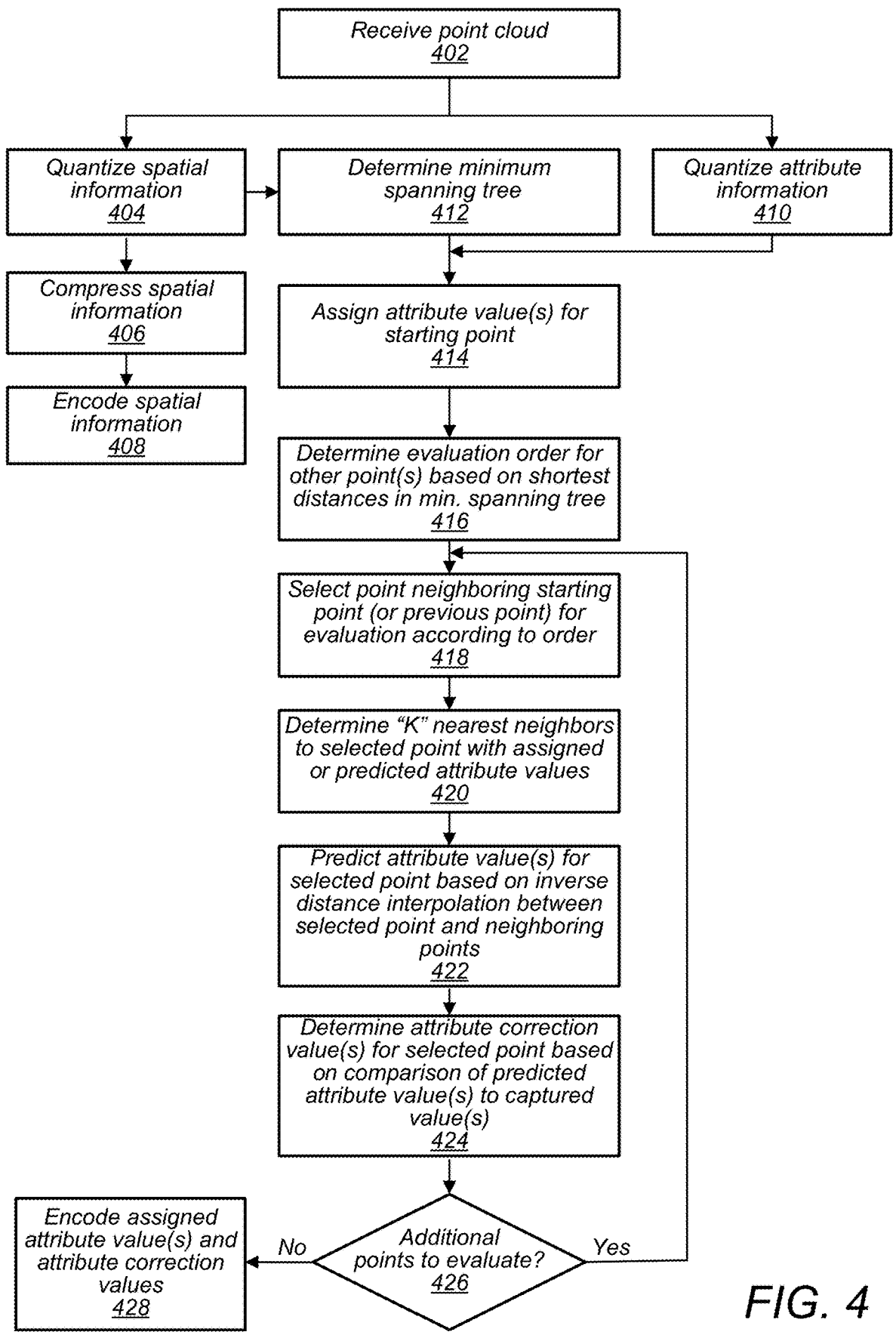
FIG. 4 illustrates a process for compressing attribute information of a point cloud, according to some embodiments.

FIG. 4 illustrates a process for compressing attribute information of a point cloud, according to some embodiments.

At 402, an encoder receives a point cloud that includes attribute information for at least some of the points of the point cloud. The point cloud may be received from one or more sensors that capture the point cloud, or the point cloud may be generated in software. For example, a virtual reality or augmented reality system may have generated the point cloud.

At 404, the spatial information of the point cloud, for example X, Y, and Z coordinates for the points of the point cloud may be quantized. In some embodiments, coordinates may be rounded off to the nearest measurement unit, such as a meter, centimeter, millimeter, etc.

At 406, the quantized spatial information is compressed. In some embodiments, spatial information may be compressed using a sub-sampling and subdivision prediction technique as discussed in more detail in regard to FIGS. 6A-B. Also, in some embodiments, spatial information may be compressed using a K-D tree compression technique as discussed in more detail in regard to FIG. 7, or may be compressed using an Octree compression technique as discussed in more detail in regard to FIGS. 11C-D. In some embodiments, other suitable compression techniques may be used to compress spatial information of a point cloud.

At 408, the compressed spatial information for the point cloud is encoded as a compressed point cloud file or a portion of a compressed point cloud file. In some embodiments, compressed spatial information and compressed attribute information may be included in a common compressed point cloud file, or may be communicated or stored as separate files.

At 412, the received spatial information of the point cloud is used to generate a minimum spanning tree. In some embodiments, the spatial information of the point cloud may be quantized before generating the minimum spanning tree. Additionally, in some embodiments wherein a lossy compression technique is used to compress the spatial information of the point cloud, the spatial information may be lossy encoded and lossy decoded prior to generating the minimum spanning tree. In embodiments that utilize lossy compression for spatial information, encoding and decoding the spatial information at the encoder may ensure that a minimum spanning tree generated at the encoder will match a minimum spanning tree that will be generated at a decoder using decoded spatial information that was previously lossy encoded.

Additionally, in some embodiments, at 410, attribute information for points of the point cloud may be quantized. For example attribute values may be rounded to whole numbers or to particular measurement increments. In some embodiments wherein attribute values are integers, such as when integers are used to communicate string values, such as "walking", "running", "driving", etc., quantization at 410 may be omitted.

At 414, attribute values for a starting point are assigned. The assigned attribute values for the starting point are encoded in a compressed attribute information file along with attribute correction values. Because a decoder predicts attribute values based on distances to neighboring points and attribute values of neighboring points, at least one attribute value for at least one point is explicitly encoded in a compressed attribute file. In some embodiments, points of a point cloud may comprise multiple attributes and at least one attribute value for each type of attribute may be encoded for at least one point of the point cloud, in such embodiments. In some embodiments, a starting point may be a first point evaluated when determining the minimum spanning tree at 412. In some embodiments, an encoder may encode data indicating spatial information for a starting point and/or other indicia of which point of the point cloud is the starting point or starting points. Additionally, the encoder may encode attribute values for one or more attributes of the starting point.

At 416, the encoder determines an evaluation order for predicting attribute values for other points of the point cloud, other than the starting point, said predicting and determining attribute correction values, may be referred to herein as "evaluating" attributes of a point. The evaluation order may be determined based on a shortest distance from the starting point to an adjacent neighboring point, wherein the closest neighboring point is selected as the next point in the evaluation order. In some embodiments, an evaluation order may be determined only for a next point to evaluate. In other embodiments, an evaluation order for all or multiple ones of the points of the point cloud may be determined at 416. In some embodiments, an evaluation order may be determined on the fly, e.g. one point at a time as the points are evaluated.

At 418, a neighboring point of the starting point or of a subsequent point being evaluated is selected. In some embodiments, a neighboring point to be next evaluated may be selected based on the neighboring point being at a shortest distance from a point last evaluated, as compared to other neighboring points of the point last evaluated. In some embodiments, a point selected at 418 may be selected based on an evaluation order determined at 416. In some embodiments, an evaluation order may be determined on the fly, e.g. one point at a time as the points are evaluated. For example, a next point in the evaluation order may be determined each time a next point to be evaluated is selected at 418. In such embodiments, 416 may be omitted. Because points are evaluated in an order wherein each next point to be evaluated is at a shortest distance from a point last evaluated, entropy between attribute values of the points being evaluated may be minimized. This is because points adjacent to one another are most likely to have similar attributes. Though in some circumstances, adjacent points may have varying levels of similarity between attributes.

At 420, the "K" nearest neighboring points to the point currently being evaluated are determined. The parameter "K" may be a configurable parameter selected by an encoder or provided to an encoder as a user configurable parameter. In order to select the "K" nearest neighboring points, an encoder may identify the first "K" nearest points to a point being evaluated according to the minimum spanning tree determined at 412. In some embodiments, only points having assigned attribute values or for which predicted attribute values have already been determined may be included in the "K" nearest neighboring points. In some embodiments various numbers of points may identified. For example, in some embodiments, "K" may be 5 points, 10 points, 16 points, etc. Because a point cloud comprises points in 3-D space a particular point may have multiple neighboring points in multiple planes. In some embodiments, an encoder and a decoder may be configured to identify points as the "K" nearest neighboring points regardless of whether or not a value has already been predicted for the point. Also, in some embodiments, attribute values for points used in predication may be previously predicted attribute values or corrected predicted attribute values that have been corrected based on applying an attribute correction value. In either case, an encoder and a decoder may be configured to apply the same rules when identifying the "K" nearest neighboring points and when predicting an attribute value of a point based on attribute values of the "K" nearest neighboring points.

At 422, one or more attribute values are determined for each attribute of the point currently being evaluated. The attribute values may be determined based on an inverse distance interpolation. The inverse distance interpolation may interpolate the predicted attribute value based on the attribute values of the "K" nearest neighboring points. The attribute values of the "K" nearest neighboring points may be weighted based on respective distances between respective ones of the "K" nearest neighboring points and the point being evaluated. Attribute values of neighboring points that are at shorter distances from the point currently being evaluated may be weighted more heavily than attribute values of neighboring points that are at greater distances from the point currently being evaluated.

At 424, attribute correction values are determined for the one or more predicted attribute values for the point currently being evaluated. The attribute correction values may be determined based on comparing the predicted attribute values to corresponding attribute values for the same point (or a similar point) in the point cloud prior to attribute information compression. In some embodiments, quantized attribute information, such as the quantized attribute information generated at 410, may be used to determine attribute correction values. In some embodiments, an attribute correction value may also be referred to as a "residual error" wherein the residual error indicates a difference between a predicted attribute value and an actual attribute value.

At 426, it is determined if there are additional points in the point cloud for which attribute correction values are to be determined. If there are additional points to evaluate, the process reverts to 418 and the next point in the evaluation order is selected to be evaluated. As discussed above, in some embodiments an evaluation order may be determined on the fly, e.g. one point at a time as the points are evaluated. Thus, in such embodiments, a minimum spanning tree may be consulted to select a next point to evaluate based on the next point being at the shortest distance from the point last evaluated. The process may repeat steps 418-426 until all or a portion of all of the points of the point cloud have been evaluated to determine predicted attribute values and attribute correction values for the predicted attribute values.

At 428, the determined attribute correction values, the assigned attribute values, and any configuration information for decoding the compressed attribute information file, such as a parameter "K", is encoded.

The attribute correction values, the assigned attribute values, and any configuration information may be encoded using various encoding techniques.

Figure 5:
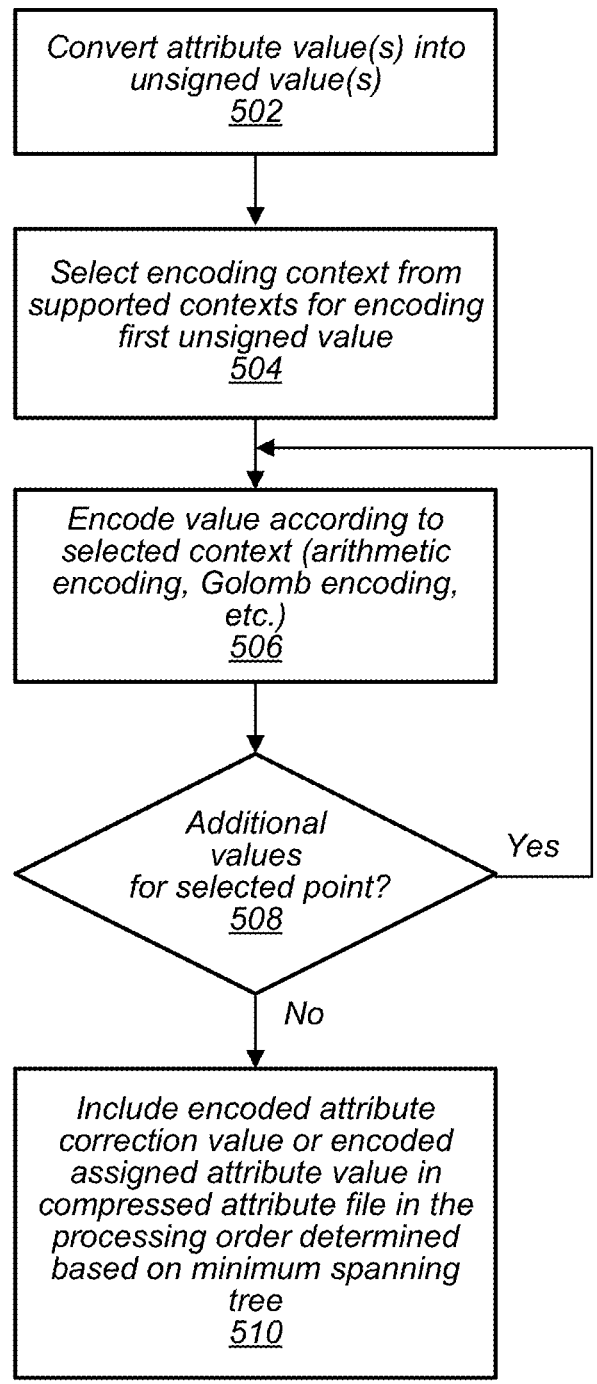
FIG. 5 illustrates a process for encoding attribute correction values, according to some embodiments.

For example, FIG. 5 illustrates a process for encoding attribute correction values, according to some embodiments. At 502, an attribute correction value for a point whose values (e.g. attribute correction values) are being encoded is converted to an unsigned value. For example, in some embodiments, attribute correction values that are negative values may be assigned odd numbers and attribute correction values that are positive values may be assigned even numbers. Thus, whether or not the attribute correction value is positive or negative may be implied based on whether or not a value of the attribute correction value is an even number or an odd number. In some embodiments, assigned attribute values may also be converted into unsigned values. In some embodiments, attribute values may all be positive values, for example in the case of integers that are assigned to represent string values, such as "walking", "running", "driving" etc. In such cases, 502 may be omitted.

At 504, an encoding context is selected for encoding a first value for a point. The value may be an assigned attribute value or may be an attribute correction value, for example. The encoding context may be selected from a plurality of supported encoding contexts. For example, a context store, such as context store 216 of an encoder, such as encoder 202, as illustrated in FIG. 2A, may store a plurality of supported encoding context for encoding attribute values or attribute correction values for points of a point cloud. In some embodiments, an encoding context may be selected based on characteristics of a value to be encoded. For example, some encoding contexts may be optimized for encoding values with certain characteristics while other encoding contexts may be optimized for encoding values with other characteristics.

In some embodiments, an encoding context may be selected based on a quantity or variety of symbols included in a value to be encoded. For example, values with fewer or less diverse symbols may be encoded using arithmetic encoding techniques, while values with more symbols or more diverse symbols may be encoding using exponential Golomb encoding techniques. In some embodiments, an encoding context may encode portions of a value using more than one encoding technique. For example, in some embodiments, an encoding context may indicate that a portion of a value is to be encoded using an arithmetic encoding technique and another portion of the value is to be encoded using a Golomb encoding technique. In some embodiments, an encoding context may indicate that a portion of a value below a threshold is to be encoded using a first encoding technique, such as arithmetic encoding, whereas another portion of the value exceeding the threshold is to be encoded using another encoding technique, such as exponential Golomb encoding. In some embodiments, a context store may store multiple encoding contexts, wherein each encoding context is suited for values having particular characteristics.

At 506, a first value (or additional value) for the point may be encoded using the encoding context selected at 504. At 508 it is determined if there are additional values for the point that are to be encoded. If there are additional values for the point to be encoded, the additional values may be encoded, at 506, using the same selected encoding technique that was selected at 504. For example, a point may have a "Red", a "Green", and a "Blue" color attribute. Because differences between adjacent points in the R, G, B color space may be similar, attribute correction values for the Red attribute, Green attribute, and Blue attribute may be similar. Thus, in some embodiments, an encoder may select an encoding context for encoding attribute correction values for a first one of the color attributes, for example the Red attribute, and may use the same encoding context for encoding attribute correction values for the other color attributes, such as the Green attribute and the Blue attribute.

At 510 encoded values, such as encoded assigned attribute values and encoded attribute correction values may be included in a compressed attribute information file. In some embodiments, the encoded values may be included in the compressed attribute information file in accordance with the evaluation order determined for the point cloud based on a minimum spanning tree. Thus a decoder may be able to determine which encoded value goes with which attribute of which point based on the order in which encoded values are included in a compressed attribute information file. Additionally, in some embodiments, data may be included in a compressed attribute information file indicating respective ones of the encoding contexts that were selected to encode respective ones of the values for the points.

FIGS. 6A-B illustrate an example process for compressing spatial information of a point cloud, according to some embodiments.

At 602, an encoder receives a point cloud. The point cloud may be a captured point cloud from one or more sensors or may be a generated point cloud, such as a point cloud generated by a graphics application. For example, 604 illustrates points of an un-compressed point cloud.

At 606, the encoder sub-samples the received point cloud to generate a sub-sampled point cloud. The sub-sampled point cloud may include fewer points than the received point cloud. For example, the received point cloud may include hundreds of points, thousands of points, or millions of points and the sub-sampled point cloud may include tens of points, hundreds of points or thousands of points. For example, 608 illustrates sub-sampled points of a point cloud received at 602, for example a sub-sampling of the points of the point cloud in 604.

In some embodiments, the encoder may encode and decode the sub-sampled point cloud to generate a representative sub-sampled point cloud the decoder will encounter when decoding the compressed point cloud. In some embodiments, the encoder and decoder may execute a lossy compression/decompression algorithm to generate the representative sub-sampled point cloud. In some embodiments, spatial information for points of a sub-sampled point cloud may be quantized as part of generating a representative sub-sampled point cloud. In some embodiments, an encoder may utilize lossless compression techniques and encoding and decoding the sub-sampled point cloud may be omitted. For example, when using lossless compression techniques the original sub-sampled point cloud may be representative of a sub-sampled point cloud the decoder will encounter because in lossless compression data may not be lost during compression and decompression.

At 610, the encoder identifies subdivision locations between points of the sub-sampled point cloud according to configuration parameters selected for compression of the point cloud or according to fixed configuration parameters. The configuration parameters used by the encoder that are not fixed configuration parameters are communicated to an encoder by including values for the configuration parameters in a compressed point cloud. Thus, a decoder may determine the same subdivision locations as the encoder evaluated based on subdivision configuration parameters included in the compressed point cloud. For example, 612 illustrates identified sub-division locations between neighboring points of a sub-sampled point cloud.

At 614, the encoder determines for respective ones of the subdivision locations whether a point is to be included or not included at the subdivision location in a decompressed point cloud. Data indicating this determination is encoded in the compressed point cloud. In some embodiments, the data indicating this determination may be a single bit that if "true" means a point is to be included and if "false" means a point is not to be included. Additionally, an encoder may determine that a point that is to be included in a decompressed point cloud is to be relocated relative to the subdivision location in the decompressed point cloud. For example 616, shows some points that are to be relocated relative to a subdivision location. For such points, the encoder may further encode data indicating how to relocate the point relative to the subdivision location. In some embodiments, location correction information may be quantized and entropy encoded. In some embodiments, the location correction information may comprise delta X, delta Y, and/or delta Z values indicating how the point is to be relocated relative to the subdivision location. In other embodiments, the location correction information may comprise a single scalar value which corresponds to the normal component of the location correction information computed as follows:

$$\Delta N = ([X_A, Y_A, Z_A] - [X, Y, Z]) \cdot [\text{Normal Vector}]$$

In the above equation, delta N is a scalar value indicating location correction information that is the difference between the relocated or adjusted point location relative to the subdivision location (e.g. $[X_A, Y_A, Z_A]$) and the original subdivision location (e.g. [X, Y, Z]). The cross product of this vector difference and the normal vector at the subdivision location results in the scalar value delta N. Because a decoder can determine, the normal vector at the subdivision location, and can determine the coordinates of the subdivision location, e.g. [X, Y, Z], the decoder can also determine the coordinates of the adjusted location, e.g. [$X_A, Y_A, Z_A$], by solving the above equation for the adjusted location, which represents a relocated location for a point relative to the subdivision location. In some embodiments, the location correction information may be further decomposed into a normal component and one or more additional tangential components. In such an embodiment, the normal component, e.g. delta N, and the tangential component(s) may be quantized and encoded for inclusion in a compressed point cloud.

In some embodiments, an encoder may determine whether one or more additional points (in addition to points included at subdivision locations or points included at locations relocated relative to subdivision locations) are to be included in a decompressed point cloud. For example, if the original point cloud has an irregular surface or shape such that subdivision locations between points in the sub-sampled point cloud do not adequately represent the irregular surface or shape, the encoder may determine to include one or more additional points in addition to points determined to be included at subdivision locations or relocated relative to subdivision locations in the decompressed point cloud. Additionally, an encoder may determine whether one or more additional points are to be included in a decompressed point cloud based on system constraints, such as a target bitrate, a target compression ratio, a quality target metric, etc. In some embodiments, a bit budget may change due to changing conditions such as network conditions, processor load, etc. In such embodiments, an encoder may adjust a quantity of additional points that are encoded to be included in a decompressed point cloud based on a changing bit budget. In some embodiments, an encoder may include additional points such that a bit budget is consumed without being exceeded. For example, when a bit budget is higher, an encoder may include more additional points to consume the bit budget (and enhance quality) and when the bit budget is less, the encoder may include fewer additional points such that the bit budget is consumed but not exceeded.

In some embodiments, an encoder may further determine whether additional subdivision iterations are to be performed. If so, the points determined to be included, relocated, or additionally included in a decompressed point cloud are taken into account and the process reverts to 610 to identify new subdivision locations of an updated sub-sampled point cloud that includes the points determined to be included, relocated, or additionally included in the decompressed point cloud. In some embodiments, a number of subdivision iterations to be performed (N) may be a fixed or configurable parameter of an encoder. In some embodiments, different subdivision iteration values may be assigned to different portions of a point cloud. For example, an encoder may take into account a point of view from which the point cloud is being viewed and may perform more subdivision iterations on points of the point cloud in the foreground of the point cloud as viewed from the point of view and fewer subdivision iterations on points in a background of the point cloud as viewed from the point of view.

At 618, the spatial information for the sub-sampled points of the point cloud are encoded. Additionally, subdivision location inclusion and relocation data is encoded. Additionally, any configurable parameters selected by the encoder or provided to the encoder from a user are encoded. The compressed point cloud may then be sent to a receiving entity as a compressed point cloud file, multiple compressed point cloud files, or may be packetized and communicated via multiple packets to a receiving entity, such as a decoder or a storage device. In some embodiments, a compressed point cloud may comprise both compressed spatial information and compressed attribute information. In other embodiments, compressed spatial information and compressed attribute information may be included is separate compressed point cloud files.

Figure 7:
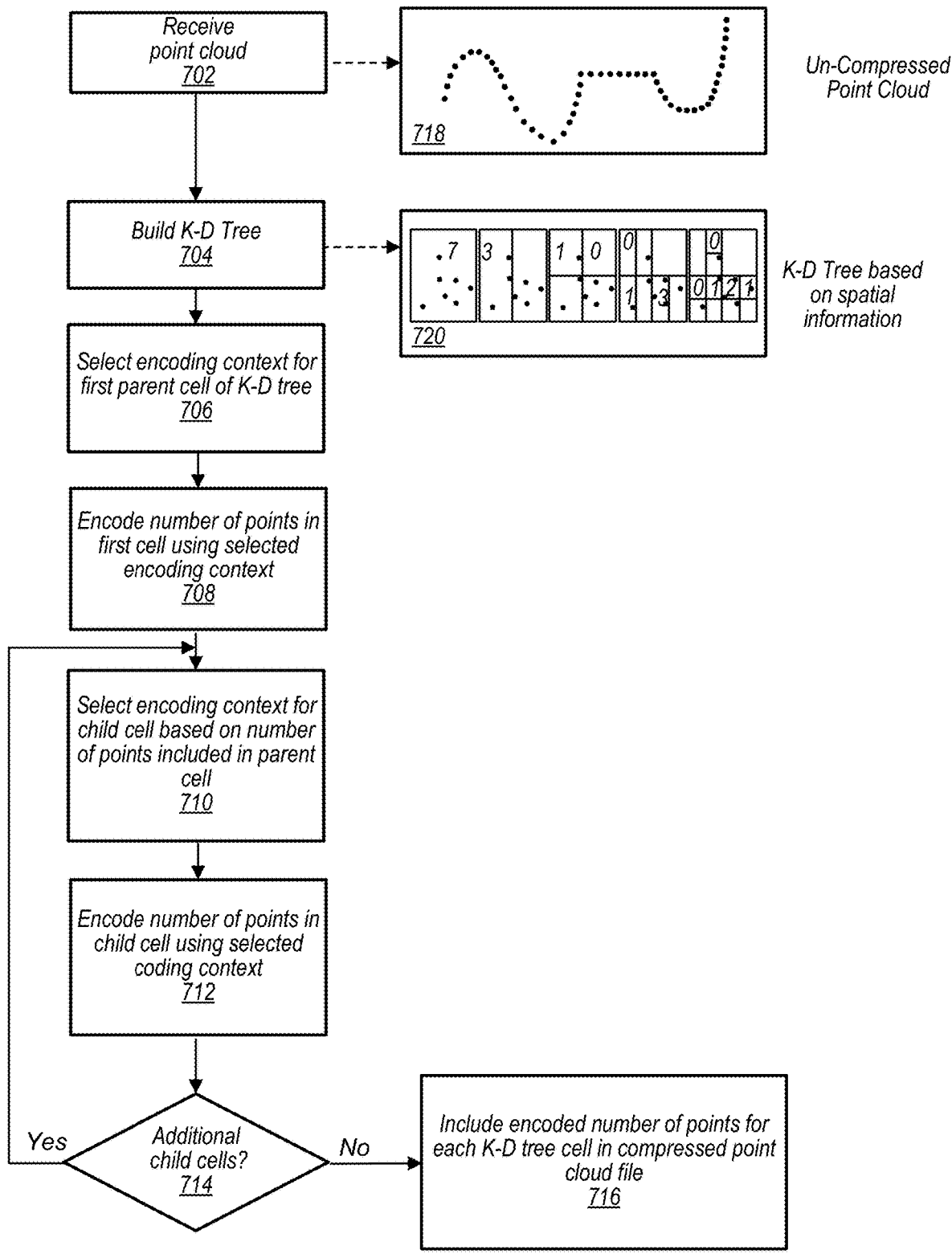
FIG. 7 illustrates another example process for compressing spatial information of a point cloud, according to some embodiments.

FIG. 7 illustrates another example process for compressing spatial information of a point cloud, according to some embodiments.

In some embodiments, other spatial information compression techniques other than the sub-sampling and prediction spatial information technique described in FIGS. 6A-B may be used. For example, a spatial encoder, such as spatial encoder 204, or a spatial decoder, such as spatial decoder 222, may utilize other spatial information compression techniques, such as a K-D tree spatial information compression technique. For example, compressing spatial information at 406 of FIG. 4 may be performed using a sub-sampling and prediction technique similar to what is described in FIGS. 6A-B, may be performed using a K-D tree spatial information compression technique similar to what is described in FIG. 7, or may be performed using another suitable spatial information compression technique.

In a K-D tree spatial information compression technique, a point cloud comprising spatial information may be received at 702. In some embodiments, the spatial information may have been previously quantized or may further be quantized after being received. For example 718 illustrates a captured point cloud that may be received at 702. For simplicity, 718 illustrates a point cloud in two dimensions. However, in some embodiments, a received point cloud may include points in 3-D space.

At 704, a K-dimensional tree or K-D tree is built using the spatial information of the received point cloud. In some embodiments, a K-D tree may be built by dividing a space, such as a 1-D, 2-D, or 3-D space of a point cloud in half in a predetermined order. For example, a 3-D space comprising points of a point cloud may initially be divided in half via a plane intersecting one of the three axis, such as the X-axis. A subsequent division may then divide the resulting space along another one of the three axis, such as the Y-axis. Another division may then divide the resulting space along another one of the axis, such as the Z-axis. Each time a division is performed a number of points included in a child cell created by the division may be recorded. In some embodiments, only a number of points in one child cell of two child cells resulting from a division may be recorded. This is because a number of points included in the other child cell can be determined by subtracting the number of points in the recorded child cell from a total number of points in a parent cell prior to the division.

A K-D tree may include a sequence of number of points included in cells resulting from sequential divisions of a space comprising points of a point cloud. In some embodiments, building a K-D tree may comprise continuing to subdivide a space until only a single point is included in each lowest level child cell. A K-D tree may be communicated as a sequence of number of points in sequential cells resulting from sequential divisions. A decoder may be configured with information indicating the subdivision sequence followed by an encoder. For example, an encoder may follow a predefined division sequence until only a single point remains in each lowest level child cell. Because the decoder may know the division sequence that was followed to build the K-D tree and the number of points that resulted from each subdivision (which is communicated to the decoder as compressed spatial information) the decoder may be able to reconstruct the point cloud.

For example, 720 illustrates a simplified example of K-D compression in a two-dimensional space. An initial space includes seven points. This may be considered a first parent cell and a K-D tree may be encoded with a number of points "7" as a first number of the K-D tree indicating that there are seven total points in the K-D tree. A next step may be to divide the space along the X-axis resulting in two child cells, a left child cell with three points and a right child cell with four points. The K-D tree may include the number of points in the left child cell, for example "3" as a next number of the K-D tree. Recall that the number of points in the right child cell can be determined based on subtracting the number of points in the left child cell from the number of points in the parent cell. A further step may be to divide the space an additional time along the Y-axis such that each of the left and right child cells are divided in half into lower level child cells. Again, a number of points included in the left lower-level child cells may be included in a K-D tree, for example "0" and "1". A next step may then be to divide the non-zero lower-level child cells along the X-axis and record the number of points in each of the lower-level left child cells in a K-D tree. This process may continue until only a single point remains in a lowest level child cell. A decoder may utilize a reverse process to recreate a point cloud based on receiving a sequence of point totals for each left child cell of a K-D tree.

At 706, an encoding context for encoding a number of points for a first cell of the K-D tree, for example the parent cell comprising seven points, is selected. In some embodiments, a context store may store hundreds or thousands of encoding contexts. In some embodiments, cells comprising more points than a highest number of points encoding context may be encoded using the highest number point encoding context. In some embodiments, an encoding context may include arithmetic encoding, Golomb exponential encoding, or a combination of the two. In some embodiments, other encoding techniques may be used. In some embodiments, an arithmetic encoding context may include probabilities for particular symbols, wherein different arithmetic encoding contexts include different symbol probabilities.

At 708, the number of points for the first cell is encoded according the selected encoding context.

At 710, an encoding context for encoding a child cell is selected based on a number of points included in a parent cell. The encoding context for the child cell may be selected in a similar manner as for the parent cell at 706.

At 712, the number of points included in the child cell is encoded according the selected encoding context, selected at 710. At 714, it is determined if there are additional lower-level child cells to encode in the K-D tree. If so, the process reverts to 710. If not, at 716, the encoded number of points in the parent cell and the child cells are included in a compressed spatial information file, such as a compressed point cloud. The encoded values are ordered in the compressed spatial information file such that the decoder may reconstruct the point cloud based on the number of points of each parent and child cell and the order in which the number of points of the respective cells are included in the compressed spatial information file.

In some embodiments, the number of points in each cell may be determined and subsequently encoded as a group at 716. Or, in some embodiments, a number of points in a cell may be encoded subsequent to being determined without waiting for all child cell point totals to be determined.

Figure 8:
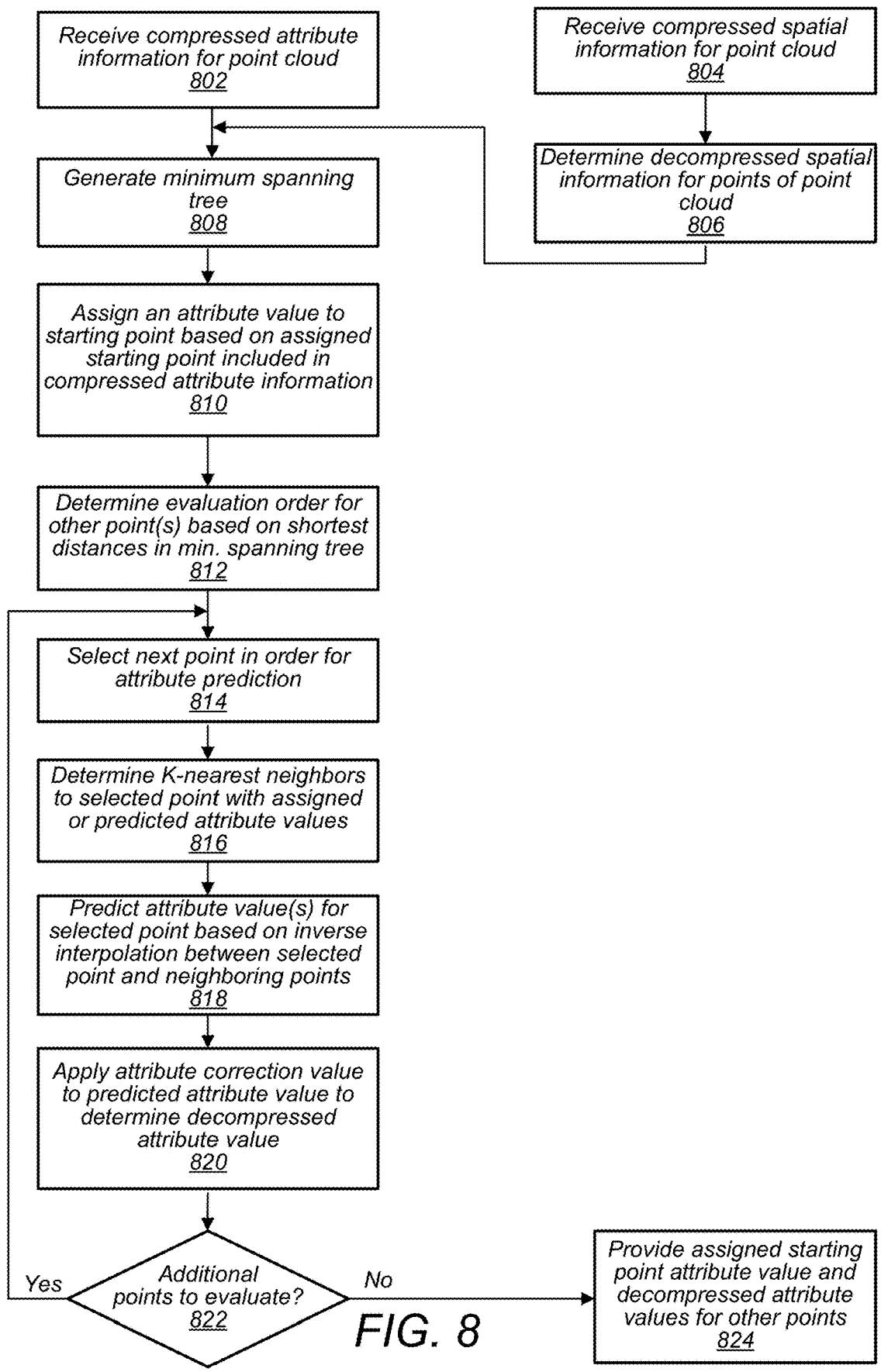
FIG. 8 illustrates an example process for decompressing compressed attribute information of a point cloud, according to some embodiments.

FIG. 8 illustrates an example process for decompressing compressed attribute information of a point cloud, according to some embodiments.

At 802, a decoder receives compressed attribute information for a point cloud, and at 804, the decoder receives compressed spatial information for the point cloud. In some embodiments, the compressed attribute information and the compressed spatial information may be included in one or more common files or separate files.

At 806, the decoder decompresses the compressed spatial information. The compressed spatial information may have been compressed according to a sub-sampling and prediction technique and the decoder may perform similar sub-sampling, prediction, and prediction correction actions as were performed at the encoder and further apply correction values to the predicted point locations, to generate a non-compressed point cloud from the compressed spatial information. In some embodiments, the compressed spatial information may be compressed in a K-D tree format, and the decoder may generate a decompressed point cloud based on an encoded K-D tree included in the received spatial information. In some embodiments, the compressed spatial information may have been compressed using an Octree technique and an Octree decoding technique may be used to generate decompressed spatial information for the point cloud. In some embodiments, other spatial information compression techniques may have been used and may be decompressed via the decoder.

At 808, the decoder may generate a minimum spanning tree, based on the decompressed spatial information. For example, compressed spatial information and/or compressed attribute information may be received via a encoded data interface of a decoder, such as encoded data interface 226 of decoder 220 illustrated in FIG. 2B. A spatial decoder, such as spatial decoder 222, may decompress the compressed spatial information, and a minimum spanning tree generator, such as minimum spanning tree generator 228, may generate a minimum spanning tree based on the decompressed spatial information.

At 810, a prediction evaluator of a decoder, such as prediction evaluator 224 of decoder 220, may assign an attribute value to a starting point based on an assigned attribute value included in the compressed attribute information. In some embodiments, the compressed attribute information may identify a point as a starting point to be used for generating the minimum spanning tree and for predicting attribute values of the points according to an evaluation order based on the minimum spanning tree. The assigned attribute value or values for the starting point may be included in decompressed attribute information for a decompressed point cloud.

At 812, the prediction evaluator of the decoder or another decoder component determines an evaluation order for at least the next point subsequent to the starting point that is to be evaluated. In some embodiments, an evaluation order may be determined for all or multiple ones of the points, or in other embodiments, an evaluation order may be determined point by point as attribute values are determined for the points. The points may be evaluated in an order based on minimum distances between successive points being evaluated. For example, a neighboring point at a shortest distance from a starting point as compared to other neighboring points may be selected as a next point to evaluate subsequent to the starting point. In a similar manner, other points may then be selected to be evaluated based on a shortest distance from a point that has most recently been evaluated. At 814, the next point to evaluate is selected. In some embodiments 812 and 814 may be performed together.

At 816, a prediction evaluator of a decoder determines the "K" nearest neighboring points to a point being evaluated. In some embodiments, neighboring points may only be included in the "K" nearest neighboring points if they already have assigned or predicted attribute values. In other embodiments, neighboring points may be included in the "K" nearest neighboring points without regard to whether they have assigned or already predicted attribute values. In such embodiments, an encoder may follow a similar rule as the decoder as to whether or not to include points without predicted values as neighboring points when identifying the "K" nearest neighboring points.

At 818, predicted attribute values are determined for one or more attributes of the point being evaluated based on attribute values of the "K" nearest neighboring points and distances between the point being evaluated and respective ones of the "K" nearest neighboring points. In some embodiments, an inverse distance interpolation technique may be used to predict attribute values, wherein attribute values of points closer to a point being evaluated are weighted more heavily than attribute values of points that are further away from the point being evaluated. The attribute prediction technique used by a decoder may be the same as an attribute prediction technique used by an encoder that compressed the attribute information.

At 820, a prediction evaluator of a decoder may apply an attribute correction value to a predicted attribute value of a point to correct the attribute value. The attribute correction value may cause the attribute value to match or nearly match an attribute value of an original point cloud prior to compression. In some embodiments, in which a point has more than one attribute, 818 and 820 may be repeated for each attribute of the point. In some embodiments, some attribute information may be decompressed without decompressing all attribute information for a point cloud or a point. For example, a point may include velocity attribute information and color attribute information. The velocity attribute information may be decoded without decoding the color attribute information and vice versa. In some embodiments, an application utilizing the compressed attribute information may indicate what attributes are to be decompressed for a point cloud.

At 822, it is determined if there are additional points to evaluate. If so, the process reverts to 814 and a next point to evaluate is selected. If there are not additional points to evaluate, at 824, decompressed attribute information is provided, for example as a decompressed point cloud, wherein each point comprises spatial information and one or more attributes.

Level of Detail Attribute Compression

In some circumstances, a number of bits needed to encode attribute information for a point cloud may make up a significant portion of a bit stream for the point cloud. For example, the attribute information may make up a larger portion of the bit stream than is used to transmit compressed spatial information for the point cloud.

In some embodiments, spatial information may be used to build a hierarchical Level of Detail (LOD) structure. The LOD structure may be used to compress attributes associated with a point cloud. The LOD structure may also enable advanced functionalities such as progressive/view-dependent streaming and scalable rendering. For example, in some embodiments, compressed attribute information may be sent (or decoded) for only a portion of the point cloud (e.g. a level of detail) without sending (or decoding) all of the attribute information for the whole point cloud.

Figure 9:
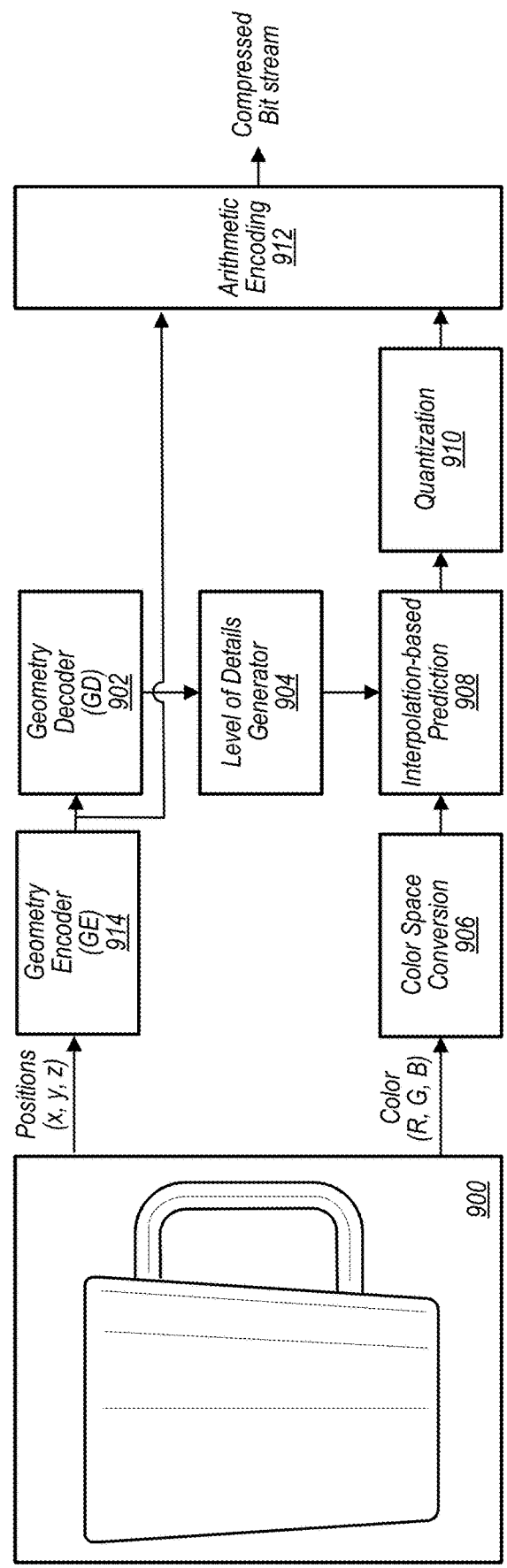
FIG. 9 illustrates components an example encoder that generates a hierarchical level of detail (LOD) structure, according to some embodiments.

FIG. 9 illustrates an example encoding process that generates a hierarchical LOD structure, according to some embodiments. For example, in some embodiments, an encoder such as encoder 202 may generate compressed attribute information in a LOD structure using a similar process as shown in FIG. 9.

In some embodiments, geometry information (also referred to herein as "spatial information") may be used to efficiently predict attribute information. For example, in FIG. 9 the compression of color information is illustrated. However, a LOD structure may be applied to compression of any type of attribute (e.g., reflectance, texture, modality, etc.) associated with points of a point cloud. Note that a pre-encoding step which applies color space conversion or updates the data to make the data better suited for compression may be performed depending on the attribute to be compressed.

In some embodiments, attribute information compression according to a LOD process proceeds as described below.

For example, let Geometry (G)={Point-P(0), P(1), . . . P(N−1)} be reconstructed point cloud positions generated by a spatial decoder included in an encoder (geometry decoder GD 902) after decoding a compressed geometry bit stream produced by a geometry encoder, also included in the encoder (geometry encoder GE 914), such as spatial encoder 204. For example, in some embodiments, an encoder such as encoder 202 may include both a geometry encoder, such as geometry encoder 914, and a geometry decoder, such as geometry decoder 914. In some embodiments, a geometry encoder may be part of spatial encoder 214 and a geometry decoder may be part of prediction/correction evaluator 206. In some embodiments, a minimum spanning tree generator may be omitted, such as minimum spanning tree generator 210.

In some embodiments, the decompressed spatial information may describe locations of points in 3D space, such as X, Y, and Z coordinates of the points that make up mug 900. Note that spatial information may be available to both an encoder, such as encoder 202, and a decoder, such as decoder 220. For example various techniques, such as K-D tree compression, octree compression, nearest neighbor prediction, etc., may be used to compress and/or encode spatial information for mug 900 and the spatial information may be sent to a decoder with, or in addition to, compressed attribute information for attributes of the points that make up a point cloud for mug 900.

In some embodiments, a deterministic re-ordering process may be applied on both an encoder side (such as at encoder 202) and at a decoder side (such as at decoder 220) in order to organize points of a point cloud, such as the points that represent mug 900, in a set of Level of Details (LODs). For example, levels of detail may be generated by a level of detail generator 904, which may be included in a prediction/correction evaluator of an encoder, such as prediction/correction evaluator 206 of encoder 202. In some embodiments, a level of detail generator 904 may be a separate component of an encoder, such as encoder 202. For example, level of detail generator 904 may be a separate component of encoder 202. Note that no additional information needs to be included in the bit stream to generate such LOD structures, except for the parameters of the LOD generation algorithm, For example, parameters that may be included in a bit stream as parameters of the LOD generator algorithm may include:

i. The maximum number of LODs to be generated denoted by "N" (e.g., N=6),
    ii. The initial sampling distance "D0" (e.g., D0=64), and
    iii. The sampling distance update factor "f" (e.g., ½).

In some embodiments, the parameters N, D0 and f, may be provided by a user, such as an engineer configuring a compression process. In some embodiments the parameters N, D0 and f, may be determined automatically by an encoder/and or decoder using an optimization procedure, for example. These parameters may be fixed or adaptive.

In some embodiments, LOD generation may proceed as follows:

a. Points of geometry G (e.g. the points of the point cloud organized according to the spatial information), such as points of mug 900, are marked as non-visited and a set of visited points V is set to be empty.
  b. The LOD generation process may then proceed iteratively. At each iteration j, the level of detail for that refinement level, e.g. LOD(j), may be generated as follows:
    1. The sampling distance for the current LOD, denoted D(j) may be set as follows:
      a. If j=0, then D(j)=D0.
      b. If j>0 and j<N, then D(j)=D(j−1)*f.
      c. if j=N, then D(j)=0.
    2. The LOD generation process iterates over all the points of G.
      a. At the point evaluation iteration i, a point P(i) is evaluated,
        i. if the point P(i) has been visited then it is ignored and the algorithm jumps to the next iteration (i+1), e.g. the next point P(i+1) is evaluated.
        ii. Otherwise, the distance D(i, V), defined as the minimum distance from P(i) over all the points of V, is computed. Note that V is the list of points that have already been visited. If V is empty, the distance D(i, V) is set to 0, meaning that the distance from point P(i) to the visited points is zero because there are not any visited points in the set V. If the shortest distance from point P(i) to any of the already visited point, D(i, V), is strictly higher than a parameter D0, then the point is ignored and the LoD generation jumps to the iteration (i+1) and evaluates the next point P(i+1). Otherwise, P(i) is marked as a visited point and the point P(i) is added to the set of visited points V.
      b. This process may be repeated until all the points of geometry G are traversed.
    3. The set of points added to V during the iteration j describes the refinement level R(j).
    4. The LOD(j) may be obtained by taking the union of all the refinement levels R(0), R(1), . . . , R(j).

In some embodiments, the process described above, may be repeated until all the LODs are generated or all the vertices have been visited.

In some embodiments, an encoder as described above may further include a quantization module (not shown) that quantizes geometry information included in the "positions (x,y,z) being provided to the geometry encoder 914. Furthermore, in some embodiments, an encoder as described above may additionally include a module that removes duplicated points subsequent to quantization and before the geometry encoder 914.

In some embodiments, quantization may further be applied to compressed attribute information, such as attribute correction values and/or one or more attribute value starting points. For example quantization is performed at 910 to attribute correction values determined by interpolation-based prediction module 908. Quantization techniques may include uniform quantization, uniform quantization with a dead zone, non-uniform/non-linear quantization, trellis quantization, or other suitable quantization techniques.

Figure 10:
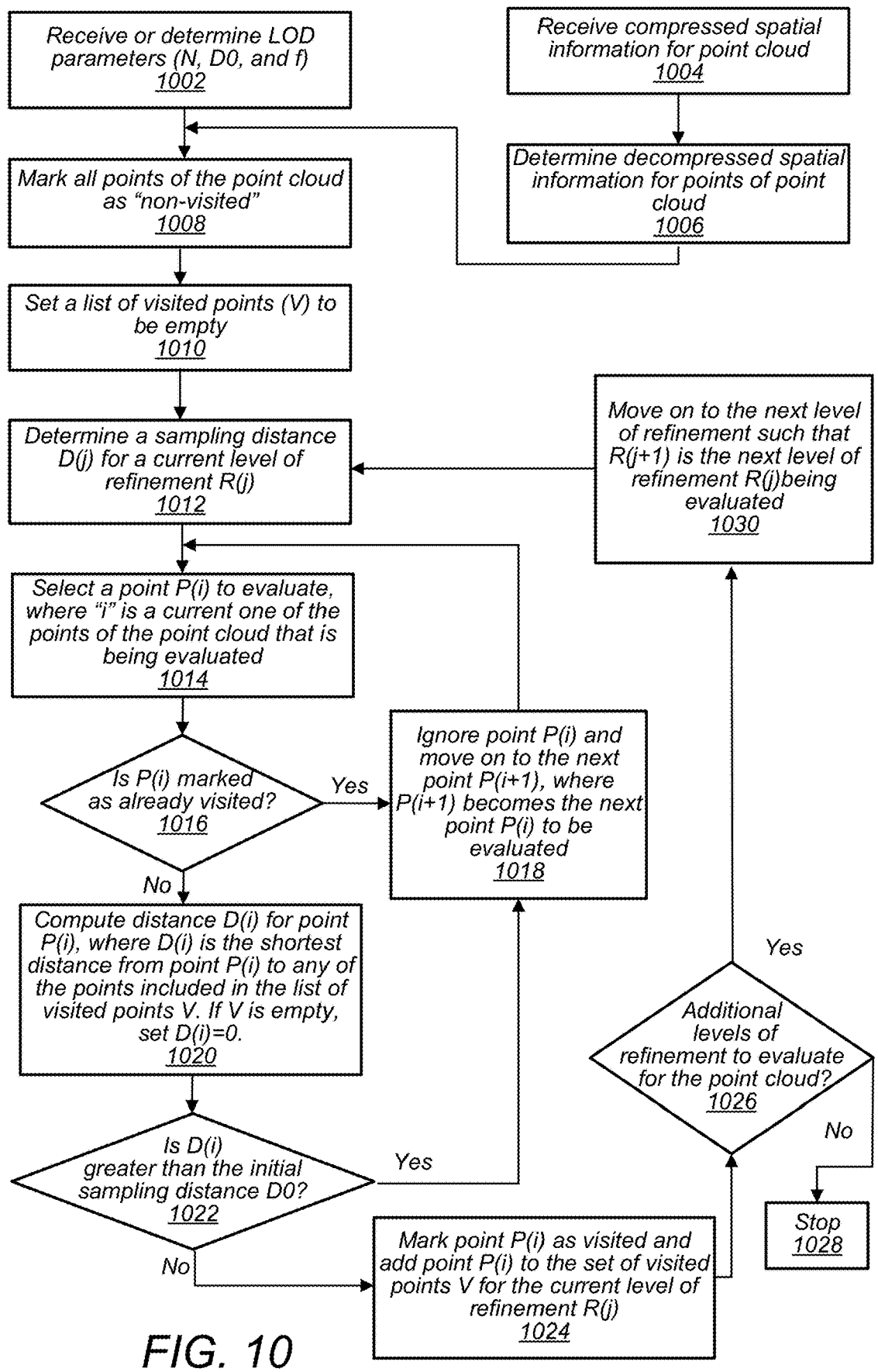
FIG. 10 illustrates an example process for determining points to be included at different refinement layers of a level of detail (LOD) structure, according to some embodiments.

FIG. 10 illustrates an example process for determining points to be included at different refinement layers of a level of detail (LOD) structure, according to some embodiments.

At 1002 an encoder (or a decoder) receives or determines level of detail parameters to use in determining the level of detail hierarchy for the point cloud. At the same time, or before or after, receiving the level of detail parameters, at 1004 the encoder (or decoder) may receive compressed spatial information for the point cloud and at 1006, the encoder (or decoder) may determine decompressed spatial information for the points of the point cloud. In embodiments that utilize lossy compression techniques for the compression of the spatial information, the compressed spatial information may be compressed at the encoder and may also be decompressed at the encoder at 1006 to generate a representative sample of the geometry information that will be encountered at a decoder. In some embodiments that utilize lossless compression of spatial information, 1004 and 1106 may be omitted on the encoder side.

At 1008 the level of detail structure generator (which may be on an encoder side or a decoder side) marks all the points of the point cloud as "non-visited points."

At 1010 the level of detail structure generator also sets a directory of visited point "V" to be empty.

At 1012 a sampling distance D(j) is determined for a current level of refinement being evaluated, R(j). If the level of refinement is the coarsest level of refinement, where j=0, the sampling distance D(j) is set to be equal to D0, e.g. the initial sampling distance, which was received or determined at 1002. If j is greater than 0, but less than N, then D(j) is set to equal to D(j−1)*f. Note that "N" is the total number of level of details that are to be determined. Also note that "f" is a sampling update distance factor which is set to be less than one (e.g. ½). Also, note that D(j−1) is the sampling distance used in the preceding level of refinement. For example, when f is ½, the sampling distance D(j−1) is cut in half for a subsequent level of refinement, such that D(j) is one half the length of D(j−1). Also, note that a level of detail (LOD(j)) is the union of a current level of refinement and all lower levels of refinement. Thus, a first level of detail (LOD(0)) may include all the points included in level of refinement R(0). A subsequent level of detail (LOD(1) may include all of the points included in the previous level of detail and additionally all the points included in the subsequent level of refinement R(1). In this way points may be added to a previous level of detail for each subsequent level of detail until a level of detail "N" is reached that includes all of the points of the point cloud.

To determine the points of the point cloud to be included in a current level of detail which is being determined, a point P(i) is selected to be evaluated at 1014, where "i" is a current one of the points of the point cloud that is being evaluated. For example if a point cloud includes a million points, "i" could range from 0 to 1,000,000.

At 1016, it is determined if the point currently being evaluated, P(i), has already been marked as a visited point. If P(i) is marked as already visited, then at 1018 P(i) is ignored and the process moves on to evaluate the next point P(i+1), which then becomes the point currently being evaluated P(i). The process then reverts back to 1014.

If it is determined at 1016, that point P(i) has not already been marked as a visited point, at 1020 a distance D(i) is computed for the point P(i), where D(i) is the shortest distance between point P(i) and any of the already visited points included in directory V. If there are not any points included in directory V, e.g. the directory V is empty, then D(i) is set to zero.

At 1022, it is determined whether the distance D(i) for point P(i) is greater than the initial sampling distance D0. If so, at 1018 point P(i) is ignored and the process moves on to the next point P(i+1) and reverts to 1014.

If point P(i) is not already marked as visited and the distance D(i), which is a minimum distance between point P(i) and the set of points included in V, is less than the initial sampling distance D0, then at 1024 point P(i) is marked as visited and added to a set of visited points V for the current level of refinement R(j).

At 1026, it is determined if there are additional levels of refinement to determine for the point cloud. For example, if j<N, then there are additional levels of refinement to determine, where N is a LOD parameter that may be communicated between an encoder and decoder. If there are not additional levels of refinement to determine, the process stops at 1028. If there are additional levels of refinement to determine the process moves on to the next level of refinement at 1030, and then proceeds to evaluate the point cloud for the next level of refinement at 1012.

Once the levels of refinement have been determined, the levels of refinement may be used generate the LOD structure, where each subsequent LOD level includes all the points of a previous LOD level plus any points determined to be included in an additional level of refinement. Because the process for determining an LOD structure is known by the encoder and decoder, a decoder, given the same LOD parameters as used at an encoder, can recreate the same LOD structure at the decoder as was generated at the encoder.

Example Level of Detail Hierarchy

FIG. 11A illustrates an example LOD, according to some embodiments. Note that the LOD generation process may generate uniformly sampled approximations (or levels of detail) of the original point cloud, that get refined as more and more points are included. Such a feature makes it particularly adapted for progressive/view-dependent transmission and scalable rendering. For example, 1104 may include more detail than 1102, and 1106 may include more detail than 1104. Also, 1108 may include more detail than 1102, 1104, and 1106.

The hierarchical LOD structure may be used to build an attribute prediction strategy. For example, in some embodiments the points may be encoded in the same order as they were visited during the LOD generation phase. Attributes of each point may be predicted by using the K-nearest neighbors that have been previously encoded. In some embodiments, "K" is a parameter that may be defined by the user or may be determined by using an optimization strategy. "K" may be static or adaptive. In the latter case where "K" is adaptive, extra information describing the parameter may be included in the bit stream.

In some embodiments, different prediction strategies may be used. For example, one of the following interpolation strategies may be used, as well as combinations of the following interpolation strategies, or an encoder/decoder may adaptively switch between the different interpolation strategies. The different interpolation strategies may include interpolation strategies such as: inverse-distance interpolation, barycentric interpolation, natural neighbor interpolation, moving least squares interpolation, or other suitable interpolation techniques. For example, interpolation based prediction may be performed at an interpolation-based prediction module 908 included in a prediction/correction value evaluator of an encoder, such as prediction/correction value evaluator 206 of encoder 202. Also, interpolation based prediction may be performed at an interpolation-based prediction module 908 included in a prediction evaluator of a decoder, such as prediction evaluator 224 of decoder 220. In some embodiments, a color space may also be converted, at color space conversion module 906, prior to performing interpolation based prediction. In some embodiments, a color space conversion module 906 may be included in an encoder, such as encoder 202. In some embodiments, a decoder may further included a module to convert a converted color space, back to an original color space.

In some embodiments, quantization may further be applied to attribute information. For example quantization may performed at quantization module 910. In some embodiments, a encoder, such as encoder 202, may further include a quantization module 910. Quantization techniques employed by a quantization module 910 may include uniform quantization, uniform quantization with a dead zone, non-uniform/non-linear quantization, trellis quantization, or other suitable quantization techniques.

In some embodiments, LOD attribute compression may be used to compress dynamic point clouds as follows:
  a. Let FC be the current point cloud frame and RF be the reference point cloud.
  b. Let M be the motion field that deforms RF to take the shape of FC.
   i. M may be computed on the decoder side and in this case information may not be encoded in the bit stream.
   ii. M may be computed by the encoder and explicitly encoded in the bit stream
     1. M may be encoded by applying a hierarchical compression technique as described herein to the motion vectors associated with each point of RF (e.g. the motion of RF may be considered as an extra attribute).
     2. M may be encoded as a skeleton/skinning-based model with associated local and global transforms.
     3. M may be encoded as a motion field defined based on an octree structure, which is adaptively refined to adapt to motion field complexity.
     4. M may be described by using any suitable animation technique such as key-frame-based animations, morphing techniques, free-form deformations, key-point-based deformation, etc.
   iii. Let RF' be the point cloud obtained after applying the motion field M to RF. The points of RF' may be then used in the attribute prediction strategy by considering not only the "K" nearest neighbor points of FC but also those of RF'.

Furthermore, attribute correction values may be determined based on comparing the interpolation-based prediction values determined at interpolation-based prediction module 908 to original non-compressed attribute values. The attribute correction values may further be quantized at quantization module 910 and the quantitated attribute correction values, encoded spatial information (output from the geometry encoder 902) and any configuration parameters used in the prediction may be encoded at arithmetic encoding module 912. In some embodiments, the arithmetic encoding module, may use a context adaptive arithmetic encoding technique. The compressed point cloud may then be provided to a decoder, such as decoder 220, and the decoder may determine similar levels of detail and perform interpolation based prediction to recreate the original point cloud based on the quantized attribute correction values, encoded spatial information (output from the geometry encoder 902) and the configuration parameters used in the prediction at the encoder.

FIG. 11B illustrates an example compressed point cloud file comprising LODs, according to some embodiments. Level of detail attribute information file 1150 includes configuration information 1152, point cloud data 1154, and level of detail point attribute correction values 1156. In some embodiments, level of detail attribute information file 1150 may be communicated in parts via multiple packets. In some embodiments, not all of the sections shown in the level of detail attribute information file 1150 may be included in each packet transmitting compressed attribute information. In some embodiments, a level of detail attribute information file, such as level of detail attribute information file 1150, may be stored in a storage device, such as a server that implements an encoder or decoder, or other computing device.

Figure 12A:
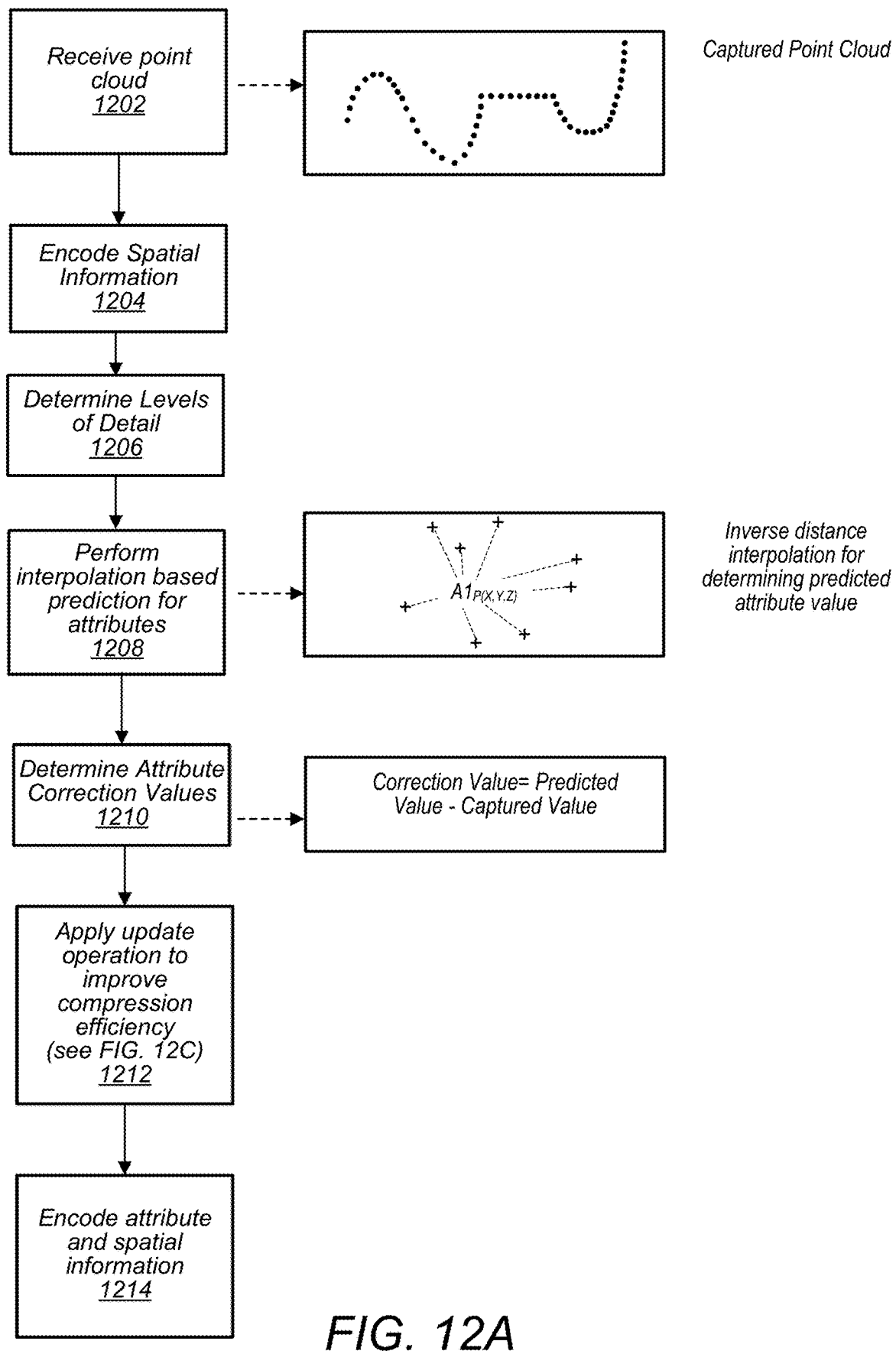
FIG. 12A illustrates a method of encoding attribute information of a point cloud, according to some embodiments.

FIG. 12A illustrates a method of encoding attribute information of a point cloud, according to some embodiments.

At 1202, a point cloud is received by an encoder. The point cloud may be captured, for example by one or more sensors, or may be generated, for example in software.

At 1204, spatial or geometry information of the point cloud is encoded as described herein. For example, the spatial information may be encoded using K-D trees, Octrees, a neighbor prediction strategy, or other suitable technique to encoded the spatial information.

At 1206, one or more level of details are generated, as described herein. For example, the levels of detail may be generated using a similar process as shown in FIG. 10. Note that in some embodiments, the spatial information encoded or compressed at 1204 may be de-coded or decompressed to generate a representative decompressed point cloud geometry that a decoder would encounter. This representative decompressed point cloud geometry may then be used to generate a LOD structure as further described in FIG. 10.

At 1208, an interpolation based prediction is performed to predict attribute values for the attributes of the points of the point cloud. At 1210, attribute correction values are determined based on comparing the predicted attribute values to original attribute values. For example, in some embodiments, an interpolation based prediction may be performed for each level of detail to determine predicted attribute values for points included in the respective levels of detail. These predicted attribute values may then be compared to attribute values of the original point cloud prior to compression to determine attribute correction values for the points of the respective levels of detail. For example, an interpolation based prediction process as described in FIG. 1B, FIGS. 4-5, and FIG. 8 may be used to determine predicted attribute values for various levels of detail. In some embodiments, attribute correction values may be determined for multiple levels of detail of a LOD structure. For example a first set of attribute correction values may be determined for points included in a first level of detail and additional sets of attribute correction values may be determined for points included in other levels of detail.

At 1212, an update operation may optionally be applied that affects the attribute correction values determined at 1210. Performance of the update operation is discussed in more detail below in FIG. 12C.

At 1214, attribute correction values, LOD parameters, encoded spatial information (output from the geometry encoder) and any configuration parameters used in the prediction are encoded, as described herein.

In some embodiments, the attribute information encoded at 1214 may include attribute information for multiple or all levels of detail of the point cloud, or may include attribute information for a single level of detail or fewer than all levels of detail of the point cloud. In some embodiments, level of detail attribute information may be sequentially encoded by an encoder. For example, an encoder may make available a first level of detail before encoding attribute information for one or more additional levels of detail.

In some embodiments, an encoder may further encode one or more configuration parameters to be sent to a decoder, such as any of the configuration parameters shown in configuration information 1152 of compressed attribute information file 1150. For example, in some embodiments, an encoder may encode a number of levels of detail that are to be encoded for a point cloud. The encoder may also encode a sampling distance update factor, wherein the sampling distance is used to determine which points are to be included in a given level of detail.

Figure 12B:
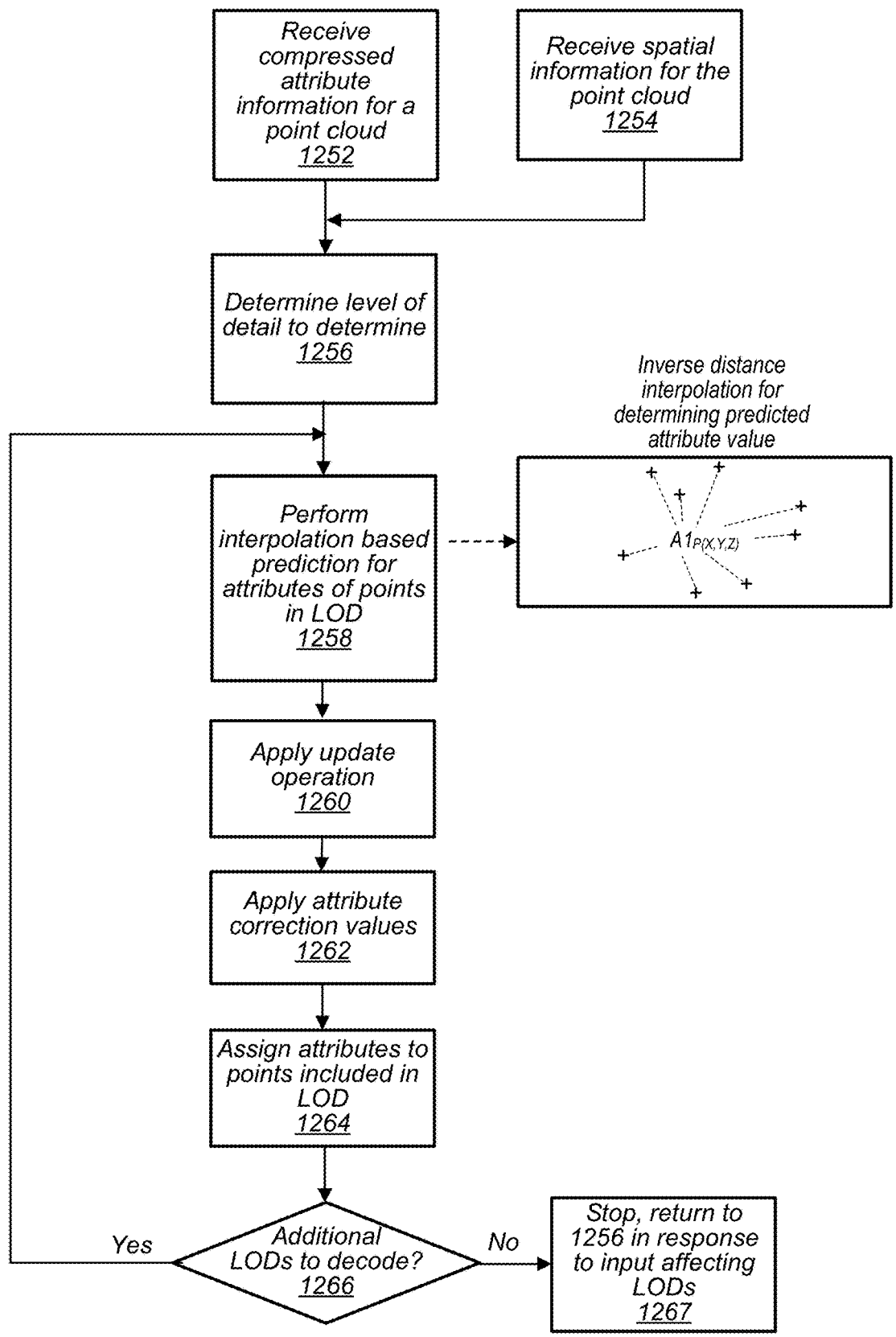
FIG. 12B illustrates a method of decoding attribute information of a point cloud, according to some embodiments.
Figure 12C:
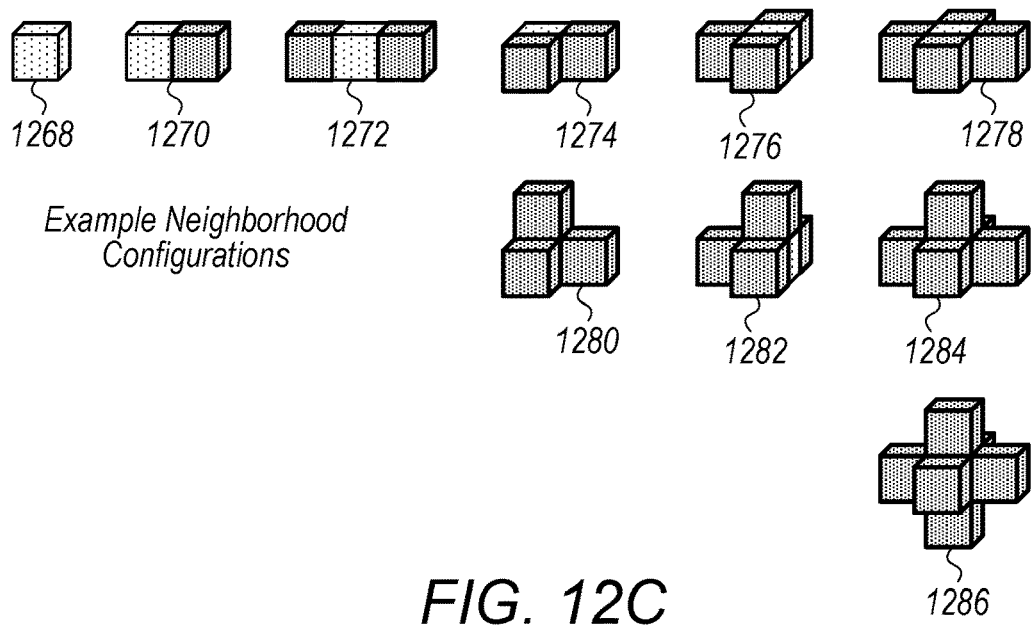
FIG. 12C illustrates example neighborhood configurations of cubes of an octree, according to some embodiments.

FIG. 12B illustrates a method of decoding attribute information of a point cloud, according to some embodiments.

At 1252, compressed attribute information for a point cloud is received at a decoder. Also, at 1254 spatial information for the point cloud is received at the decoder. In some embodiments, the spatial information may be compressed or encoded using various techniques, such as a K-D tree, Octree, neighbor prediction, etc. and the decoder may decompress and/or decode the received spatial information at 1254.

At 1256, the decoder determines which level of detail of a number of levels of detail to decompress/decode. The selected level of detail to decompress/decode may be determined based on a viewing mode of the point cloud. For example, a point cloud being viewed in a preview mode may require a lower level of detail to be determined than a point cloud being viewed in a full view mode. Also, a location of a point cloud in a view being rendered may be used to determine a level of detail to decompress/decode. For example, a point cloud may represent an object such as the coffee mug shown in FIG. 9A. If the coffee mug is in a foreground of a view being rendered a higher level of detail may be determined for the coffee mug. However, if the coffee mug is in the background of a view being rendered, a lower level of detail may be determined for the coffee mug. In some embodiments, a level of detail to determine for a point cloud may be determined based on a data budget allocated for the point cloud.

At 1258 points included in the first level of detail (or next level of detail) being determined may be determined as described herein. For the points of the level of detail being evaluated, attribute values of the points may be predicted based on an inverse distance weighted interpolation based on the k-nearest neighbors to each point being evaluated, where k may be a fixed or adjustable parameter.

Figure 12D:
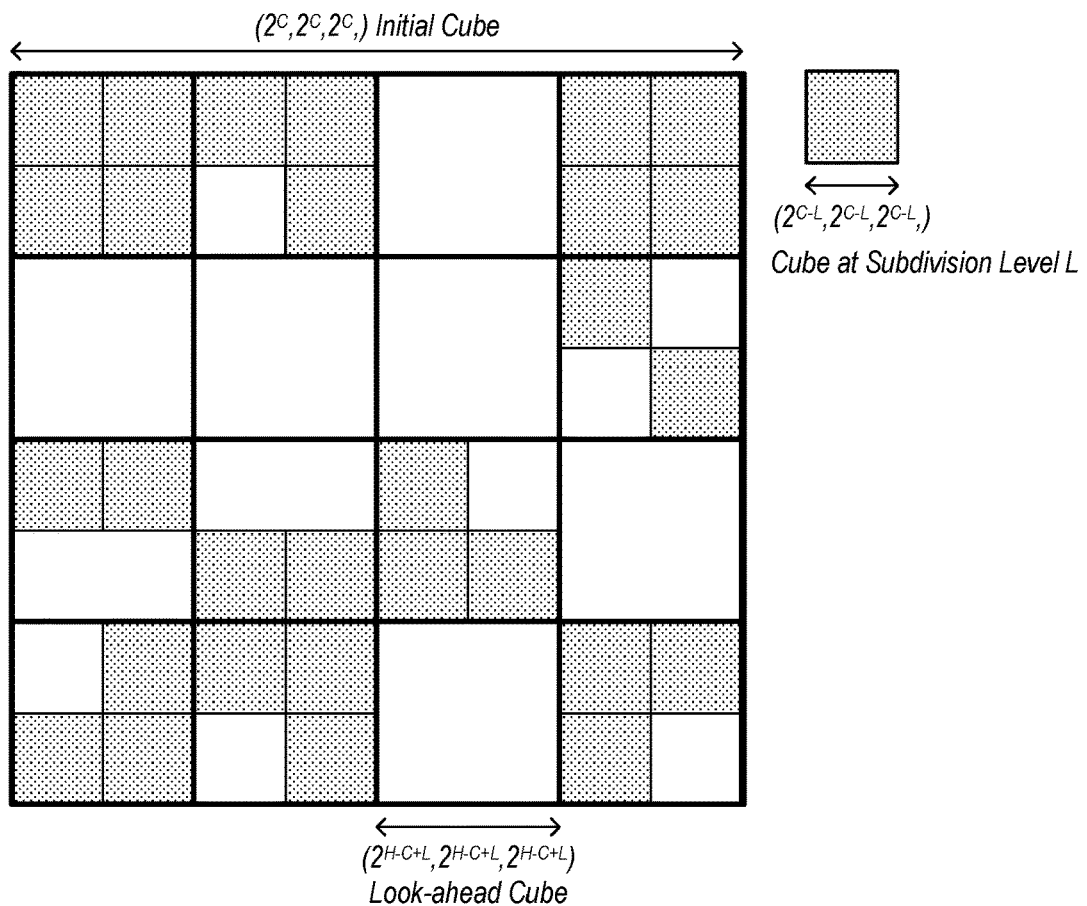
FIG. 12D illustrates an example look-ahead cube, according to some embodiments.
Figure 12E:
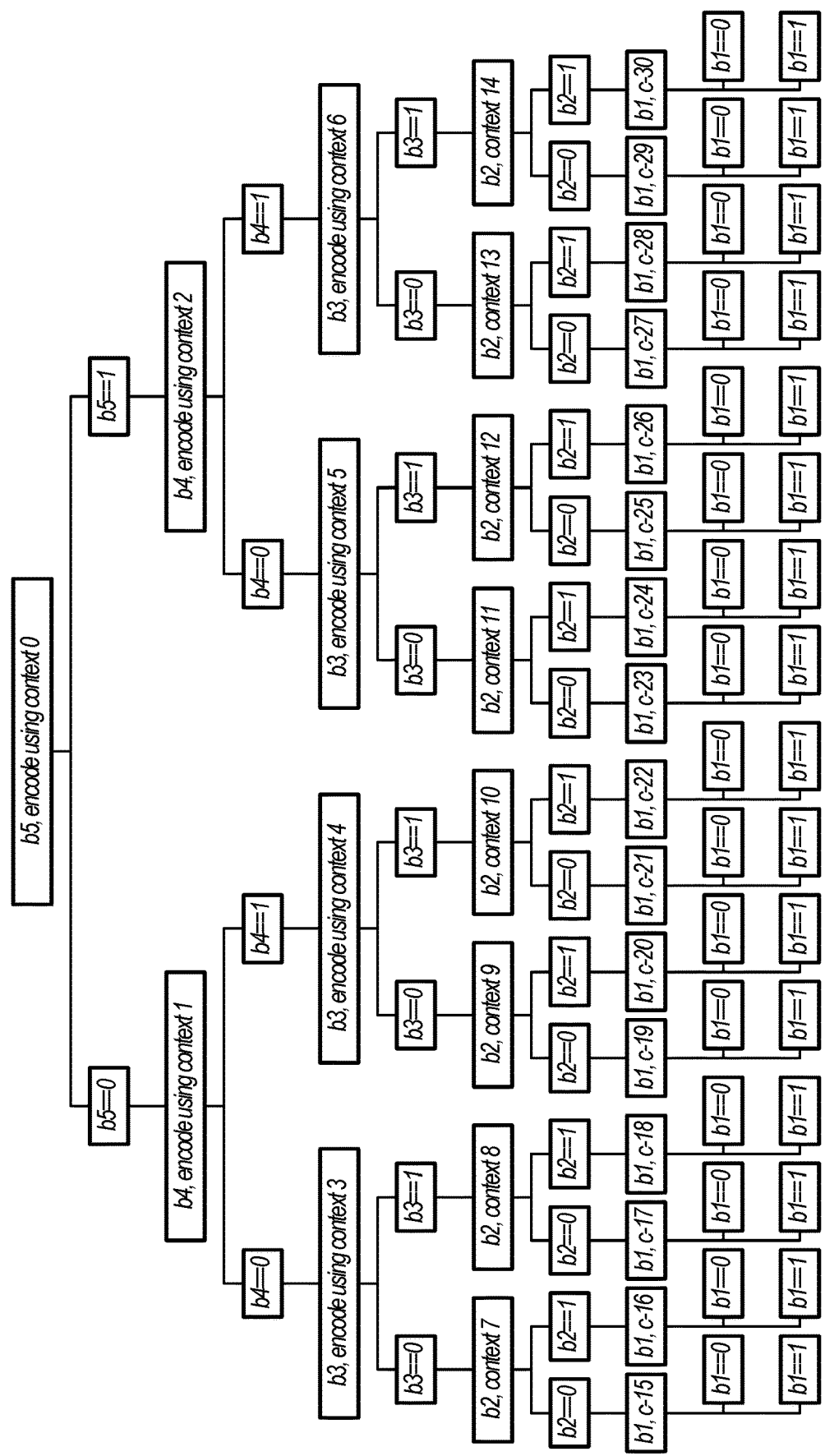
FIG. 12E illustrates, an example of 31 contexts that may be used to adaptively encode an index value of a symbol S using a binary arithmetic encoder, according to some embodiments.
Figure 12F:
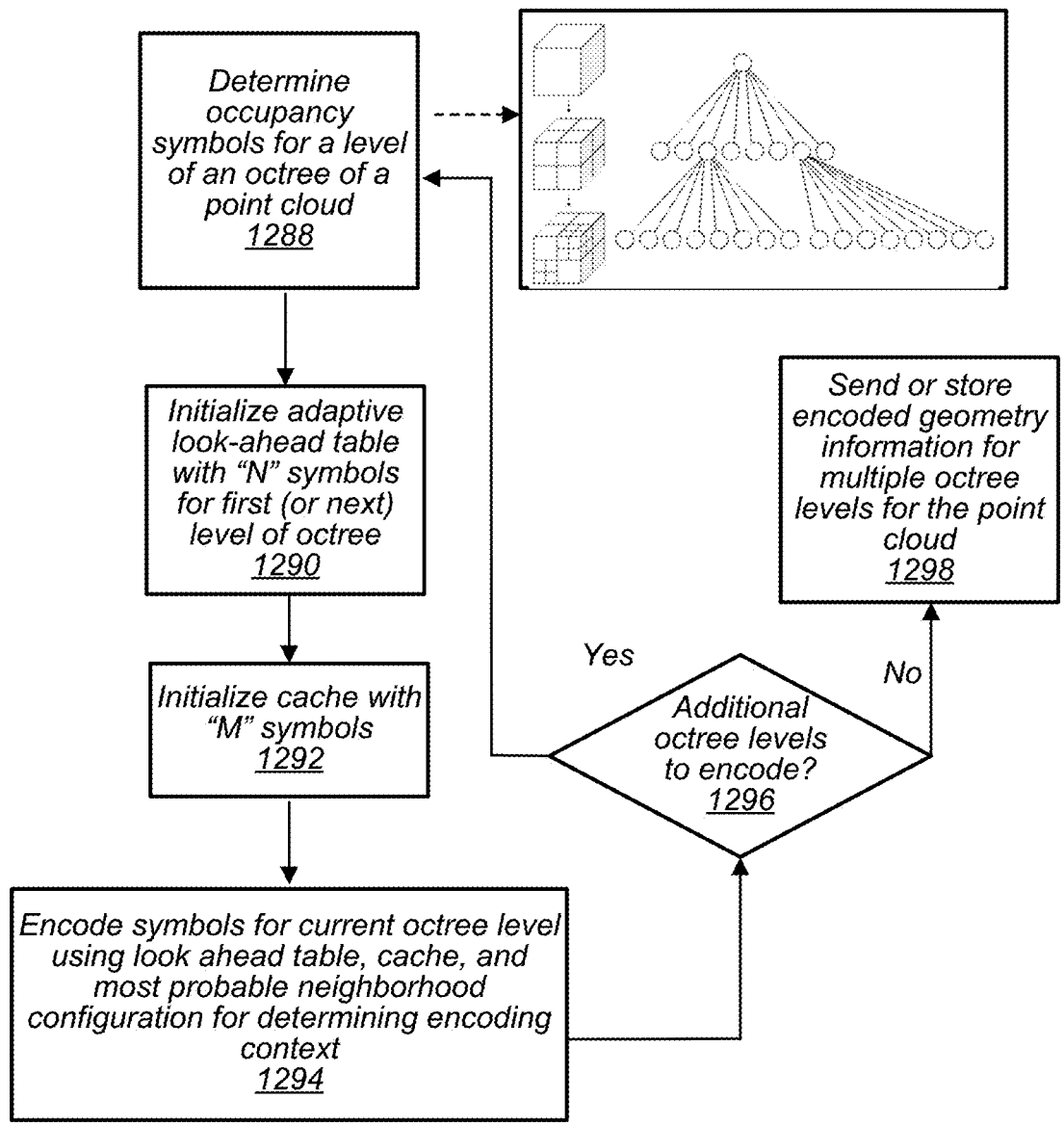
FIG. 12F illustrates an example octree compression technique using a binary arithmetic encoder, cache, and look-ahead table, according to some embodiments.

At 1260, in some embodiments, an update operation may be performed on the predicted attribute values as described in more detail in FIG. 12F.

At 1262, attribute correction values included in the compressed attribute information for the point cloud may be decoded for the current level of detail being evaluated and may be applied to correct the attribute values predicted at 1258 or the updated predicted attribute values determined at 1260.

At 1264, the corrected attribute values determined at 1262 may be assigned as attributes to the points of the first level of detail (or the current level of detail being evaluated). In some embodiments, the attribute values determined for subsequent levels of details may be assigned to points included in the subsequent levels of detail while attribute values already determined for previous levels of detail are retained by the respective points of the previous level(s) of detail. In some embodiments, new attribute values may be determined for sequential levels of detail.

In some embodiments, the spatial information received at 1254 may include spatial information for multiple or all levels of detail of the point cloud, or may include spatial information for a single level of detail or fewer than all levels of detail of the point cloud. In some embodiments, level of detail attribute information may be sequentially received by a decoder. For example, a decoder may receive a first level of detail and generate attribute values for points of the first level of detail before receiving attribute information for one or more additional levels of detail.

At 1266 it is determined if there are additional levels of detail to decode. If so, the process returns to 1258 and is repeated for the next level of detail to decode. If not the process is stopped at 1267, but may resume at 1256 in response to input affecting the number of levels of detail to determine, such as change in view of a point cloud or a zoom operation being applied to a point cloud being viewed, as a few examples of an input affecting the levels of detail to be determined.

In some embodiments the spatial information described above may be encoded and decoded via a geometry encoder and arithmetic encoder, such as geometry encoder 202 and arithmetic encoder 212 described above in regard to FIG. 2. In some embodiments, a geometry encoder, such as geometry encoder 202 may utilize an octree compression technique and arithmetic encoder 212 may be a binary arithmetic encoder as described in more detail below.

The use of a binary arithmetic encoder as described below reduces the computational complexity of encoding octree occupancy symbols as compared to a multi-symbol codec with an alphabet of 256 symbols (e.g. 8 sub-cubes per cube, and each sub-cube occupied or un-occupied 2^8=256). Also the use of context selection based on most probable neighbor configurations may reduce a search for neighbor configurations, as compared to searching all possible neighbor configurations. For example, the encoder may keep track of 10 encoding contexts which correspond to the 10 neighborhood configurations 1268, 1270, 1272, 12712, 1276, 1278, 1280, 1282, 1284, and 1286 shown in FIG. 12C as opposed to all possible neighborhood configurations.

In some embodiments, an arithmetic encoder, such as arithmetic encoder 212, may use a binary arithmetic codec to encode the 256-value occupancy symbols. This may be less complex and more hardware friendly in terms of implementation as compared to a multi-symbol arithmetic codec. Additionally, an arithmetic encoder 212 and/or geometry encoder 202 may utilizes a look-ahead procedure to compute the 6-neighbors used for arithmetic context selection, which may be less complex than a linear search and may involve a constant number of operations (as compared to a linear search which may involve varying numbers of operations). Additionally, the arithmetic encoder 212 and/or geometry encoder 202 may utilize a context selection procedure, which reduces the number of encoding contexts. In some embodiments, a binary arithmetic codec, look-ahead procedure, and context selection procedure may be implemented together or independently.

Binary Arithmetic Encoding

In some embodiments, to encode spatial information, occupancy information per cube is encoded as an 8-bit value that may have a value between 0-255. To perform efficient encoding/decoding of such non-binary values, typically a multi-symbol arithmetic encoder/decoder would be used, which is computationally complex and less hardware friendly to implement when compared to a binary arithmetic encoder/decoder. However, direct use of a conventional binary arithmetic encoder/decoder on such a value on the other hand, e.g. encoding each bit independently, may not be as efficient. However, in order, to efficiently encode the non-binary occupancy values with a binary arithmetic encoder an adaptive look up table (A-LUT), which keeps track of the N (e.g., 32) most frequent occupancy symbols, may be used along with a cache which keeps track of the last different observed M (e.g., 16) occupancy symbols.

The values for the number of last different observed occupancy symbols M to track and the number of the most frequent occupancy symbols N to track may be defined by a user, such as an engineer customizing the encoding technique for a particular application, or may be chosen based on an offline statistical analysis of encoding sessions. The choice of the values of M and N may be based on a compromise between:
Encoding efficiency,
Computational complexity, and
Memory requirements.
In some embodiments, the algorithm proceeds as follows:
The adaptive look-up table (A-LUT) is initialized with N symbols provided by the user (e.g. engineer) or computed offline based on the statistics of a similar class of point clouds.
The cache is initialized with M symbols provided by the user (e.g. engineer) or computed offline based on the statistics of a similar class of point clouds.
Every time an occupancy symbol S is encoded the following steps are applied
1. A binary information indicating whether S is in the A-LUT or not is encoded.
2. If S is in the A-LUT, the index of S in the A-LUT is encoded by using a binary arithmetic encoder
Let (b1, b2, b3, b4, b5) be the five bits of the binary representation of the index of S in the A-LUT. Let b1 be the least significant bit and b5 the most significant bit.
Three approaches as described below to encode the index of S may be used, for example by using either 31, 9, or 5 adaptive binary arithmetic contexts as shown below
31 Contexts
First encode b5 of the index of S with a first context (call it context 0), when encoding the most significant bit (the first bit to be encoded) there is not any information that can be used from the encoding of other bits, that is why the context is referred to as context zero. Then when encoding b4 (the second bit to be encoded), there are two additional contexts that may be used call them context 1 (if b5=0) and context 2 (if b5=1). When this approach is taken all the way out to b1, there are 31 resulting contexts as shown in the diagram below, context 0-30. This approach exhaustively uses each bit that is encoded to select an adaptive context for encoding the next bit. For example, see FIG. 12E.

9 Contexts

Keep in mind that the index values of the adaptive look-up table ALUT are assigned based on how frequently the symbol S has appeared. Thus the most frequent symbol S in the ALUT would have an index value of 0 meaning that all of the bits of the index value for the most frequent symbol S are zero. For example, the smaller the binary value, the more frequently the symbol has appeared. To encode nine contexts, for b4 and b5, which are the most significant bits, if they are is the index value must be comparatively large. For example if b5=1 then the index value is at least 16 or higher, or if b4=1 the index value is at least 8 or higher. So when encoding 9 contexts, the focus is placed on the first 7 index entries, for example 1-7. For these 7 index entries adaptive encoding contexts are used. However for index entries with values greater than 7 the same context is used, for example a static binary encoder. Thus, if b5=1 or b4=1, then the same context is used to encode the index value. If not, then one of the adaptive contexts 1-7 is used. Because there is a context 0 for b5, 7 adaptive contexts, and a common context for entries strictly greater than 8, there are nine total contexts. This simplifies encoding and reduces the number of contexts to be communicated as compared to using all 31 contexts as shown above.

5 contexts

To encode an index value using 5 contexts, determine if b5=1. If b5=1 then use a static binary context to encode all the bits of the index value from b4 to b1. If b5 does not equal 1, then encode b4 of the index value and see if b4 is equal to 1 or 0. If b4=1, which means the index value is higher than 8, then again use the static binary context to encode the bits b3 to b1. This reasoning then repeats, so that if b3=1, the static binary context is used to encode bits b2 to b1, and if b2=1 the static binary context is used to encode bit 1. However, if bits b5, b4, and b3 are equal to zero, then an adaptive binary context is selected to encode bit 2 and bit 1 of the index value.

3. If S is not in the A-LUT, then

A binary information indicating whether S is in the cache or not is encoded.

If S is in the cache, then the binary representation of its index is encoded by using a binary arithmetic encoder In some embodiments, the binary representation of the index is encoded by using a single static binary context to encode each bit, bit by bit. The bit values are then shifted over by one, where the least significant bit becomes the next more significant bit.

Otherwise, if S is not in the cache, then the binary representation of S is encoded by using a binary arithmetic encoder In some embodiments, the binary representation of S is encoded by using a single adaptive binary context. It is known that the index have a value between 0 and 255, which means it is encoded on 8 bits. The bits are shifted so that the least significant bit becomes the next more significant bit, and a same adaptive context is used to encode all of the remaining bits.

The symbol S is added to the cache and the oldest symbol in the cache is evicted.

4. The number of occurrences of the symbol S in A-LUT is incremented by one.

5. The list of the N most frequent symbols in the A-LUT is re-computed periodically Approach 1: If the number of symbols encoded so far reaches a user-defined threshold (e.g., 64 or 128), then the list of the N most frequent symbols in the A-LUT is re-computed.

Approach 2: Adapts the update cycle to the number of symbols encoded. The idea is to update the probabilities fast in the beginning and exponentially increase the update cycle with the number of symbols:

The update cycle updateCycle is initialized to a low number NO (e.g. 16).

Every time the number of symbols reaches the update cycle the list of the N most frequent symbols in the A-LUT is re-computed The update cycle is updated as follows: _updateCycle=min(_alpha*_updateCycle, _maxUpdateCycle)

_alpha (e.g., 5/4) and maxUpdateCycle (e.g., 1024) are two user-defined parameters, which may control the speed of the exponential growth and the maximum update cycle value.

6. At the start of each level of the octree subdivision, the occurrences of all symbols are reset to zero. The occurrences of the N most frequent symbols are set to 1.

7. When the occurrence of a symbol reaches a user-defined maximum number (e.g., maxOccurence=1024), the occurrences of all the symbols are divided by 2 to keep the occurrences within a user-defined range.

In some embodiments, a ring—buffer is used to keep track of the elements in the cache. The element to be evicted from the cache corresponds to the position index 0=(_last++) % CacheSize, where_last is a counter initialized to 0 and incremented every time a symbol is added to the cache. In some embodiments, the cache could also be implemented with an ordered list, which would guarantee that every time the oldest symbol is evicted.

2. Look-Ahead to Determine Neighbors

In some embodiments, at each level of subdivision of the octree, cubes of the same size are subdivided and an occupancy code for each one is encoded.

For subdivision level 0, there may be a single cube of ($2^C$, $2^C$, $2^C$) without any neighbors.

For subdivision level 1, there may be up to 8 cubes of dimension ($2^{C-1}$, $2^{C-1}$, $2^{C-1}$) each.

. . .

For subdivision level L, there may be up to $8^L$ cubes of dimension ($2^{C-L}$, $2^{C-L}$, $2^{C-L}$) each.

In some embodiments, at each level L, a set of non-overlapping look-ahead cubes of dimension (2H-C+L, 2H-C+L, 2H-C+L) each may be defined, as shown in FIG. 12D. Note that the look-ahead cube can fit 23×H cubes of size (2C-L, 2C-L, 2C-L).

At each level L, the cubes contained in each look-ahead cube are encoded without referencing cubes in other look-ahead cubes.

During the look-ahead phase, the cubes of dimension ($2^{C-L}$, $2^{C-L}$, $2^{C-L}$) in the current look-ahead cube are extracted from the FIFO and a look-up table that describes for each ($2^{C-L}$, $2^{C-L}$, $2^{C-L}$) region of the current look-ahead cube whether it is occupied or empty is filled.

Once, the look-up table is filled, the encode phase for the extracted cubes begins. Here, the occupancy information for the 6 neighbors is obtained by fetching the information directly from the look up table.

For cubes on the boundary of the look-ahead cube, the neighbors located outside are assumed to be empty. Another alternative could consist in filling the values of the outside neighbors based on extrapolation methods.

Efficient implementation could be achieved by
- Storing the occupancy information of each group of 8 neighboring ($2^{C-L}$, $2^{C-L}$, $2^{C-L}$) regions on one byte
- Storing the occupancy bytes in a Z-order to maximize memory cache hits 3. Context Selection In some embodiments, to reduce the number of encoding contexts (NC) to a lower number of contexts (e.g., reduced from 10 to 6), a separate context is assigned to each of the (NC−1) most probable neighborhood configurations, and the contexts corresponding to the least probable neighborhood configurations are made to share the same context(s). This is done as follows:

Before starting the encoding process, initialize the occurrences of the 10 neighborhood configurations (e.g. the 10 configurations shown in FIG. 12C):
- Set all 10 occurrences to 0
- Set the occurrences based on offline/online statistics or based on user-provided information.

At the beginning of each subdivision level of the octree:
- Determine the (NC−1) most probable neighborhood configurations based on the statistics collected during the encoding of the previous subdivision level.
- Compute a look-up table NLUT, which maps the indexes of the (NC−1) most probable neighborhood configurations to the numbers 0, 1, . . . , (NC−2) and maps the indexes of the remaining configurations to NC−1.
- Initialize the occurrences of the 10 neighborhood configurations to 0.

During the encoding:
- Increment the occurrence of a neighborhood configuration by one each time such a configuration is encountered.
- Use the look-up table NLUT[ ] to determine the context to use to encode the current occupancy values based on the neighborhood configuration index.

FIG. 12F illustrates an example octree compression technique using a binary arithmetic encoder, cache, and look-ahead table, according to some embodiments. For example, FIG. 12F illustrates an example of the processes as described above. At 1288 occupancy symbols for a level of an octree of a point cloud are determined. At 1290 an adaptive look-ahead table with "N" symbols is initialized. At 1292, a cache with "M" symbols is initialized. At 1294, symbols for the current octree level are encoded using the techniques described above. At 1296, it is determined if additional octree levels are to be encoded. If so, the process continues at 1288 for the next octree level. If not, the process ends at 1298 and the encoded spatial information for the point cloud is made available for use, such as being sent to a recipient or being stored.

Lifting Schemes for Level of Detail Compression and Decompression

In some embodiments, lifting schemes may be applied to point clouds. For example, as described below, a lifting scheme may be applied to irregular points. This is in contrast to other types of lifting schemes that may be applied to images having regular points in a plane. In a lifting scheme, for points in a current level of detail nearest points in a lower level of detail are found. These nearest points in the lower level of detail are used to predict attribute values for points in a higher level of detail. Conceptually, a graph could be made showing how points in lower levels of detail are used to determine attribute values of points in higher levels of detail. In such a conceptual view, edges could be assigned to the graph between levels of detail, wherein there is an edge between a point in a higher level of detail and each point in the lower level of detail that forms a basis for the prediction of the attribute of the point at the higher level of detail. As described in more detail below, a weight could be assigned to each of these edges indicating a relative influence. The weight may represent an influence attribute value of the point in the lower level of detail has on the attribute value of the points in the higher level of detail. Also, multiple edges may make a path through the levels of detail and weights may be assigned to the paths. In some embodiments, the influence of a path may be defined by the sum of the weights of the edges of the path. For example, equation 1 below represents such a weighting of a path.

In a lifting scheme, low influence points may be highly quantized and high influence points may be quantized less. In some embodiments, a balance may be reached between quality of a reconstructed point cloud and efficiency, wherein more quantization increases compression efficiency and less quantization increases quality. In some embodiments, all paths may not be evaluated. For example, some paths with little influence may not be evaluated. Also, an update operator may smooth residual differences, e.g. attribute correction values, in order to increase compression efficiency while taking into account relative influence or importance of points when smoothing the residual differences.

Figure 13A:
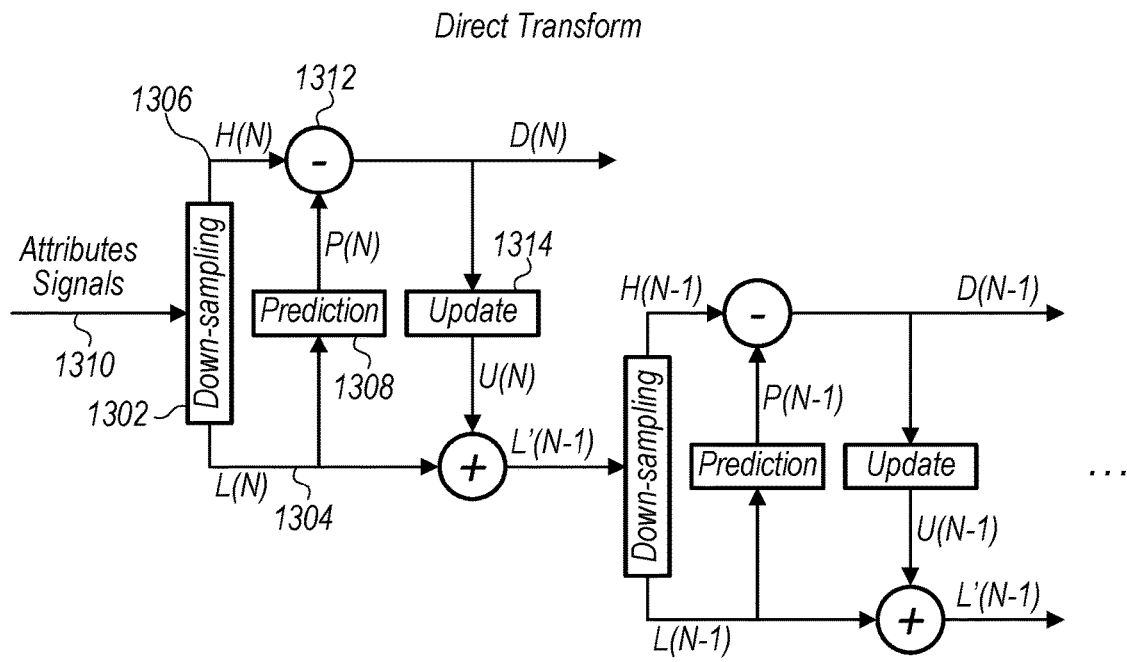
FIG. 13A illustrates a direct transformation that may be applied at an encoder to encode attribute information of a point could, according to some embodiments.

FIG. 13A illustrates a direct transformation that may be applied at an encoder to encode attribute information of a point could, according to some embodiments.

In some embodiments, an encoder may utilize a direct transformation as illustrated in FIG. 13A in order to determine attribute correction values that are encoded as part of a compressed point cloud. For example, in some embodiments a direct transformation may be utilized to determine attribute values as described in FIG. 12A at 1208 and to apply an update operation as described in FIG. 12A at 1212.

In some embodiments, a direct transform may receive attribute signals for attributes associated with points of a point cloud that is to be compressed. For example, the attributes may include color values, such as RGB colors, or other attribute values of points in a point cloud that is to be compressed. The geometry of the points of the point cloud to be compressed may also be known by the direct transform that receives the attribute signals. At 1302, the direct transform may include a split operator that splits the attribute signals 1310 for a first (or next) level of detail. For example, for a particular level of detail, such as LOD(N), comprising X number of points, a sub-sample of the attributes of the points, e.g. a sample comprising Y points, may comprise attribute values for a smaller number of points than X. Said another way, the split operator may take as an input attributes associated with a particular level of detail and generate a low resolution sample 1304 and a high resolution sample 1306. It should be noted that a LOD structure may be partitioned into refinement levels, wherein subsequent levels of refinement include attributes for more points than underlying levels of refinement. A particular level of detail as described below is obtained by taking the union of all lower level of detail refinements. For example, the level of detail j is obtained by taking the union of all refinement levels R(0), R(1), . . . , R(j). It should also be noted, as described above, that a compressed point cloud may have a total number of levels of detail N, wherein R(0) is the least refinement level of detail and R(N) is the highest refinement level of detail for the compressed point cloud.

At 1308, a prediction for the attribute values of the points not included in the low resolution sample 1304 is predicted based on the points included in the low resolution sample. For example, based on an inverse distance interpolation prediction technique or any of the other prediction techniques described above. At 1312, a difference between the predicted attribute values for the points left out of low resolution sample 1304 is compared to the actual attribute values of the points left out of the low resolution sample 1304. The comparison determines differences, for respective points, between a predicted attribute value and an actual attribute value. These differences (D(N)) are then encoded as attribute correction values for the attributes of the points included in the particular level of detail that are not encoded in the low resolution sample. For example, for the highest level of detail N, the attribute correction values D(N) may be encoded such that attribute values not included in a low resolution sample of LOD(N) may be predicted and corrected using the attribute correction values D(N). Because at the highest level of detail, the attribute correction values are not used to determine attribute values of other even higher levels of detail (because for the highest level of detail, N, there are not any higher levels of detail), an update operation to account for relative importance of these attribute correction values may not be performed. As such, the differences D(N) may be used to encode attribute correction values for LOD(N).

In addition, the direct transform may be applied for subsequent lower levels of detail, such as LOD(N-1). However, before applying the direct transform for the subsequent level of detail, an update operation may be performed in order to determine the relative importance of attribute values for points of the lower level of detail on attribute values of one or more upper levels of detail. For example, update operation 1314 may determine relative importances of attribute values of attributes for points included in lower levels of detail on higher levels of detail, such as for attributes of points included in L(N). The update operator may also smooth the attributes values to improve compression efficiency of attribute correction values for subsequent levels of detail taking into account the relative importance of the respective attribute values, wherein the smoothing operation is performed such that attribute values that have a larger impact on subsequent levels of detail are modified less than points that have a lesser impact on subsequent levels of detail. Several approaches for performing the update operation are described in more detail below. The updated lower resolution sample of level of detail L'(N) is then fed to another split operator and the process repeats for a subsequent level of detail, LOD(N-1). Note that attribute signals for the lower level of detail, LOD(N-1) may also be received at the second (or subsequent) split operator.

Figure 13B:
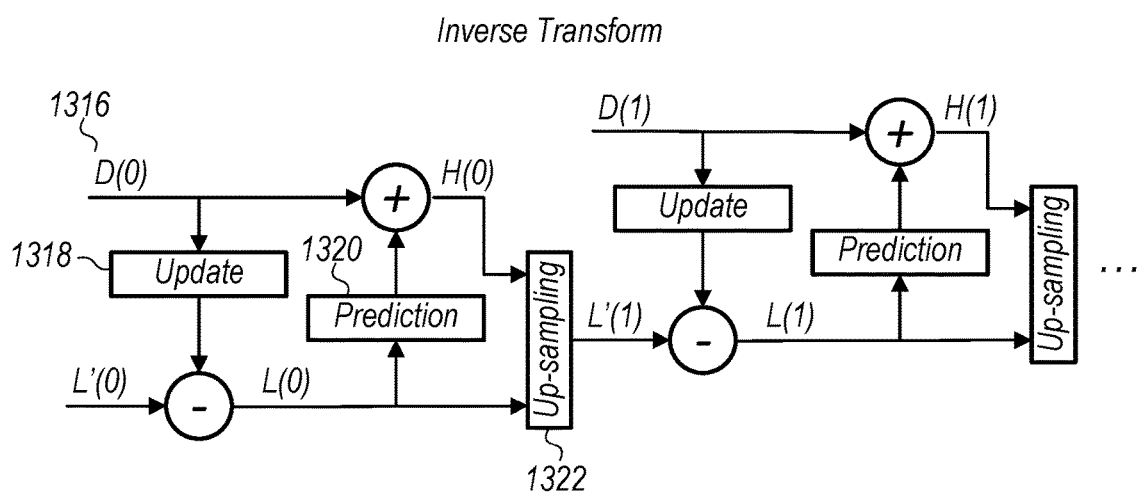
FIG. 13B illustrates an inverse transformation that may be applied at a decoder to decode attribute information of a point cloud, according to some embodiments.

FIG. 13B illustrates an inverse transformation that may be applied at a decoder to decode attribute information of a point cloud, according to some embodiments.

In some embodiments, a decoder may utilize an inverse transformation process as shown in FIG. 13B to reconstruct a point cloud from a compressed point cloud. For example, in some embodiments, performing prediction as described in FIG. 12B at 1258, applying an update operator as described in FIG. 12B at 1260, applying attribute correction values as described in FIG. 12B at 1262 and assigning attributes to points in a level of detail as described in FIG. 12B at 1264, may be performed according to an inverse transformation process as described in FIG. 13B.

In some embodiments, an inverse transformation process may receive an updated low level resolution sample L'(0) for a lowest level of detail of a LOD structure. The inverse transformation process may also receive attribute correction values for points not included in the updated low resolution sample L' (0). For example, for a particular LOD, L'(0) may include a sub-sampling of the points included in the LOD and a prediction technique may be used to determine other points of the LOD, such as would be included in a high resolution sample of the LOD. The attribute correction values may be received as indicated at 1306, e.g. D(0). At 1318 an update operation may be performed to account for the smoothing of the attribute correction values performed at the encoder. For example, update operation 1318 may "undo" the update operation that was performed at 1314, wherein the update operation performed at 1314 was performed to improve compression efficiency by smoothing the attribute values taking into account relative importance of the attribute values. The update operation may be applied to the updated low resolution sample L'(0) to generate an "un-smoothed" or non-updated low resolution sample, L(0). The low resolution sample L(0) may be used by a prediction technique at 1320 to determine attribute values of points not included in the low resolution sample. The predicted attribute values may be corrected using the attribute correction values, D(0), to determine attribute values for points of a high resolution sample of the LOD(0). The low resolution sample and the high resolution sample may be combined at merge operator 1322, and a new updated low resolution sample for a next level of detail L' (1) may be determined. A similar process may be repeated for the next level of detail LOD(1) as was described for LOD(0). In some embodiments, an encoder as described in FIG. 13A and a decoder as described in FIG. 13B may repeat their respective processes for N levels of detail of a point cloud.

More detailed example definitions of LODs and methods to determine update operations are described below.

In some embodiments, LODs are defined as follows:
LOD(0)=R(0)
LOD(1)=LOD(0) U R(1)
. . .
LOD(j)=LOD(j-1) U R(j)
. . .
LOD(N+1)=LOD(N) U R(N)=entire point cloud In some embodiments, let A be a set of attributes associated with a point cloud. More precisely, let A(P) be the scalar/vector attribute associated with the point P of the point cloud. An example of attribute would be color described by RGB values.

Let L(j) be the set of attributes associated with LOD(j) and H(j) those associated with R(j). Based on the definition of level of details LOD(j), L(j) and H(j) verify the following properties:

L(N+1)=A and H(N+1)=
L(j)=L(j−1) ∪ H(j)
L(j) and H(j) are disjointed.

In some embodiments, a split operator, such as split operator 1302, takes as input L(j+1) and generates two outputs: (1) the low resolution samples L(j) and (2) the high resolution samples H(j).

In some embodiments, a merge operator, such as merge operator 1322, takes as input L(j) and H(j) and produces L(j+1).

As described in more detail above, a prediction operator may be defined on top of an LOD structure. Let (P(ij))_i be the set points of LOD(j) and (Q(ij))_i those belonging to R(j) and let (A(P(ij)))_i and (A(Q(ij)))_i be the attribute values associated with LOD(j) and R(j), respectively.

In some embodiments, a prediction operator predicts the attribute value A(Q(i,j)) by using the attribute values of its k nearest neighbors in LOD(j−1), denoted ∇(Q(i,j)):

$$Pred(Q(i, j)) = \sum_{P \in \nabla(Q(i,j))} \alpha(P, Q(i, j)) A(P)$$

where α(P, Q(i,j)) are the interpolation weights. For instance, an inverse distance weighted interpolation strategy may be exploited to compute the interpolation weights.

The prediction residuals, e.g. attribute correction values, D (Q(i,j)) are defined as follows:

$$D(Q(i,j)) = A(Q(i,j)) - Pred(Q(i,j))$$

Note that the prediction hierarchy could be described by an oriented graph G defined as follows:

Every point Q in point cloud corresponds to a vertex V(Q) of graph G.
Two vertices of the graph G, V(P) and V(Q), are connected by an edge E(P, Q), if there exist i and j such that Q=Q(i,j) and P∈∇(Q(i,j))
The edge E(Q, P), has weight α(P, Q(i,j)).

In such a prediction strategy as described above, points in lower levels of detail are more influential since they are used more often for prediction.

Let w(P) be the influence weight associated with a point P. w(P) could be defined in various ways.

Approach 1
Two vertices V(P) and V(Q) of G are said to be connected if there is a path x=(E(1), E(2), . . . , E(s)) of edges of G that connects them. The weight w(x) of the path x is defined, as follows:

$$w(x) = \prod_{s=1}^{s} \alpha(E(s))$$

Let X(P) be the set of paths having P as destination. w(P) is defined as follows:

$$w(P) = 1 + \Sigma_{x \in X(P)} (w(x))^2 \quad [EQ. 1]$$

The previous definition could be interpreted as follows. Suppose that the attribute A(P) is modified by an amount ∈, then all the attributes associated with points connected to P are perturbed. Sum of Squared Errors associated with such perturbation, denoted SSE(P,∈) is given by:

$$SSE(P,\in) = w(P)\in^2$$

Approach 2
Computing the influence weights as described previously may be computationally complex, because all the paths need to be evaluated. However, since the weights α(E(s)) are usually normalized to be between 0 and 1, the weight w(x) of a path x decays rapidly with the number of its edges. Therefore, long paths could be ignored without significantly impacting the final influence weight to be computed.

Based on the previous property, the definition in [EQ. 1] may be modified to only consider paths with a limited length or to discard paths with weights known to be lower that a user-defined threshold. This threshold could be fixed and known at both the encoder and decoder, or could be explicitly signaled at or predefined for different stages of the encoding process, e.g. once for every frame, LOD, or even after a certain number of signaled points.

Approach 3
w(P) could be approximated by the following recursive procedure:
Set w(P)=1 for all points
Traverse the points according to the inverse of the order defined by the LOD structure
For every point Q(i,j), update the weights of its neighbors P∈∇(Q(i,j)) as follows:

$$w(P) \leftarrow w(P) + w(Q(i,j),j)\{\alpha(P,Q(i,j))\}^\gamma$$

where γ is a parameter usually set to 1 or 2.

Approach 4
w(P) could be approximated by the following recursive procedure:
Set w(P)=1 for all points
Traverse the points according to the inverse of the order defined by the LOD structure
For every point Q(i,j), update the weights of its neighbors P∈∇(Q(i,j)) as follows:

$$w(P) \leftarrow w(P) + w(Q(i,j),j)f\{\alpha(P,Q(i,j))\}$$

where f(x) is some function with resulting values in the range of [0, 1].

In some embodiments, an update operator, such as update operator 1314 or 1318, uses the prediction residuals D(Q(i, j)) to update the attribute values of LOD(j). The update operator could be defined in different ways, such as:

Approach 1
1. Let Δ(P) be the set of points Q(i,j) such that P∈∇(Q(i,j)).
2. The update operation for P is defined as follows:

$$Update(P) = \frac{\sum_{Q \in \Delta(P)} [\{\alpha(P, Q)\}^\gamma \times w(Q) \times D(Q)]}{\sum_{Q \in \Delta(P)} [\{\alpha(P, Q)\}^\gamma \times w(Q)]}$$

where γ is a parameter usually set to 1 or 2.

Approach 2
1. Let Δ(P) be the set of points Q(i,j) such that P∈☐(Q(i,j)).
2. The update operation for P is defined as follows:

$$Update(P) = \frac{\sum_{Q \in \Delta(P)} [g\{\alpha(P, Q)\} \times w(Q)D(Q)]}{\sum_{Q \in \Delta(P)} [g\{\alpha(P, Q)\} \times w(Q)]}$$

where g(x) is some function with resulting values in the range of [0, 1].

Approach 3
Compute Update(P) iteratively as follows:
1. Initially set Update(P)=0
2. Traverse the points according to the inverse of the order defined by the LOD structure
3. For every point Q(i,j), compute the local updates (u(1), u(2), ..., u(k)) associated with its neighbors ∇(Q(i,j))={P(1), P(2), ..., P(k)} as the solution to the following minimization problem:

$(u(1),u(2),\ldots,u(k))=\text{argmin}\{\Sigma_{r=1}^{k}(u(r))^2+(D(Q(i,j))-\Sigma_{r=1}^{k}\alpha(P(r),Q(i,j))u(k))^2\}$ 4. Update Update(P(r)):

$Update(P(r)) \leftarrow Update(P(r))+u(r)$

Approach 4
Compute Update(P) iteratively as follows:
1. Initially set Update(P)=0
2. Traverse the points according to the inverse of the order defined by the LOD structure
3. For every point Q(i,j), compute the local updates (u(1), u(2), ..., u(k)) associated with its neighbors ∇(Q(i,j))={P(1), P(2), ..., P(k)} as the solution to the following minimization problem:

$(u(1),u(2),\ldots,u(k))=\text{argmin}\{h(u(1),\ldots,u(k),D(i,j)))\}$

Where h can be any function.
4. Update Update(P(r)):

$Update(P(r)) \leftarrow Update(P(r))+u(r)$

In some embodiments, when leveraging a lifting scheme as described above, a quantization step may be applied to computed wavelet coefficients. Such a process may introduce noise and a quality of a reconstructed point cloud may depend on the quantization step chosen. Furthermore, as discussed above, perturbing the attributes of points in lower LODs may have more influence on the quality of the reconstructed point cloud than perturbing attributes of points in higher LODs.

In some embodiments, the influence weights computed as described above may further be leveraged during the transform process in order to guide the quantization process. For example, the coefficients associated with a point P may be multiplied with a factor of $\{w(P)\}^\beta$, where $\beta$ is a parameter usually set to $\beta=0.5$. An inverse scaling process by the same factor is applied after inverse quantization on the decoder side.

In some embodiments, the values of the parameters could be fixed for the entire point cloud and known at both the encoder and decoder, or could be explicitly signaled at or predefined for different stages of the encoding process, e.g. once for every point cloud frame, LOD, or even after a certain number of signaled points.

In some embodiments, a hardware-friendly implementation of the lifting scheme described above may leverage a fixed-point representation of the weights and lookup tables for the non-linear operations.

In some embodiments, a lifting scheme as described herein may be leveraged for other applications in addition to compression, such as de-noising/filtering, watermarking, segmentation/detection, as well as various other applications.

In some embodiments, a decoder may employ a complimentary process as described above to decode a compressed point cloud compressed using an octree compression technique and binary arithmetic encoder as described above.

In some embodiments, the lifting scheme as described above may further implement a bottom-up approach to building the levels of detail (LOD). For example, instead of determining predicted values for points and then assigning the points to different levels of detail, the predicted values may be determined while determining which points are to be included in which level of detail. Also, in some embodiments, residual values may be determined by comparing the predicted values to the actual values of the original point could. This too may be performed while determining which points are to be included in which levels of detail. Also, in some embodiments, an approximate nearest neighbor search may be used instead of an exact nearest neighbor search to accelerate level of detail creation and prediction calculations. In some embodiments, a binary/arithmetic encoder/decoder may be used to compress/decompress quantized computed wavelet coefficients.

As discussed above, a bottom-up approach may build levels of detail (LODs) and compute predicted attribute values simultaneously. In some embodiments, such an approach may proceed as follows:

Let $(P_i)_{i=1 \ldots N}$ be the set of positions associated with the point cloud points and let $(M_i)_{i=1 \ldots N}$ be the Morton codes associated with $(P_i)_{i=1 \ldots N}$. Let $D_0$ and $\rho$ be the two user-defined parameters specifying the initial sampling distance and the distance ratio between LODs, respectively. A Morton code may be used to represent multi-dimensional data in one dimension, wherein a "Z-Order function" is applied to the multidimensional data to result in the one dimensional representation. Note that $\rho > 1$ First the points are sorted according to their associated Morton codes in an ascending order. Let I be the array of point indexes ordered according to this process.

The algorithm proceeds iteratively. At each iteration k, the points belonging to the LOD k are extracted and their predictors are built starting from k=0 until all the points are assigned to an LOD.

The sampling distance D is initialized with $D=D_0$

For each iteration k, where k=0 ... Number of LODs
Let L(k) be the set of indexes of the points belonging to k-th LOD and O(k) the set of points belonging to LODs higher than k. L(k) and O(k) are computed as follows.

First, O(k) and L(k) are initialized
if k=0, L(k)←{ }. Otherwise, L(k)←L(k−1)
O(k)←{ }

The point indexes stored in the array 1 are traversed in order. Each time an index i is selected and its distance (e.g., Euclidean or other distance) to the most recent SR1 points added to O(k) is computed. SR1 is a user-defined parameter that controls the accuracy of the nearest neighbor search. For instance, SR1 could be chosen as 8 or 16 or 64, etc.

The smaller the value of SR1 the lower the computational complexity and the accuracy of the nearest neighbor search. The parameter SR1 is included in the bit stream. If any of the SR1 distances is lower than D, then i is appended to the array L(k). Otherwise, i is appended to the array O(k).

The parameter SR1 could be changed adaptively based on the LOD or/and the number of points traversed.

In some embodiments, instead of computing an approximate nearest neighbor, an exact nearest neighbor search technique may be applied.

In some embodiments, the exact and approximate neighbor search methods could be combined. In particular, depending on the LOD and/or the number of points in I, the method could switch between the exact and approximate search method. Other criteria, may include the point cloud density, the distance between the current point and the previous one, or any other criteria related to the point cloud distribution.

This process is iterated until all the indexes in I are traversed.

At this stage, L(k) and O(k) are computed and will be used in the next steps to build the predictors associated with the points of L(k).

More precisely, let R(k)=L(k) \ L(k−1) (where \ is the difference operator) be the set of points that need to be added to LOD(k−1) to get LOD(k). For each point i in R(k), we would like to find the h-nearest neighbors (h is user-defined parameters that controls the maximum number of neighbors used for prediction) of i in O(k) and compute the prediction weights ($\alpha_j$(i))$_{j=1}$ ... h associated with i. The algorithm proceeds as follows.

Initialize a counter j=0

For each point i in R(k)

Let $M_i$ be the Morton code associated with i and let $M_j$ be the Morton code associated with j-th element of the array O(k)

While ($M_i \geq M_j$ and j<SizeOf(O(k))), incrementing the counter j by one (j j+1)

Compute the distances of $M_i$ to the points associated with the indexes of O(k) that are in the range [j−SR2, j+SR2] of the array and keep track of the h-nearest neighbors ($n_1$, $n_2$, ..., $n_h$) and their associated squared distances($d_{n_1}^2$(i), $d_{n_2}^2$(i), ..., $d_{n_h}^2$(i) SR2 is a user-defined parameter that controls the accuracy of the nearest neighbor search. Possible values for SR2 are 8, 16, 32, and 64. The smaller the value of SR2 the lower the computational complexity and the accuracy of the nearest neighbor search. The parameter SR2 is included in the bit stream. The computation of the prediction weights used for attribute prediction may be the same as described above.

The parameter SR2 could be changed adaptively based on the LOD or/and the number of points traversed.

In some embodiments, instead of computing an approximate nearest neighbor, an exact nearest neighbor search technique may be used.

In some embodiments, the exact and approximate neighbor search methods could be combined. In particular, depending on the LOD and/or the number of points in I, the method could switch between the exact and approximate search method. Other criteria, may include the point cloud density, the distance between the current point and the previous one, or any other criteria related to the point cloud distribution.

If the distance between the current point and the last processed point is lower than a threshold, use the neighbors of the last point as an initial guess and search around them. The threshold could be adaptively chosen based on similar criteria as those described above. The threshold could be signaled in the bit stream or known to both encoder and decoder.

The previous idea could be generalized to n=1, 2, 3, 4 ... last points

Exclude points with a distance higher that a user-defined threshold. The threshold could be adaptively chosen based on similar criteria as those described above. The threshold could be signaled in the bitstream or known to both encoder and decoder.

I←O(k)

D←D×p

The approach described above could be used with any metric (e.g., L2, L1, Lp) or any approximation of these metrics. For example, in some embodiments distance comparisons may use a Euclidean distance comparison approximation, such as a Taxicab/Manhattan/L1 approximation, or an Octagonal approximation.

In some embodiments, a lifting scheme may be applied without determining a hierarchy of levels. In such embodiments, the technique may proceed as follows:

Sort the input points according to the Morton codes associated with their coordinates Encode/decode point attributes according to the Morton order For each point i, look for the h nearest neighbors ($n_1$, $n_2$, ..., $n_h$) already processed ($n_j$<i)

Compute the prediction weights as described above.

Apply the adaptive scheme described above in order to adjust the prediction strategy.

Predict attributes and entropy encode them as described below.

Binary Arithmetic Coding of Quantized Lifting Coefficients

In some embodiments, lifting scheme coefficients may be non-binary values. In some embodiments, an arithmetic encoder, such as arithmetic encoder 212, that was described above as a component of encoded 202 illustrated in FIG. 2B and which used a binary arithmetic codec to encode the 256-value occupancy symbols may also be used to encode lifting scheme coefficients. Or, in some embodiments a similar arithmetic encoder may be used. For example, the technique may proceed as follows:

Mono-dimensional attribute

Let C be the quantized coefficient to be encoded. First C is mapped to a positive number using a function that maps positive numbers to even numbers and negative numbers to odd numbers.

Let M(C) be the mapped value.

A binary value is then encoded to indicate whether C is 0 or not

If C is not zero, then two cases are distinguished

If M(C) is higher or equal than alphabetSize (e.g. the number of symbols supported by the binary arithmetic encoding technique described above in regard to FIGS. 12C-12F), then the value alphabetSize is encoded by using the method described above. The difference between M(C) and alphabetSize is encoded by using an exponential Golomb coding Otherwise, the value of M(C) is encoded using the method described above in regard to FIGS. 12C-12F for N.

Three-dimensional signal

Let C1, C2, C3 be the quantized coefficients to be encoded. Let K1, and K2 be two indexes for the contexts to be used to encode the quantized coefficients, C1, C2, and C3.

First C1, C2 and C3 are mapped to a positive number as described above in regard to FIGS. 12C-12F. Let M(C1), M(C2) and M(C3) be the mapped values of C1, C2, and C3.

M(C1) is encoded.

M(C2) is encoded while choosing different contexts (i.e., binary arithmetic contexts and the binarization context defined above in regards to FIG. 12C-12F) based on the condition of whether C1 is zero or not.

M(C3) is encoded while choosing different contexts based on the conditions C1 is zero or not and C2 is zero or not. If C1 is zero it is known that the value is at least 16. If the condition C1 is zero use the binary context K1, if the value is not zero, decrement the value by 1 (it is known that the value is at least one or more), then check the value is below the alphabet size, if so encode the value directly. Otherwise, encode maximum possible value for the alphabet size. The difference between the maximum possible value for the alphabet size and the value of M(C3) will then be encoded using exponential Golomb encoding.

Multi-dimensional signal

The same approach described above could be generalized to a d-dimensional signal. Here, the contexts to encode the k-th coefficient depending on the values of the previous coefficients (e.g., last 0, 1, 2, 3, . . . , k−1 coefficients).

The number of previous coefficients to consider could be adaptively chosen depending on any of the criteria described in the previous section for the selection of SR1 and SR2.

Below is a more detailed discussion of how a point cloud transfer algorithm is utilized to minimize distortion between an original point cloud and a reconstructed point cloud.

The attribute transfer problem could be defined as follows:

a. Let $PC1=(P1(i))_{i \in \{1, \ldots, N1\}}$ be a point cloud defined by its geometry (i.e., 3D positions) $(X1(i))_{i \in \{1, \ldots, N1\}}$ and a set of attributes (e.g., RGB color or reflectance) $(A(i))_{i \in \{1, \ldots, N1\}}$.

b. Let $PC2(P2(j))_{j \in \{1, \ldots, N2\}}$ be a re-sampled version of PC1 and let $(X2(j))_{j \in \{1, \ldots, N2\}}$ be its geometry.

c. Then compute the set of attribute of $(A2(j))_{j \in \{1, \ldots, N2\}}$ associated with the point of PC2 such that the texture distortion is minimized.

In order to solve the texture distortion minimization problem using an attribute transfer algorithm:

Let $P_{2 \to 1}(j) \in PC1$ be the nearest neighbor of $P2(j) \in PC2$ in PC1 and $A_{2 \to 1}(j)$ its attribute value.

Let $P_{1 \to 2}(i) \in PC2$ be the nearest neighbor of $P1(i) \in PC1$ in PC2 and $A_{1 \to 2}(i)$ its attribute value.

Let $\wp_{1 \to 2}(j)=(Q(j,h))_{h \in \{1, \ldots, H(j)\}} \subseteq PC2$ be the set of points of PC2 that share the point $P1(i) \in PC1$ as their nearest neighbor and $(\alpha(j,h))_{h \in \{1, \ldots, H(j)\}}$ be their attribute values Let $E_{2 \to 1}$ be the non-symmetric error computed from PC2 to PC1:

$$E_{2 \to 1} = \Sigma_{j=1}^{N2} \|A2(j) - A_{2 \to 1}(j)\|^2$$

Let $E_{1 \to 2}$ be the non-symmetric error computed from PC1 to PC2:

$$E_{1 \to 2} = \Sigma_{i=1}^{N1} \|A1(j) - A_{1 \to 2}(j)\|^2$$

Let E be symmetric error that measures the attribute distortion between PC2 to PC1:

$$E = \max(E_{2 \to 1}, E_{1 \to 2})$$

Then determine the set of attributes $(A2(j))_{j \in \{1, \ldots, N2\}}$ as follows:

a. Initialize E1 ← 0 and E2 ← 0
b. Loop over all the point of PC2
  1) For each point P2(j) compute $P_{2 \to 1}$ (j) ∈ PC1 and $\wp_{1 \to 2}$ (j)
  2) If (E1 > E2 or $\wp_{1 \to 2}$(j) = { })
    $A2(j) = A_{2 \to 1}$ (j)
  3) Else $$A2(j) = \frac{1}{H(j)} \sum_{h=1}^{H(j)} \alpha(j, h)$$

4) EndIf
  5) E1 ← E1 + $\|A2(j) - A_{2 \to 1}(j)\|^2$

6) E2 ← E2 + $\left\| A2(j) - \frac{1}{H(j)} \sum_{h=1}^{H(j)} \alpha(j, h) \right\|^2$ Adaptive Attribute Prediction In some embodiments, an encoder as described above may further adaptively change a prediction strategy and/or a number of points used in a given prediction strategy based on attribute values of neighboring points. Also, a decoder may similarly adaptively change a prediction strategy and/or a number of points used in a given prediction strategy based on reconstructed attribute values of neighboring points.

For example, a point cloud may include points representing a road where the road is black with a white stripe on the road. A default nearest neighbor prediction strategy may be adaptively changed to take into account the variability of attribute values for points representing the white line and the black road. Because these points have a large difference in attribute values, a default nearest neighbor prediction strategy may result in blurring of the white line and/or high residual values that decrease a compression efficiency. However, an updated prediction strategy may account for this variability by selecting a better suited prediction strategy and/or by using less points in a K nearest neighbor prediction. For example, for the black road, not using the white line points in a K nearest neighbor prediction.

In some embodiments, before predicting an attribute value for a point P, an encoder or decoder may compute the variability of attribute values of points in a neighborhood of point P, for example the K-nearest neighboring points. In some embodiments, variability may be computed based on a variance, a maximum difference between any two attribute values (or reconstructed attribute values) of the points neighboring point P. In some embodiments, variability may be computed based on a weighted average of the neighboring points, wherein the weighted average accounts for distances of the neighboring points to point P. In some embodiments, variability for a group of neighboring points may be computed based on a weighted averages for attributes for the neighboring points and taking into account distances to the neighboring points. For example, $$\text{Variability} = E[(X - \text{weighted mean}(X))^2]$$

In the above equation, E is the mean value of the distance X, the weighted mean(X) is a weighted mean of the attributes of the points in the neighborhood of point P that takes into account the distances, X, of the neighboring points from point P. In some embodiments, the variability may be calculated as the maximum difference compared to the mean value of the attributes, E(X), the weighted mean of the attributes, weighted mean(X), or the median value of the attributes, median(X). In some embodiments, the variability may be calculated using the average of the values corresponding to the x percent, e.g. x=10 that have the largest difference as compared to the mean value of the attributes, E(X), the weighted mean of the attributes, weighted mean (X), or the median value of the attributes, median(X).

In some embodiments, if the calculated variability of the attributes of the points in the neighborhood of point P is greater than a threshold value, then a rate-distortion optimization may be applied. For example, a rate-distortion optimization may reduce a number of neighboring points used in a prediction or switch to a different prediction technique. In some embodiments, the threshold may be explicitly written in the bit-stream. Also, in some embodiments, the threshold may be adaptively adjusted per point cloud, or sub-block of the point cloud or for a number of points to be encoded. For example, a threshold may be included in compressed attribute information file 1150 as configuration information 1152, as described below in regard to FIG. 11B.

In some embodiments, different distortion measures may be used in a rate-distortion optimization procedure, such as sum of squares error, weighted sum of squares error, sum of absolute differences, or weighted sum of absolute differences.

In some embodiments, distortion could be computed independently for each attribute, or multiple attributes corresponding to the same sample and could be considered, and appropriately weighted. For example, distortion values for R, G, B or Y, U, V could be computed and then combined together linearly or non-linearly to generate an overall distortion value.

In some embodiments, advanced techniques for rate distortion quantization, such as trellis based quantization could also be considered where, instead of considering a single point in isolation multiple points are coded jointly. The coding process, for example, may select to encode all these multiple points using the method that results in minimizing a cost function of the form J=D+lambda*Rate, where D is the overall distortion for all these points, and Rate is the overall rate cost for coding these points.

In some embodiments, an encoder, such as encoder 202, may explicitly encode an index value of a chosen prediction strategy for a point cloud, for a level of detail of a point cloud, or for a group of points within a level of detail of a point cloud, wherein the decoder has access to an instance of the index and can determine the chosen prediction strategy based on the received index value. The decoder may apply the chosen prediction strategy for the set of points for which the rate-distortion optimization procedure is being applied. In some embodiments, there may be a default prediction strategy and the decoder may apply the default prediction strategy if no rate-distortion optimization procedure is specified in the encoded bit stream.

Point Cloud Attribute Transfer Algorithm

In some embodiments, a point cloud transfer algorithm may be used to minimize distortion between an original point cloud and a reconstructed version of the original point cloud. A transfer algorithm may be used to evaluate distortion due to the original point cloud and the reconstructed point cloud having points that are in slightly different positions. For example, a reconstructed point cloud may have a similar shape as an original point cloud, but may have a.) a different number of total points and/or b.) points that are slightly shifted as compared to a corresponding point in the original point cloud. In some embodiments, a point cloud transfer algorithm may allow the attribute values for a reconstructed point cloud to be selected such that distortion between the original point cloud and a reconstructed version of the original point cloud is minimized. For example, for an original point cloud, both the positions of the points and the attribute values of the points are known. However, for a reconstructed point cloud, the position values may be known (for example based on a sub-sampling process, K-D tree process, or patch image process as described above). However, attribute values for the reconstructed point cloud may still need to be determined. Accordingly a point cloud transfer algorithm can be used to minimize distortion by selecting attribute values for the reconstructed point cloud that minimize distortion.

The distortion from the original point cloud to the reconstructed point cloud can be determined for a selected attribute value. Likewise the distortion from the reconstructed point cloud to the original point cloud can be determined for the selected attribute value for the reconstructed point cloud. In many circumstances, these distortions are not symmetric. The point cloud transfer algorithm is initialized with two errors (E21) and (E12), where E21 is the error from the second or reconstructed point cloud to the original or first point cloud and E12 is the error from the first or original point cloud to the second or reconstructed point cloud. For each point in the second point cloud, it is determined whether the point should be assigned the attribute value of the corresponding point in the original point cloud, or an average attribute value of the nearest neighbors to the corresponding point in the original point cloud. The attribute value is selected based on the smallest error.

Example Applications for Point Cloud Compression and Decompression

Figure 14:
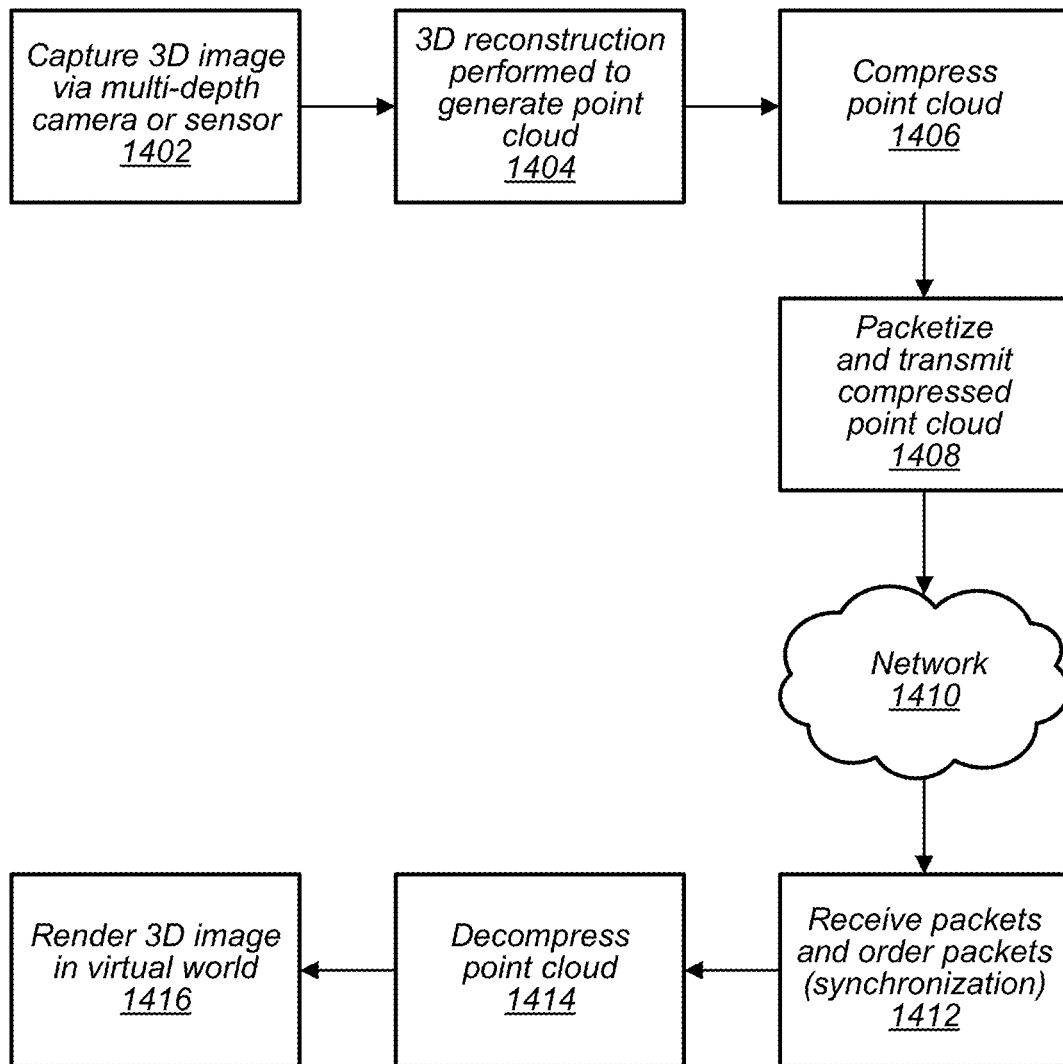
FIG. 14 illustrates compressed point cloud information being used in a 3-D telepresence application, according to some embodiments.

FIG. 14 illustrates compressed point clouds being used in a 3-D telepresence application, according to some embodiments.

In some embodiments, a sensor, such as sensor 102, an encoder, such as encoder 104 or encoder 202, and a decoder, such as decoder 116 or decoder 220, may be used to communicate point clouds in a 3-D telepresence application. For example, a sensor, such as sensor 102, at 1402 may capture a 3D image and at 1404, the sensor or a processor associated with the sensor may perform a 3D reconstruction based on sensed data to generate a point cloud.

At 1406, an encoder such as encoder 104 or 202 may compress the point cloud and at 1408 the encoder or a post processor may packetize and transmit the compressed point cloud, via a network 1410. At 1412, the packets may be received at a destination location that includes a decoder, such as decoder 116 or decoder 220. The decoder may decompress the point cloud at 1414 and the decompressed point cloud may be rendered at 1416. In some embodiments a 3-D telepresence application may transmit point cloud data in real time such that a display at 1416 represents images being observed at 1402. For example, a camera in a canyon may allow a remote user to experience walking through a virtual canyon at 1416.

Figure 15:
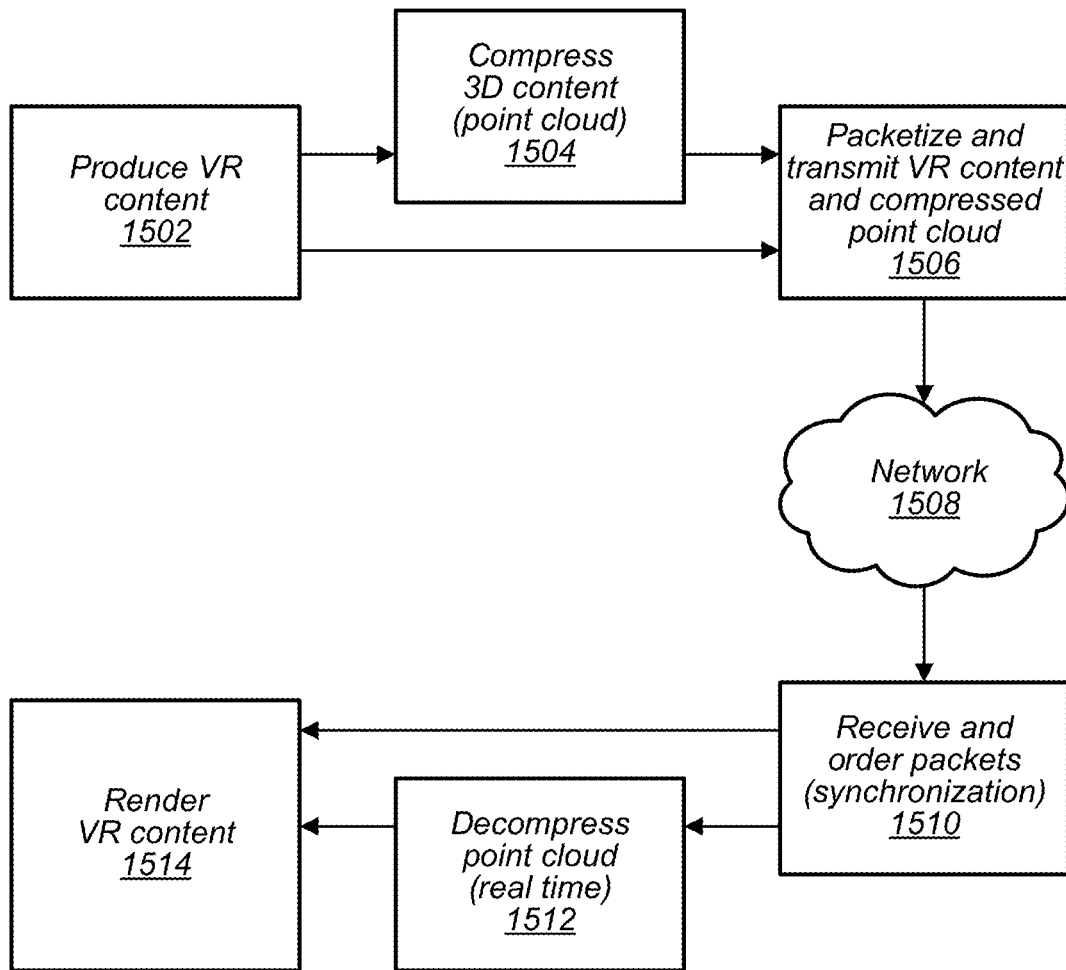
FIG. 15 illustrates compressed point cloud information being used in a virtual reality application, according to some embodiments.

FIG. 15 illustrates compressed point clouds being used in a virtual reality (VR) or augmented reality (AR) application, according to some embodiments.

In some embodiments, point clouds may be generated in software (for example as opposed to being captured by a sensor). For example, at 1502 virtual reality or augmented reality content is produced. The virtual reality or augmented reality content may include point cloud data and non-point cloud data. For example, a non-point cloud character may traverse a landscape represented by point clouds, as one example. At 1504, the point cloud data may be compressed and at 1506 the compressed point cloud data and non-point cloud data may be packetized and transmitted via a network 1508. For example, the virtual reality or augmented reality content produced at 1502 may be produced at a remote server and communicated to a VR or AR content consumer via network 1508. At 1510, the packets may be received and synchronized at the VR or AR consumer's device. A decoder operating at the VR or AR consumer's device may decompress the compressed point cloud at 1512 and the point cloud and non-point cloud data may be rendered in real time, for example in a head mounted display of the VR or AR consumer's device. In some embodiments, point cloud data may be generated, compressed, decompressed, and rendered responsive to the VR or AR consumer manipulating the head mounted display to look in different directions.

In some embodiments, point cloud compression as described herein may be used in various other applications, such as geographic information systems, sports replay broadcasting, museum displays, autonomous navigation, etc.

Example Computer System

Figure 16:
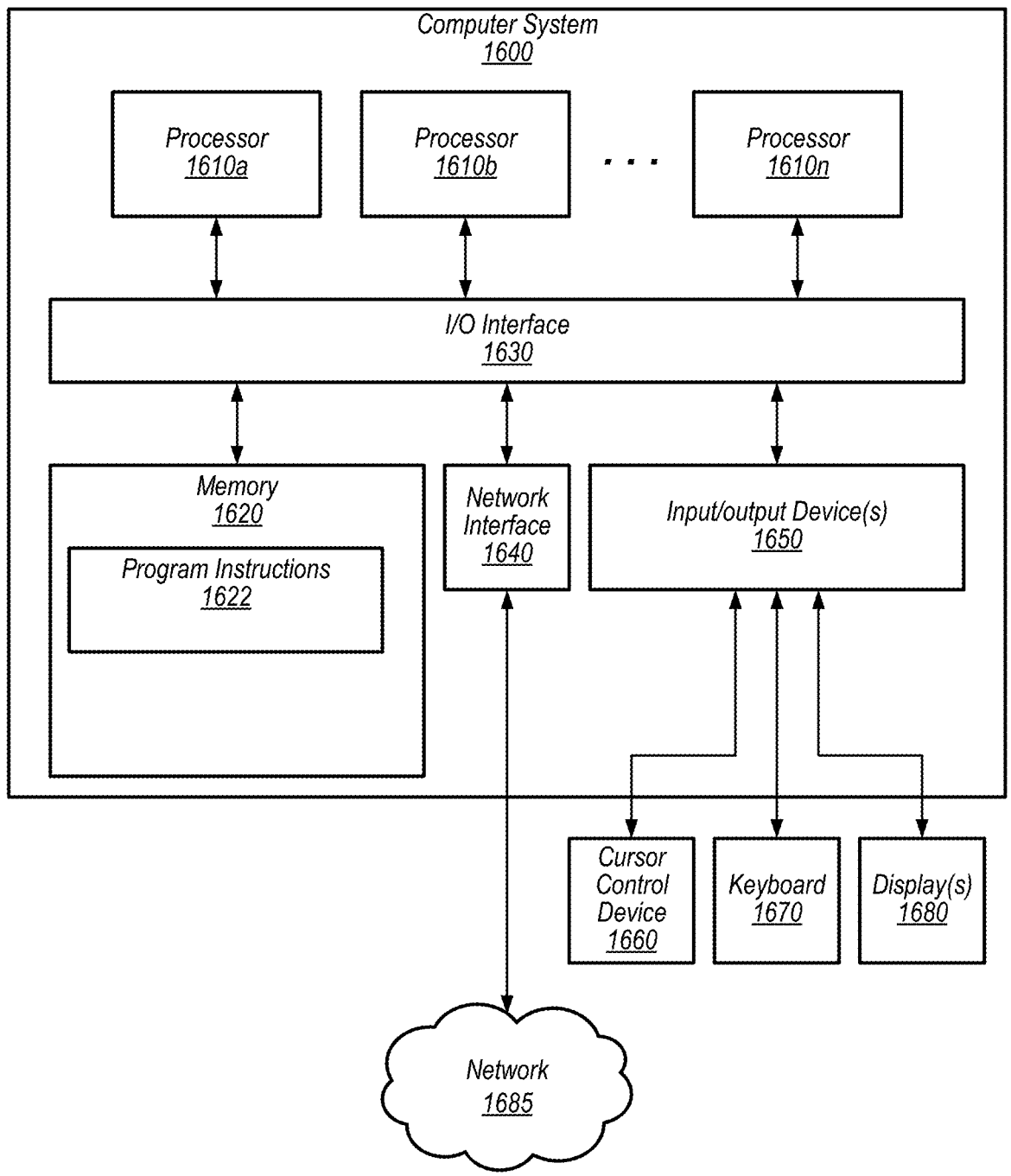
FIG. 16 illustrates an example computer system that may implement an encoder or decoder, according to some embodiments.

FIG. 16 illustrates an example computer system 1600 that may implement an encoder or decoder or any other ones of the components described herein, (e.g., any of the components described above with reference to FIGS. 1-15), in accordance with some embodiments. The computer system 1600 may be configured to execute any or all of the embodiments described above. In different embodiments, computer system 1600 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a point cloud encoder or decoder, as described herein may be executed in one or more computer systems 1600, which may interact with various other devices. Note that any component, action, or functionality described above with respect to FIGS. 1-15 may be implemented on one or more computers configured as computer system 1600 of FIG. 16, according to various embodiments. In the illustrated embodiment, computer system 1600 includes one or more processors 1610 coupled to a system memory 1620 via an input/output (I/O) interface 1630. Computer system 1600 further includes a network interface 1640 coupled to I/O interface 1630, and one or more input/output devices 1650, such as cursor control device 1660, keyboard 1670, and display(s) 1680. In some cases, it is contemplated that embodiments may be implemented using a single instance of computer system 1600, while in other embodiments multiple such systems, or multiple nodes making up computer system 1600, may be configured to host different portions or instances of embodiments. For example, in one embodiment some elements may be implemented via one or more nodes of computer system 1600 that are distinct from those nodes implementing other elements.

In various embodiments, computer system 1600 may be a uniprocessor system including one processor 1610, or a multiprocessor system including several processors 1610 (e.g., two, four, eight, or another suitable number). Processors 1610 may be any suitable processor capable of executing instructions. For example, in various embodiments processors 1610 may be general-purpose or embedded processors implementing any of a variety of instruction set architectures (ISAs), such as the x86, PowerPC, SPARC, or MIPS ISAs, or any other suitable ISA. In multiprocessor systems, each of processors 1610 may commonly, but not necessarily, implement the same ISA.

System memory 1620 may be configured to store point cloud compression or point cloud decompression program instructions 1622 and/or sensor data accessible by processor 1610. In various embodiments, system memory 1620 may be implemented using any suitable memory technology, such as static random access memory (SRAM), synchronous dynamic RAM (SDRAM), nonvolatile/Flash-type memory, or any other type of memory. In the illustrated embodiment, program instructions 1622 may be configured to implement an image sensor control application incorporating any of the functionality described above. In some embodiments, program instructions and/or data may be received, sent or stored upon different types of computer-accessible media or on similar media separate from system memory 1620 or computer system 1600. While computer system 1600 is described as implementing the functionality of functional blocks of previous Figures, any of the functionality described herein may be implemented via such a computer system.

In one embodiment, I/O interface 1630 may be configured to coordinate I/O traffic between processor 1610, system memory 1620, and any peripheral devices in the device, including network interface 1640 or other peripheral interfaces, such as input/output devices 1650. In some embodiments, I/O interface 1630 may perform any necessary protocol, timing or other data transformations to convert data signals from one component (e.g., system memory 1620) into a format suitable for use by another component (e.g., processor 1610). In some embodiments, I/O interface 1630 may include support for devices attached through various types of peripheral buses, such as a variant of the Peripheral Component Interconnect (PCI) bus standard or the Universal Serial Bus (USB) standard, for example. In some embodiments, the function of I/O interface 1630 may be split into two or more separate components, such as a north bridge and a south bridge, for example. Also, in some embodiments some or all of the functionality of I/O interface 1630, such as an interface to system memory 1620, may be incorporated directly into processor 1610.

Network interface 1640 may be configured to allow data to be exchanged between computer system 1600 and other devices attached to a network 1685 (e.g., carrier or agent devices) or between nodes of computer system 1600. Network 1685 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1640 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1650 may, in some embodiments, include one or more display terminals, keyboards, keypads, touchpads, scanning devices, voice or optical recognition devices, or any other devices suitable for entering or accessing data by one or more computer systems 1600. Multiple input/output devices 1650 may be present in computer system 1600 or may be distributed on various nodes of computer system 1600. In some embodiments, similar input/output devices may be separate from computer system 1600 and may interact with one or more nodes of computer system 1600 through a wired or wireless connection, such as over network interface 1640.

As shown in FIG. 16, memory 1620 may include program instructions 1622, which may be processor-executable to implement any element or action described above. In one embodiment, the program instructions may implement the methods described above. In other embodiments, different elements and data may be included. Note that data may include any data or information described above.

Those skilled in the art will appreciate that computer system 1600 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 1600 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 1600 may be transmitted to computer system 1600 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

Various embodiments can be described in view of the following clauses:

1. A system comprising:
   one or more sensors configured to capture a plurality of points that make up a point cloud, wherein respective ones of the points comprises spatial information for the point and attribute information for the point; and
   an encoder configured to compress the attribute information for the points, wherein to compress the attribute information, the encoder is configured to:
   assign an attribute value to at least one point of the point cloud based, at least in part, on the attribute information included in the captured point cloud for the point; and
   for each of respective other ones of the points of the point cloud:
   identify a set of neighboring points;
   determine a predicted attribute value for the respective point based, at least in part, on predicted or assigned attributes values for the neighboring points; and
   determine, based, at least in part, on comparing the predicted attribute value for the respective point to the attribute information for the point included in the captured point cloud, an attribute correction value for the point; and
   encode the compressed attribute information, wherein the compressed attribute information comprises:
   the assigned attribute value for the at least one point; and
   data indicating, for the respective other ones of the points, the determined attribute correction values.

2. The system of clause 1, wherein to determine, for each of the respective other ones of the points, the predicted attribute value, the encoder is further configured to:
   determine, for each of the respective other ones of the points, the predicted attribute value based, at least in part, on respective distances between the point and respective ones of the neighboring points, wherein attribute values of neighboring points closer to the point are weighted more heavily than attribute values of neighboring points that are further away from the point.

3. The system of clause 2, wherein the encoder is further configured to: determine a minimum spanning tree for the points of the point cloud,
wherein to identify the set of neighboring points, the encoder is configured to identify a set of nearest neighboring points according to the minimum spanning tree.

4. The system of clause 3, wherein the encoder is configured to:
evaluate the respective other ones of the points of the point cloud according to an order determined based, at least in part, on the minimum spanning tree; and
encode the determined attribute correction values for the respective other ones of the points according to the order.

5. The system of clause 1, wherein the encoder is configured to encode the data indicating, for the respective other ones of the points, the attribute correction value according to an arithmetic compression algorithm.

6. The system of clause 1, wherein the encoder is configured to encode the data indicating, for the respective other ones of the points, the attribute correction value according to a Golomb compression algorithm.

7. The system of clause 1, wherein the encoder stores a plurality of attribute correction value encoding contexts, wherein different ones of the attribute correction value encoding contexts are selected for encoding an attribute correction value based, at least in part, on a number of symbols included in the attribute correction value.

8. A method of compressing attribute information for a point cloud comprising:
assigning an attribute value to at least one point of the point cloud based, at least in part, on attribute information for the at least one point included in the point cloud, wherein the point cloud comprises spatial information for a plurality of points and attribute information specifying one or more attributes for respective ones of the plurality of points; and
for each of respective other ones of the points of the point cloud:
identifying a set of neighboring points;
determining a predicted attribute value for the point based, at least in part, on predicted or assigned attribute values for the neighboring points; and
determining, based, at least in part, on comparing the predicted attribute value for the point to the attribute information for the point, an attribute correction value for the point; and
encoding compressed attribute information for the point cloud comprising:
the assigned attribute value for the at least one point; and
data indicating, for the respective other ones of the points, the determined attribute correction values.

9. The method of clause 8, wherein a number of neighboring points to identify, for the set of nearest neighboring points, is a configurable parameter, and
wherein said encoding the compressed attribute information for the compressed point cloud further comprises encoding configuration information indicating the number of nearest neighboring points to include in the set of identified nearest neighboring points.

10. The method of clause 9, wherein said determining the predicted attribute value for the point comprises:
determining respective distances between the point and respective ones of the neighboring points of the set of nearest neighboring points,
wherein the attribute value for the point is determined based, at least in part, on an inverse distance interpolation method, wherein attribute values of neighboring points closer to the point are weighted more heavily than attribute values of neighboring points that are further away from the point.

11. The method of clause 10, further comprising:
determining a minimum spanning tree for the points of the point cloud,
wherein said identifying the set of neighboring points comprises identifying a set of nearest neighboring points according to the minimum spanning tree.

12. The method of clause 11, wherein for the respective other ones of the points of the point cloud, the respective points are evaluated according to a processing order determined based, at least in part, on the minimum spanning tree, wherein the minimum spanning tree is traversed according to minimum distances between successive points being evaluated.

13. The method of clause 11, further comprising:
encoding a K-D tree to compress spatial information of the point cloud.

14. The method of clause 13, wherein at least some of the points of the point cloud comprise attribute information specifying more than one attribute, wherein encoding the compressed attribute information further comprises:
encoding data indicating an attribute correction value for a first attribute of the point according to an encoding context selected based, at least in part, on a number of symbols included in the attribute correction value for the first attribute; and
encoding data indicating one or more additional attributes of the point according to the selected encoding context.

15. The method of clause 8, wherein said encoding compressed attribute information comprises:
encoding positive values as either even or odd numbers; and
encoding negative values as either even or odd numbers, wherein positive and negative values are not both encoded as even values or odd values.

16. A non-transitory computer-readable medium storing program instructions that, when executed by one or more processors, cause the one or more processors to implement an encoder configured to:
assign an attribute value to at least one point of the point cloud based, at least in part, on attribute information for the at least one point included in the point cloud, wherein the point cloud comprises spatial information for a plurality of points and attribute information specifying one or more attributes for respective ones of the plurality of points; and
for each of respective other ones of the points of the point cloud:
identify a set of neighboring points;
determine a predicted attribute value for the point based, at least in part, on predicted or assigned attribute values for the neighboring points; and
determine, based, at least in part, on comparing the predicted attribute value for the point to the attribute information for the point, an attribute correction value for the point; and encode compressed attribute information for the point cloud comprising:
  the assigned attribute value for the at least one point; and
  data indicating, for the respective other ones of the points, the determined attribute correction values.

17. The non-transitory computer-readable medium of clause 16, wherein a number of neighboring points to identify, for the set of nearest neighboring points, is a configurable parameter, and
  wherein said encode the compressed attribute information for the compressed point cloud further comprises encode configuration information indicating the number of nearest neighboring points to include in the set of identified nearest neighboring points.

18. The non-transitory computer-readable medium of clause 17, wherein said determine the predicted attribute value for the point comprises:
  determine respective distances between the point and respective ones of the neighboring points of the set of nearest neighboring points,
  wherein the attribute value for the point is determined based, at least in part, on an inverse distance interpolation method, wherein attribute values of neighboring points closer to the point are weighted more heavily than attribute values of neighboring points that are further away from the point.

19. The non-transitory computer-readable medium of clause 18, wherein the encoder is further configured to:
  determine a minimum spanning tree for the points of the point cloud,
  wherein said identify the set of neighboring points comprises identifying a set of nearest neighboring points according to the minimum spanning tree.

20. The non-transitory computer-readable medium of clause 19, wherein for the respective other ones of the points of the point cloud, the respective points are evaluated according to a processing order determined based, at least in part, on the minimum spanning tree, wherein the minimum spanning tree is traversed according to minimum distances between successive points being evaluated.

21. A system comprising:
  one or more sensors configured to capture a plurality of points that make up a point cloud, wherein respective ones of the points comprise spatial information for the point and attribute information for the point; and
  an encoder configured to:
    assign an attribute value to at least one point of the point cloud based on the attribute information included in the captured point cloud for the point; and
    for a sub-set of respective ones of the points of the point cloud not included in a previously determined level of detail:
      determine a predicted attribute value for the respective point based on predicted or assigned attributes values for neighboring points; and
      determine, based on comparing the predicted attribute value for the respective point to the attribute information for the point included in the captured point cloud, an attribute correction value for the point;
    apply an update operation to smooth the determined attribute correction values, wherein the update operation takes into account relative influence of the attributes of the respective points on other levels of detail; and
    encode the assigned attribute value and the updated attribute correction values for first level of detail and the one or more additional levels of detail.

22. A decoder configured to:
  receive compressed attribute information for a point cloud comprising at least one assigned attribute value for at least one point of the point cloud and data indicating attribute correction values for attributes of other points of the point cloud; and
  provide attribute information for a decompressed point cloud having a first level of detail, wherein said providing attribute information comprises performing an update operation to remove attribute value smoothing applied an encoder; and
  update the decompressed point cloud to include attribute information for additional sub-sets of points at one or more other ones of the plurality of levels of detail.

23. A method comprising:
  receiving compressed attribute information for a point cloud comprising at least one assigned attribute value for at least one point of the point cloud and data indicating attribute correction values for attributes of the other points of the point cloud; and
  providing attribute information for a decompressed point cloud having a first level of detail, wherein said providing attribute information comprises performing an update operation to remove attribute value smoothing applied an encoder; and
  updating the decompressed point cloud to include attribute information for additional sub-sets of points at one or more other ones of the plurality of levels of detail.

24. A non-transitory computer readable medium storing program instructions, that when executed by one or more processors, cause the one or more processors to perform:
  receiving compressed attribute information for a point cloud comprising at least one assigned attribute value for at least one point of the point cloud and data indicating attribute correction values for attributes of the other points of the point cloud; and
  providing attribute information for a decompressed point cloud having a first level of detail, wherein said providing attribute information comprises performing an update operation to remove attribute value smoothing applied an encoder; and
  updating the decompressed point cloud to include attribute information for additional sub-sets of points at one or more other ones of the plurality of levels of detail.

25. A method comprising:
  assigning an attribute value to at least one point of a point cloud based on attribute information included in a captured point cloud for the point; and
  for multiple points of a sub-set of respective points of the point cloud not included in a previously determined level of detail:
    determining a predicted attribute value for respective points of the sub-set of points based on predicted or assigned attributes values for neighboring points;
    determining respective attribute correction values for the multiple points, based on comparing the predicted attribute values for the respective points to the attribute information for the points included in the captured point cloud;
    applying an update operation to smooth the determined attribute correction values, wherein the update operation takes into account relative influence of the attributes of the respective points on other levels of detail; and encoding the assigned attribute value and the updated attribute correction values for first level of detail and the one or more additional levels of detail.

26. A non-transitory computer readable medium storing program instructions, that when executed by one or more processors, cause the one or more processors to perform:
   assigning an attribute value to at least one point of a point cloud based on attribute information included in a captured point cloud for the point; and
   for multiple points of a sub-set of respective points of the point cloud not included in a previously determined level of detail:
      determining a predicted attribute value for respective points of the sub-set of points based on predicted or assigned attributes values for neighboring points;
      determining respective attribute correction values for the multiple points, based on comparing the predicted attribute values for the respective points to the attribute information for the points included in the captured point cloud;
      applying an update operation to smooth the determined attribute correction values, wherein the update operation takes into account relative influence of the attributes of the respective points on other levels of detail; and
      encoding the assigned attribute value and the updated attribute correction values for first level of detail and the one or more additional levels of detail.

27. A system comprising:
   one or more sensors configured to capture a plurality of points that make up a point cloud, wherein respective ones of the points comprise spatial information for the point and attribute information for the point; and
   an encoder configured to:
      determine predicted attribute values for respective ones of the points based on predicted or assigned attributes values for neighboring points, wherein the determined predicted attribute values are determined prior to or while level of detail assignments are being determined for the respective points and the neighboring points; and
      determine, based on comparing the predicted attribute values for the respective points to the attribute information for the respective points included in the captured point cloud, respective attribute correction values for the respective points.

28. A system comprising:
   one or more sensors configured to capture a plurality of points that make up a point cloud, wherein respective ones of the points comprise spatial information for the point and attribute information for the point; and
   an encoder configured to:
      for a sub-set of respective ones of the points of the point cloud:
         identify a set of neighboring points greater than a first distance from the point;
         determine whether a variability of the neighboring points exceeds a variability threshold;
         determine respective predicted attribute values for one or more points of the sub-set of respective points according to a first prediction procedure if the variability of the neighboring points is less than the threshold and determine the respective predicted attribute values for the one or more point according to another prediction procedure if the variability of the neighboring points exceeds the threshold; and
         determine, based on comparing the respective predicted attribute values for the respective ones of the one or more points to the attribute information for corresponding respective points included in the captured point cloud, respective attribute correction values for the one or more points; and
      encode the assigned attribute value and the determined attribute correction values.

29. A decoder configured to:
   receive compressed attribute information for a point cloud comprising data indicating attribute correction values for attributes of points of the point cloud and indication of a selected prediction strategy to be applied to decompress the compressed attribute information, wherein the selected prediction strategy is one of a plurality of prediction strategies supported by the decoder;
   predict attribute values for points of the point cloud based on the selected prediction strategy;
   apply one or more attribute correction values to the predicted attribute values to determine attribute information for a decompressed point cloud.

30. A method comprising:
   receiving compressed attribute information for a point cloud comprising data indicating attribute correction values for attributes of points of the point cloud and an indication of a selected prediction strategy to be applied to decompress the compressed attribute information, wherein the selected prediction strategy is one of a plurality of prediction strategies supported by a decoder;
   predicting attribute values for points of the point cloud based on the selected prediction strategy;
   applying one or more attribute correction values to the predicted attribute values to determine attribute information for a decompressed point cloud.

31. A method comprising:
   identifying a set of neighboring points greater than a first distance from a point of a point cloud;
   determining whether a variability of the neighboring points exceeds a variability threshold;
   determining respective predicted attribute values for one or more points of the sub-set of respective points according to a first prediction procedure if the variability of the neighboring points is less than the threshold and determine the respective predicted attribute values for the one or more point according to another prediction procedure if the variability of the neighboring points exceeds the threshold;
   determining, based on comparing the respective predicted attribute values for the respective ones of the one or more points to the attribute information for corresponding respective points included in the captured point cloud, respective attribute correction values for the one or more points; and
   encoding the assigned attribute value and the determined attribute correction values.

32 A non-transitory computer-readable medium storing program instructions, that when executed by one or more processors, causes the one or more processors to perform:
   identifying a set of neighboring points greater than a first distance from a point of a point cloud;
   determining whether a variability of the neighboring points exceeds a variability threshold;
   determining respective predicted attribute values for one or more points of the sub-set of respective points according to a first prediction procedure if the variability of the neighboring points is less than the threshold and determine the respective predicted attribute values for the one or more point according to another prediction procedure if the variability of the neighboring points exceeds the threshold;

determining, based on comparing the respective predicted attribute values for the respective ones of the one or more points to the attribute information for corresponding respective points included in the captured point cloud, respective attribute correction values for the one or more points; and encoding the assigned attribute value and the determined attribute correction values.

33. A non-transitory computer-readable medium storing program instructions, that when executed by one or more processors, causes the one or more processors to perform:

receiving compressed attribute information for a point cloud comprising data indicating attribute correction values for attributes of points of the point cloud and an indication of a selected prediction strategy to be applied to decompress the compressed attribute information, wherein the selected prediction strategy is one of a plurality of prediction strategies supported by a decoder;

predicting attribute values for points of the point cloud based on the selected prediction strategy;

applying one or more attribute correction values to the predicted attribute values to determine attribute information for a decompressed point cloud.

34. A system comprising:
a decoder configured to:
receive compressed attribute information for a point cloud comprising at least one assigned attribute value for at least one point of the point cloud and data indicating, for other points of the point cloud, respective attribute correction values for respective attributes of the other points; and for each of respective other ones of the points of the point cloud other than the at least one point:
identify a set of neighboring points to a point being evaluated;
determine a predicted attribute value for the point being evaluated based, at least in part, on predicted or assigned attribute values for the neighboring points; and
adjust the predicted attribute value for the point being evaluated based, at least in part, on an attribute correction value for the point included in the compressed attribute information; and
provide attribute information for a decompressed point cloud comprising the at least one assigned attribute value for the at least one point and the adjusted predicted attribute values for the other ones of the points.

35. The system of clause 34, wherein the decoder is further configured to:
determine a minimum spanning tree for the point cloud based, at least in part, on spatial information for the points of the point cloud; and
determine a processing order for evaluating the respective other ones of the points based, at least in part, on the minimum spanning tree, wherein the processing order is determined based, at least in part, on minimum distances between successive points being evaluated.

36. The system of clause 35, wherein to identify the set of neighboring points, the decoder is configured to identify a set of nearest neighboring points according to the minimum spanning tree.

37. The system of clause 36, wherein the decoder is configured to determine the attribute predictions based, at least in part, on inverse distance relationships between the point being evaluated and the neighboring points.

38. The system of clause 37, wherein for points comprising more than one attribute, the decoder is configured to apply the same context used for decompressing a compressed attribute correction value for a first predicted attribute value of a given point when decompressing compressed attribute correction values for one or more other attributes of the given point.

39. A method of decompressing attribute information for a point cloud comprising:
receiving compressed attribute information for a point cloud comprising at least one assigned attribute value for at least one point of the point cloud and data indicating, for other points of the point cloud, respective attribute correction values for respective attributes of the other points; and for each of respective other ones of the points of the point cloud other than the at least one point:
identifying a set of neighboring points to a point being evaluated;
determining a predicted attribute value for the point being evaluated based, at least in part, on predicted or assigned attribute values for the neighboring points; and
adjusting the predicted attribute value for the point being evaluated based, at least in part, on an attribute correction value for the point included in the compressed attribute information; and
providing attribute information for a decompressed point cloud comprising the at least one assigned attribute value for the at least one point and the adjusted predicted attribute values for the other ones of the points.

40. The method of clause 39, further comprising:
determining a minimum spanning tree for the point cloud based, at least in part, on spatial information for the points of the point cloud; and
determining a processing order for evaluating the respective other ones of the points based, at least in part, on the minimum spanning tree, wherein the processing order is determined based, at least in part, on minimum distances between successive points being evaluated.

41. The method of clause 40, further comprising:
identifying a set of nearest neighboring points according to the minimum spanning tree.

42. The method of clause 41, wherein the attribute predictions are determined based, at least in part, on inverse distance relationships between the point being evaluated and the neighboring points.

43. The method of clause 42, wherein for points comprising more than one attribute, the same context used for decompressing a compressed attribute correction value for a first predicted attribute value of a given point is used when decompressing compressed attribute correction values for one or more other attributes of the given point.

44. A non-transitory computer-readable medium storing program instructions that, when executed by one or more processors, cause the one or more processors to implement a decoder configured to:
receive compressed attribute information for a point cloud comprising at least one assigned attribute value for at least one point of the point cloud and data indicating, for other points of the point cloud, respective attribute correction values for respective attributes of the other points; and for each of respective other ones of the points of the point cloud other than the at least one point:
identify a set of neighboring points to a point being evaluated;
determine a predicted attribute value for the point being evaluated based, at least in part, on predicted or assigned attribute values for the neighboring points; and
adjust the predicted attribute value for the point being evaluated based, at least in part, on an attribute correction value for the point included in the compressed attribute information; and provide attribute information for a decompressed point cloud comprising the at least one assigned attribute value for the at least one point and the adjusted predicted attribute values for the other ones of the points.

45. The non-transitory computer-readable medium of clause 44, wherein the decoder is further configured to:
determine a minimum spanning tree for the point cloud based, at least in part, on spatial information for the points of the point cloud; and
determine a processing order for evaluating the respective other ones of the points based, at least in part, on the minimum spanning tree, wherein the processing order is determined based, at least in part, on minimum distances between successive points being evaluated.

46. The non-transitory computer-readable medium of clause 45, wherein to identify the set of neighboring points, the decoder is configured to identify a set of nearest neighboring points according to the minimum spanning tree.

47. The non-transitory computer-readable medium of clause 46, wherein the attribute predictions are determined based, at least in part, on inverse distance relationships between the point being evaluated and the neighboring points.

48. The non-transitory computer-readable medium of clause 47, wherein for points comprising more than one attribute, the decoder is configured to apply the same context used for decompressing a compressed attribute correction value for a first predicted attribute value of a given point when decompressing compressed attribute correction values for one or more other attributes of the given point.

What is claimed is:

1. A system comprising:
one or more sensors configured to capture a plurality of points that make up a point cloud, wherein respective ones of the points comprise spatial information for the point and attribute information for the point; and
an encoder configured to:
determine a first level of detail for the attribute information of the point cloud; and
determine one or more additional levels of detail for the attribute information of the point cloud,
wherein to determine the first level of detail or the one or more additional levels of detail, the encoder is configured to:
assign an attribute value to at least one point of the point cloud based on the attribute information included in the captured point cloud for the point; and
for a sub-set of respective ones of the points of the point cloud not included in a previously determined level of detail:
identify a set of neighboring points greater than a first distance from the point;
determine a predicted attribute value for the respective point based on predicted or assigned attributes values for the neighboring points; and
determine, based on comparing the predicted attribute value for the respective point to the attribute information for the point included in the captured point cloud, an attribute correction value for the point; and
encode the assigned attribute value and the determined attribute correction values for first level of detail and the one or more additional levels of detail.

2. The system of claim 1, wherein the encoder is configured to:
sequentially provide the first level of detail and the one or more additional levels of detail to a recipient device.

3. The system of claim 2, wherein the encoder further encodes the spatial information for the point cloud as a K-D tree.

4. The system of claim 2, wherein the encoder is configured to include spatial information for respective sub-sets of points in the respective levels of detail corresponding to the respective sub-sets of points.

5. The system of claim 1, wherein the encoder is further figured to encode:
information indicating a number of levels of detail encoded for the point cloud.

6. The system of claim 1, wherein the encoder is further configured to encode:
an initial sampling distance for identifying points included in the first level of detail; and
a sampling distance update factor for determining additional sampling distances for the one or more additional levels of detail, wherein the additional sampling distances are for identifying points included in the one or more additional levels of detail,
wherein the initial sampling distance and the sampling distance update factor are provided to a decoder in addition to the encoded assigned attribute value and the encoded determined attribute correction values for first level of detail and the one or more additional levels of detail.

7. The system of claim 1, wherein, to determine the predicted attribute value for the respective point based on predicted or assigned attributes values for the neighboring points, the encoder is configured to:
determine respective distances between the respective point and respective ones of the neighboring points of a set of neighboring points,
wherein the attribute value for the respective point is determined based on an inverse distance interpolation method, wherein attribute values of neighboring points closer to the respective point are weighted more heavily than attribute values of neighboring points that are further away from the respective point.

8. A decoder configured to:
receive compressed attribute information for a point cloud comprising at least one assigned attribute value for at least one point of the point cloud and data indicating attribute correction values for attributes of other points of the point cloud, wherein the attribute correction values are ordered in a plurality of levels of detail for a plurality of sub-sets of the other points of the point cloud; and
provide attribute information for a decompressed point cloud having a first level of detail; and update the decompressed point cloud to include attribute information for additional sub-sets of points at one or more other ones of the plurality of levels of detail.

9. The decoder of claim 8, wherein to update the decompressed point cloud, the decoder is configured to assign attribute information to the additional sub-sets of points, wherein the assigned attribute information is in addition to attribute information previously assigned for sub-sets of points included in other ones of the levels of detail.

10. The decoder of claim 8, wherein to determine attribute information for a sub-set of the points included in the first level of detail or the additional sub-sets of points included in the one or more other ones of the levels of detail, the decoder is configured to:
    for each of the points of a given sub-set of points corresponding to a given level of detail:
        identify a set of neighboring points to a point being evaluated;
        determine a predicted attribute value for the point being evaluated based on predicted or assigned attribute values for the neighboring points; and
        adjust the predicted attribute value for the point being evaluated based on an attribute correction value for the point included in the compressed attribute information.

11. The decoder of claim 8, wherein the predicted attribute values are determined based on inverse distance relationships between the point being evaluated and the neighboring points.

12. The decoder of claim 8, wherein the decoder is configured to determine a number of levels of detail to decode based, at least in part, on a data budget allocated for the decompressed point cloud.

13. The decoder of claim 8, wherein the decoder is configured to determine a number of levels of detail to decode based, at least in part, on a viewing mode used to view the decompressed point cloud.

14. A method comprising:
    receiving compressed attribute information for a point cloud comprising at least one assigned attribute value for at least one point of the point cloud and data indicating attribute correction values for attributes of the other points of the point cloud, wherein the attribute correction values are ordered in a plurality of levels of detail for a plurality of sub-sets of the other points of the point cloud; and
    providing attribute information for a decompressed point cloud having a first level of detail; and
    updating the decompressed point cloud to include attribute information for additional sub-sets of points at one or more other ones of the plurality of levels of detail.

15. The method of claim 14, wherein providing the attribute information for the first level of detail and updating the decompressed point cloud to include attribute information for additional sub-sets of points at one or more other ones of the plurality of levels of detail respectively comprises:
    for each of the points of a given sub-set of points corresponding to a given level of detail:
        identifying a set of neighboring points to a point being evaluated;
        determining a predicted attribute value for the point being evaluated based on predicted or assigned attribute values for the neighboring points; and
        adjusting the predicted attribute value for the point being evaluated based on an attribute correction value for the point included in the compressed attribute information.

16. The method of claim 15, further comprising:
    receiving spatial information for points of the first level of detail; and
    separately receiving spatial information for points of a second level of detail.

17. The method of claim 15, further comprising:
    receiving encoded spatial information for points of more than one level of detail of the point cloud; and
    decoding the encoded spatial information prior to said providing attribute information for the first level of detail.

18. The method of claim 15, wherein said updating the decompressed point cloud comprises:
    assigning attribute information to the additional sub-sets of points, wherein the assigned attribute information is in addition to attribute information previously assigned for sub-sets of points included in other ones of the levels of detail.

19. The method of claim 15, further comprising:
    determining a number of levels of detail to decode based, at least in part, on a data budget allocated for the decompressed point cloud.

20. The method of claim 15, further comprising:
    determining a number of levels of detail to decode based, at least in part, on a viewing mode used to view the decompressed point cloud.

\* \* \* \* \*